United States Patent

Asai et al.

Patent Number: 5,988,060
Date of Patent: Nov. 23, 1999

[54] SCREEN PRINTING APPARATUS

[75] Inventors: Koichi Asai, Nagoya; Takeyoshi Isogai, Hekinan; Manabu Mizuno, Chiryu; Jun Adachi, Nagoya, all of Japan

[73] Assignee: Fuji Machine Mfg. Co., Ltd., Chiryu, Japan

[21] Appl. No.: 09/138,703

[22] Filed: Aug. 24, 1998

Related U.S. Application Data

[62] Division of application No. 08/921,052, Aug. 29, 1997, Pat. No. 5,865,117, which is a division of application No. 08/650,453, May 20, 1996, Pat. No. 5,701,821.

[30] Foreign Application Priority Data

Aug. 5, 1994 [JP] Japan .................................. 6-184544

[51] Int. Cl.$^6$ .................................................. B05C 17/04
[52] U.S. Cl. .................................. 101/123; 101/DIG. 34
[58] Field of Search .................................. 101/424, 425, 101/423, 123, 120, DIG. 34

[56] References Cited

U.S. PATENT DOCUMENTS

| | | | |
|---|---|---|---|
| 4,111,546 | 9/1978 | Maret | 355/15 |
| 4,389,936 | 6/1983 | Jaffa et al. | 101/123 |
| 4,453,462 | 6/1984 | Mitter | 101/120 |
| 4,620,256 | 10/1986 | Rubey | 360/137 |
| 5,150,650 | 9/1992 | Murakami | 101/423 |
| 5,201,452 | 4/1993 | Takahashi et al. | 101/114 |
| 5,287,806 | 2/1994 | Nanzai | 101/123 |
| 5,390,597 | 2/1995 | Hashimato et al. | 101/425 |
| 5,452,655 | 9/1995 | Tani | 101/114 |
| 5,483,879 | 1/1996 | Tani et al. | 101/425 |
| 5,485,781 | 1/1996 | Rovaris | 101/425 |
| 5,802,970 | 9/1998 | Tani | 101/123 |
| 5,806,423 | 9/1998 | Tani | 101/123 |

FOREIGN PATENT DOCUMENTS

| | | |
|---|---|---|
| 0302407 | 12/1988 | Japan . |
| 5-220460 | 8/1993 | Japan . |
| 5-246005 | 9/1993 | Japan . |
| 5-261900 | 10/1993 | Japan . |

*Primary Examiner*—Edgar Burr
*Assistant Examiner*—Anthony H. Nguyen
*Attorney, Agent, or Firm*—Oliff & Berridge, PLC

[57] ABSTRACT

An apparatus for printing a printing material on a substrate, such as a printed circuit board includes: a squeegee which extends in a first direction parallel to a plane screen and which slides on the screen to squeeze the printing material into through-holes of the screen; and an outlet-defining member which is opposed to the squeegee and which cooperates with the squeegee to define an elongate printing-material outlet. A printing-material container has a printing-material chamber which extends parallel to the printing-material outlet, has a length substantially equal to a length of the outlet and communicates with the outlet over a substantially entire length thereof. A printing-material thrust member is provided in the printing-material chamber such that the printing-material thrust member is substantially fluid-tightly movable relative to the printing-material container. A container moving device moves the printing-material container relative to the screen in a second direction parallel to the screen and perpendicular to the first direction.

24 Claims, 25 Drawing Sheets

SCREEN PRINTING APPARATUS

This is a Division of application Ser. No. 08/921,052 filed Aug. 29, 1997, now U.S. Pat. No. 5,865,117, which in turn is a division of application Ser. No. 08/650,453 filed May 20, 1996 (now U.S. Pat. No. 5,701,821). The entire disclosure of the prior applications are hereby incorporated by reference herein in their entirety.

BACKGROUND OF THE INVENTION

1. Field of the Invention

The present invention relates to an apparatus and a method for cleaning a screen of a screen printing machine.

2. Related Art Statement

Screen printing is carried out in such a manner that a substrate such as a printed circuit board ("PCB") is held in contact with one of opposite surfaces of a screen and a printing material ("PM") such as creamed solder is squeezed, from the other surface of the screen, into a number of through-holes formed through the thickness of the screen. Accordingly, as the number of printings increases, the contact surface of the screen with which the substrate is contacted, the squeeze surface from which the PM is squeezed, and the inner surfaces of the through-holes are stained little by little with the PM adhered thereto. If this screen is used as it is for effecting additional printings, there may arise some problems, e.g., that only an insufficient amount of PM is squeezed into the through-holes and accordingly an insufficient amount of PM is provided or printed on the substrate, or that the substrate is strained with the PM adhered to the screen. Therefore, the screen is cleaned, e.g., after the screen is used for printing the PM on a predetermined number of substrates, if it is speculated from a detected amount of the PM printed on a substrate that the amount of PM printed on the substrate is insufficient because the screen is strained with the PM adhered to, e.g., the through-holes, or when a screen printing operation is ended.

One of known screen cleaning devices cleans a screen by applying ultrasonic vibration thereto. This screen cleaning device includes an ultrasonic vibrator and a washing-agent ("WA") supplying device which supplies a WA to a space between the screen and the vibrator. The vibrator is contacted with the screen, the WA is supplied to a small space left between the screen and the vibrator, and the screen is vibrated by the vibrator. Consequently the PM adhered to the contact and squeeze surfaces and throughholes of the screen is removed and is diffused into the WA. Thus, the screen is washed.

However, the above-indicated prior screen cleaning device suffers from the problem that since the ultrasonic vibrator is directly contacted with the screen, the screen may be damaged. In addition, since the PM is adhered to the vibrator, the capability of washing of the vibrator decreases as the number of washings increases. Although the washing capability may be restored by cleaning the vibrator, it is very cumbersome to clean the vibrator.

SUMMARY OF THE INVENTION

It is a first object of the present invention to provide an apparatus which cleans a screen without damaging the same.

It is a second object of the present invention to provide a method of cleaning a screen without damaging the same.

It is a third object of the present invention to provide an apparatus which cleans a screen without damaging the same and enjoys a simple construction.

The above first object has been achieved according to a first aspect of the invention, which provides an apparatus for cleaning a screen of a screen printing machine, comprising an ultrasonic vibrator which vibrates at an ultrasonic frequency; a cleaning-sheet supporting device which supports at least a portion of a porous cleaning sheet between the screen and the ultrasonic vibrator, such that the portion of the cleaning sheet is contactable with the screen and the ultrasonic vibrator; and a washing-agent supplying device which supplies a washing agent to the cleaning sheet.

In the screen cleaning apparatus in accordance with the first aspect of the invention, when the screen is cleaned by using the ultrasonic vibrator, the vibrator is contacted with the screen via the cleaning sheet ("CS"), and the washing agent ("WA") is supplied to the CS. The CS and the screen are vibrated by the vibrator, and the stains, i.e., printing material ("PM") adhered to the screen are removed from the same, diffused into the WA, and absorbed by the CS. The WA carried by the CS is given kinetic energy by the vibration of the vibrator, so that a portion of the WA is moved into through-holes of the screen and to the opposite surface of the screen which is opposite to the one surface thereof with which the CS is contacted. Accordingly, the PM adhered to the inner surfaces of the through-holes and the opposite surface of the screen are also separated and diffused into the WA. The cleaning portion of the CS which is contacted with the screen may have dimensions substantially equal to those of the screen. In this case, the CS is capable of simultaneously cleaning the entire screen. Otherwise, the cleaning portion of the CS may have a first dimension substantially equal to a first dimension of the screen in a printing direction or a direction perpendicular to the printing direction, and a second dimension smaller than a second dimension of the screen. In the latter case, the CS is moved relative to the screen for cleaning the screen. The CS may be provided in the form of a cut sheet. In this case, the entire CS provides the cleaning portion. Otherwise, the CS may be provided in the form of a web having a constant width. In the latter case, a portion of the web provides the cleaning portion. The present screen cleaning apparatus may be employed in a screen printing machine, or provided independent of the latter. In the present screen cleaning apparatus, when the screen is cleaned by using the ultrasonic vibrator, the vibrator is contacted with the screen via the CS. Thus, the screen is cleaned while the damaging of the screen and the staining of the vibrator are effectively prevented. Since the CS carries the WA and absorbs and captures the stains diffused into the WA by the ultrasonic vibration of the vibrator, the supplying of the WA and the removing of the stains are concurrently effected. Thus, the amount of consumption of the WA is reduced as compared with the case where those are effected separately. In the case where the present screen cleaning apparatus is employed in a screen printing machine, the present apparatus is capable of cleaning a screen under the condition that the screen is attached to a screen support member of the printing machine. That is, it is unnecessary to detach and re-attach the screen from and to the support member, for cleaning the screen. Thus, in the case where the screen is cleaned during a screen printing operation, the time of interruption of the printing operation because of the cleaning operation is accordingly reduced. In addition, a screen printing operation including a screen cleaning operation is more easily automated or computerized. Generally speaking, in the case where a screen cleaning device is provided independently of a screen printing machine, it is necessary to detach a screen from a screen support member of the machine, for cleaning the screen, and re-attach the cleaned screen to the support member at accurate positions relative thereto. Therefore, a printing operation is interrupted by a cleaning operation for a long time, and the printing operation including the cleaning operation is difficult to automate. In contrast, since the screen as is attached to the support member can be cleaned by the present screen cleaning apparatus, it is not necessary to detach and re-attach the screen from and to the support member or position the former relative to the latter with accuracy, and additionally it is easy to automate a screen cleaning operation. In addition, since the ultrasonic vibrator is not stained or soiled with the printing material in contrast to the case where the vibrator is directly contacted with the screen, a screen printing operation need not be interrupted for cleaning the vibrator, i.e., can continuously be carried out in a longer time.

According to a preferred feature of the first aspect of the invention, the cleaning sheet comprises a cleaning web having a constant width, and the apparatus further comprises a cleaning-sheet feeding device including a supplying rotatable member which is rotatable about a first axis line and which supports a roll of the cleaning web, a taking-up rotatable member which is rotatable about a second axis line distant from the first axis line and which takes up the cleaning web, and an actuator which rotates the taking-up rotatable member to take up the cleaning web. A cleaning portion of the web which is contacted with the screen for cleaning the same may have substantially the same dimensions as those of the screen, or smaller dimensions. In either case, if the cleaning portion is stained with the PM removed from the screen, the stained portion is fed by the feeding device, so that the stained portion is changed with a new, clean portion of the web. A roll of the web before use is supported by the supplying rotatable member, and the used or stained portions of the web are taken up into a roll by the taking-up rotatable member. The new or used roll of the web is easily attached or detached to and from the cleaning apparatus. In addition, since the strained or soiled portions of the web are wound around the taking-up rotatable member, the printing material is not transferred from the web to the individual elements of the screen cleaning apparatus or the screen printing machine. Accordingly, those elements need not be cleaned.

According to another feature of the first aspect of the invention, the washing-agent supplying device is provided on an upstream side of the ultrasonic vibrator in a direction in which the cleaning web is fed by the cleaning-sheet feeding device. In this case, the WA supplying device may supply the WA while the cleaning web is fed. Thus, the cleaning operation may quickly be effected.

According to another feature of the first aspect of the invention, the washing-agent supplying device is provided on a downstream side of the ultrasonic vibrator in a direction in which the cleaning web is fed by the cleaning-sheet feeding device. In the case where a WA supplying device is provided on the downstream side of the vibrator but not on the upstream side thereof, a downstream-side portion of the cleaning portion of the CS is wetted with the WA and an upstream-side portion of the cleaning portion is kept dry. If the CS is moved relative to the screen in the same direction as the CS feeding direction, the WA-carrying portion of the CS washes the screen and, immediately after each portion of the screen is washed, the dry portion of the CS wipes each washed portion of the screen. Thus, one surface of the screen is washed and wiped at once. In the case where a WA supplying device is provided on each of the upstream and downstream sides of the vibrator, the two WA supplying devices may supply the WA to the CS while the CS cleans the screen. Thus, the entire CS may easily keep a sufficient amount of WA in each cleaning operation.

According to another feature of the first aspect of the invention, the cleaning-sheet feeding device comprises an adjusting device which adjusts a pitch of feeding of the cleaning sheet. The pitch of feeding of the CS may be adjusted according to the diameter of the CS taken up by the taking-up rotatable member of the CS feeding device. In the case where the cleaning portion of the CS which is located between the screen and the ultrasonic vibrator is changed with a new cleaning portion of the same CS, by a plurality of rotations of the taking-up member, the length of the CS taken up by each rotation of the taking-up member increases as the diameter of the CS taken up around the taking-up member increases. Therefore, the diameter exceeds a reference value, the number of rotations of the taking-up member is reduced, or the angular amount of each rotation is reduced without reducing the number of rotations, so that a necessary and sufficient length of the CS is fed for providing a new cleaning portion between the screen and the ultrasonic vibrator. In the case where the current cleaning portion of the CS is changed with a new cleaning portion by a single rotation of the taking-up member, the angular amount of the single rotation is reduced as the diameter of the CS wound around the taking-up member increases, so that a substantially constant length of the CS is fed for each screen cleaning operation.

According to another feature of the first aspect of the invention, the screen cleaning apparatus further comprises a wiping-sheet supporting device which supports at least a portion of a porous wiping sheet, such that the portion of the wiping sheet is contactable with the screen, the wiping-sheet supporting device being provided on one of two sides of the screen which is opposite to the other side thereof on which the ultrasonic vibrator is provided. In this case, one of opposite surfaces of the screen is cleaned with the CS and the other surface is wiped with the wiping sheet ("WS"). The CS or the WS may be adapted to clean either one of the two surfaces of the screen with one of which a substrate is contacted for printing and from the other of which the PM is squeezed into the through-holes. The CS and the WS may be adapted to clean the same portion of the screen on both sides thereof, either concurrently or at different times. In either case, on one side of the screen, the stains (e.g., the PM) removed from the screen because of the ultrasonic vibration and diffused into the WA are absorbed and captured by the CS and, on the other side, the stains diffused in the WA are wiped off by the WS. Thus, both of the two surfaces of the screen are cleaned. A wiping portion of the WS which is contacted with the screen may have dimensions substantially equal to those of the screen. In this case, the WS is capable of simultaneously wiping the entire screen. Otherwise, the wiping portion of the WS may have a first dimension substantially equal to a first dimension of the screen in a printing direction or a direction perpendicular to the printing direction, and a second dimension smaller than a second dimension of the screen. In the latter case, the WS is moved relative to the screen for wiping the screen. The WS may be provided by a cut sheet. In this case, the entire WS provides the wiping portion. Otherwise, the WS may be provided by a web having a constant width. In the latter case, a portion of the web provides the wiping portion. In the case where the present screen cleaning apparatus is used for such a screen printing machine which includes a PM container for accommodating a PM and a thrusting member for thrusting the PM from the container onto the screen, substantially no PM is left on the screen after the container is moved away from the screen. Thus, the screen can be cleaned with the CS and the WS on both sides thereof, respectively. Also in the case where the present apparatus is used for such a screen printing machine in which a PM is placed directly on a screen and a squeegee is moved to squeeze the PM into through-holes of the screen and thereby print the PM on a substrate, the CS and the WS can be used to clean the opposite surfaces of the screen, respectively, after the PM is moved to a position away from a printing area in which the through-holes are present.

According to another feature of the first aspect of the invention, the screen cleaning apparatus further comprises a pressing member which elastically presses the wiping sheet against the screen.

According to another feature of the first aspect of the invention, the pressing member is provided at a position where the pressing member is opposed to the ultrasonic vibrator via the wiping sheet, the screen, and the cleaning sheet. In this case, the WS is pressed against the screen by the pressing member, and the CS is pressed against the vibrator by the pressing member via the screen and the WS. Thus, the CS and the screen are vibrated with reliability. The pressing member may be controlled by a screen-cleaning control device, described later, for automatically pressing and releasing the WS against and from the screen. In the latter case, screen-cleaning control patterns, described later, may be provided by employing the pressing member as one of cleaning elements and, if one of the control patterns in each of which the pressing member is used is selected, a screen cleaning operation including the pressing of the WS against the screen by the pressing member is carried out.

According to another feature of the first aspect of the invention, the screen cleaning apparatus further comprises a moving device which moves at least one of the screen and a unit including the wiping sheet, toward and away from each other, such that one of opposite surfaces of the screen and the portion of the wiping sheet is brought into contact with each other and subsequently is separated from each other.

According to another feature of the first aspect of the invention, the screen cleaning apparatus further comprises a moving device which moves at least one of the screen and a unit including the wiping sheet, relative to each other, in a direction parallel to one of opposite surfaces of the screen. In this case, since the WS is moved on the screen, the screen is effectively wiped. In addition, in the case where the wiping portion of the WS which is contacted with the screen for wiping the same has an area smaller than that of the screen, only the small portion or area is stained and accordingly the wiping operation is carried out at low cost.

According to another feature of the first aspect of the invention, the moving device comprises a unit moving device which moves, when the screen is cleaned, the unit relative to the screen such that the unit continues to face the one surface of the screen and moves, before the screen is used to effect a screen printing, the unit to a position away from the screen. The present screen cleaning apparatus is employed in a screen printing machine and, before the screen is used for printing, the unit is moved to a position away from the screen, so as not to interfere with the printing operation of the printing machine.

According to another feature of the first aspect of the invention, the wiping sheet is immovable relative to a squeegee with respect to a direction in which the squeegee is moved by a squeegee moving device for squeezing a printing material into a plurality of through-holes of the screen, and the unit moving device comprises the squeegee moving device. In this case, an exclusive moving device for moving the unit is not needed and accordingly the cost of production of the present apparatus is reduced.

According to another feature of the first aspect of the invention, the screen cleaning apparatus further comprises a changing device which changes the portion of the wiping sheet with a different portion of the same wiping sheet. Otherwise, the changing device may change the current wiping sheet with a different, new wiping sheet. In the former case, the WS may be provided by a web having a constant width, and the wiping portion of the web strained in each wiping operation may be fed forward and changed with a new, wiping portion of the same web by a feeding device. The new wiping portion is contacted with the screen. In the latter case, the WS may be provided by a cut sheet, and the cut sheet stained in each wiping operation is changed with a new cut sheet for the next wiping operation. In either case, since the WS is very cheap, the screen wiping is effected at low cost.

According to another feature of the first aspect of the invention, the wiping sheet comprises a wiping web having a constant width, and wherein the apparatus further comprises a wiping-sheet feeding device including a supplying rotatable member which is rotatable about a first axis line and which supports a roll of the wiping web, a taking-up rotatable member which is rotatable about a second axis line different from the first axis line and which takes up the wiping web, and an actuator which rotates the taking-up rotatable member to take up the wiping web. The changing device or the WS feeding device may be controlled by the screen-cleaning control device, so that a current wiping portion of the web is automatically changed with a new wiping portion of the same at a predetermined timing, e.g., when a screen cleaning operation is started or ended, or during a screen cleaning operation. In the latter case, the screen-cleaning control patterns may be prepared by adopting the changing device or the feeding device as one of the cleaning elements.

According to another feature of the first aspect of the invention, the wiping-sheet feeding device comprises an adjusting device which adjusts a pitch of feeding of the wiping sheet. The pitch of feeding of the WS may be adjusted in the same manner as described above for the CS.

According to another feature of the first aspect of the invention, the screen cleaning apparatus further comprises a drying device which dries one of opposite surfaces of the screen which has been wiped with the wiping sheet.

According to another feature of the first aspect of the invention, the drying device is provided on an upstream side of the portion of the wiping sheet in a direction in which the wiping sheet is moved relative to the screen when the screen is wiped.

According to another feature of the first aspect of the invention, the drying device comprises an air jetting member which jets air toward the screen. The drying device may be controlled by the screen-cleaning control device, so that the one surface of the screen wiped with the WS is automatically dried by the drying device. In the latter case, the screen-cleaning control patterns may be provided by employing the drying device as one of the cleaning elements and, if one of the control patterns in each of which the drying device is used is selected, a screen cleaning operation including the screen drying step is effected.

According to another feature of the first aspect of the invention, the wiping-sheet supporting device supports the wiping sheet formed of a hygroscopic paper. The WS may be formed of pure paper, or a complex paper in which a reinforcing material is mixed. Otherwise, the WS may include a first sheet formed of paper and a second sheet which is fed with the first sheet while supporting the first sheet. Since paper is cheap, the cleaning operation can be carried out at low cost.

According to another feature of the first aspect of the invention, the ultrasonic vibrator, the cleaning-sheet supporting device, and the washing-agent supplying device are provided on the side of one of opposite surfaces of the screen, the one surface contacting a substrate when the screen is used to effect a screen printing on the substrate. Thus, the screen is cleaned with the CS, on the side of the contact surface thereof which is adapted to contact a substrate. Accordingly, it is not necessary to move the PM to a position away from the screen, for cleaning the screen. Therefore, the present screen cleaning apparatus is advantageously used for cleaning a screen of a screen printing machine in which a PM is placed directly on the screen and a squeegee is moved to move the PM on the screen and thereby squeeze the PM into through-holes of the screen. In many screen printing machines, a screen is provided such that the screen extends in a horizontal plane, and the upper and lower surfaces of the screen provides the squeeze and contact surfaces thereof, respectively. In those cases, if a WA is supplied directly to the screen, on the side of the contact or lower surface thereof, a considerable proportion of the WA will drop uselessly. In contrast, if the screen is cleaned with the CS and the WA is supplied to the CS, the WA is effectively absorbed and held by the CS, though the WA is supplied on the lower side of the screen. Thus, the screen is cleaned on the side of the contact surface thereof, without useless use of the WA. Therefore, even in a screen printing machine in which a PM is placed directly on a screen, the screen is quickly cleaned without needing to move the PM to a position away from a printing area of the screen. The present apparatus cleans the contact surface of the screen that strongly influences the quality of printing when being stained.

According to another feature of the first aspect of the invention, the screen cleaning apparatus further comprises a first moving device which moves at least one of the screen and a first unit including the ultrasonic vibrator and the cleaning sheet, toward and away from each other, such that one of opposite surfaces of the screen and the portion of the cleaning sheet is brought into contact with each other and subsequently is separated from each other, a second moving device which moves at least one of the screen and the first unit, relative to each other, in a direction parallel to the one surface of the screen, and a screen-cleaning control device which selects one of a plurality of screen-cleaning control patterns and controls, according to the selected screen-cleaning control pattern, at least one of the ultrasonic vibrator, the washing-agent supplying device, and the first and second moving devices, for cleaning the screen. In this case, the screen and/or the first unit are/is automatically moved, under the control of the control device, toward and away from each other, and relative to each other, for cleaning the screen. The WA supplying device may, or may not, be adapted to contact the screen via the CS. The control device may be adapted to additionally control the WS feeding device, the CS-feeding-pitch adjusting device, and the WS-feeding-pitch adjusting device, each as described above. The screen-cleaning control patterns may include a high-speed normal cleaning pattern in which the CS, the vibrator, and the WA supplying device are used; a low-speed normal cleaning pattern in which the CS, the vibrator, and the WA supplying device are used; a high-speed simplified cleaning pattern in which the CS is used and the vibrator or the WA supplying device is not used; and a dual cleaning pattern in which the WS as well as the CS is used. The cleaning time increases as the speed of relative movement of the screen and the first unit increases. This speed may be kept constant during the cleaning of a screen, or may be changed. In the latter case, the speed may be changed continuously or stepwise. In the case where a plurality of different screen-cleaning control patterns are employed for cleaning the same sort of screen, a standard speed map which may be stored in a memory of the control device and which defines one or more speeds, may be multiplied by each of a plurality of different positive coefficients, for deriving a corresponding one of a plurality of different speed maps. The greater coefficients, each greater than 1, define the higher speeds, i.e., the shorter cleaning times, and the smaller coefficients, each smaller than 1, define the lower speeds, i.e., the longer cleaning times. A high speed means not only a constant high speed but also a high average of different speeds. Thus, the screen-cleaning control patterns may be provided such that one or more of the cleaning elements, such as the ultrasonic vibrator, the WA supplying device, the CS, or the WS, may be combined with each of the thus-obtained speed maps. One or more speeds defined by each speed map may be pre-determined based on one or more of various speed determining factors, such as for what kind of reason a screen cleaning is needed; the size of through-holes of the screen; or the density of the through-holes in unit area. The screen-cleaning control patterns may be stored in a memory of the control device such that those control patterns are associated with a plurality of screen-cleaning starting conditions, as described later. In this case, the control device automatically selects one of the control patterns. Otherwise, the present cleaning apparatus may be provided with an input device which is operable by an operator for selecting one of the control patterns. The input device may be modified such that the operator can select one of a plurality of cleaning-element combination patterns each of which defines which one or ones of the cleaning elements is/are used for cleaning, and can select one of the speed maps. In either case, the present cleaning apparatus may additionally be provided with a modifying device which is operable by the operator for modifying a portion of the automatically or manually selected screen-cleaning control pattern, depending upon the circumstances. The modifying device may include an input device which is operable by the operator for inputting one or both of data indicative of which one or ones of the cleaning elements should, or should not, be used for cleaning, and data indicative of which one of the speed maps should be employed. The control device may be adapted to control the CS feeding device as described above. In the last case, the control patterns may be provided by dealing with the CS feeding device as one of the cleaning elements. For example, the CS may be used for cleaning a screen, either after being fed over a predetermined pitch or length, or while being fed over the same length. Thus, different screen-cleaning control patterns may be provided by employing different CS feeding manners, such as different CS feeding timings or amounts.

Thus, the present cleaning apparatus automatically cleans, with the CS, the screen according to the selected one of the different control patterns. Since the control device selects an appropriate control pattern in each particular case, the screen is effectively cleaned according the selected control pattern.

According to another feature of the first aspect of the invention, the screen cleaning apparatus further comprising a wiping-sheet supporting device which supports at least a portion of a porous wiping sheet, such that the portion of the wiping sheet is contactable with the screen, the wiping-sheet supporting device being provided on one of two sides of the screen which is opposite to the other side thereof on which the ultrasonic vibrator is provided, a third moving device which moves at least one of the screen and a second unit including the wiping sheet, toward and away from each other, such that the other surface of the screen and the portion of the wiping sheet is brought into contact with each other and subsequently is separated from each other, and a fourth moving device which moves at least one of the screen and the second unit, relative to each other, in a direction parallel to the other surface of the screen, the screen-cleaning control device controlling, according to the selected screen-cleaning control pattern, at least one of the ultrasonic vibrator, the washing-agent supplying device, and the first, second, third, and fourth moving devices, for cleaning the screen. In this case, the screen-cleaning control patterns may be provided by additionally dealing with the WS as one of the cleaning elements. If one of the control patterns in each of which the WS is used, the screen is automatically wiped with the WS according to the selected control pattern.

According to another feature of the first aspect of the invention, the screen-cleaning control device comprises a memory which stores the plurality of screen-cleaning control patterns which correspond to a plurality of screen-cleaning starting conditions, respectively, and a control means for controlling, when one of the screen-cleaning starting conditions is satisfied, the at least one of the ultrasonic vibrator, the washing-agent supplying device, and the first and second moving devices, for cleaning the screen, according to the selected screen-cleaning control pattern which corresponds to the satisfied screen-cleaning starting condition. In this case, if one of the screen-cleaning starting conditions is satisfied, one of the screen-cleaning control patterns which corresponds to the satisfied screen-cleaning starting condition is automatically selected, and at least one of the ultrasonic vibrator, the washing-agent supplying device, and the first and second moving devices, is automatically controlled for cleaning the screen, according to the selected screen-cleaning control pattern. The screen-cleaning starting conditions may comprise, e.g., the end of a screen printing operation; the end of use of the screen; a temporary cease of a screen printing operation; the end of printing of a predetermined number of substrates; an operator's command; a computer's decision to effect a cleaning operation, based on the evaluation of an actual printing; the reading of reference marks provided on the screen, etc. The control patterns may be provided such that the control patterns correspond to the starting conditions, respectively, that two or more of the control patterns correspond to each of the starting conditions, or that each of the control patterns corresponds to two or more of the starting conditions. For example, a high-speed and a low-speed control pattern in which the ultrasonic vibrator, the CS, the WA supplying device, and the WS are moved relative to the screen at a high speed and a low speed, respectively, may correspond to a computer's decision to effect a cleaning operation, based on the evaluation that a printing actually effected on a substrate, such as a PCB, is not good. In this case, if that decision is made by the computer, first, the high-speed control pattern may be selected for effecting a cleaning operation and, if another decision is made immediately after the cleaning operation in accordance with the selected control pattern, then the low-speed control pattern may be selected. Otherwise, if that decision is made by the computer, normally, the high-speed control pattern may be selected and, if those decisions are made at a frequency higher than a reference value, then the low-speed control pattern may be selected. The memory for storing the control patterns may be provided by a nonvolatile memory such as a read only memory (ROM), a backup ROM, or an external storage device. The external storage device may be provided by a memory which is not removable from a computer providing the screen-cleaning control device, or a device including a reader which is not removable from a computer providing the control device and a memory medium (e.g., a magnetic disk or an optical disk) which is removable from the reader. In the case where the present screen cleaning apparatus is employed in a screen printing machine, the full automation of a screen printing operation including a screen cleaning step can be achieved vary easily. Unless the selection of one of the screen- cleaning control patterns is automatically made, the selection must be made by the operator and accordingly the full automation of a screen printing operation cannot be achieved.

According to another feature of the first aspect of the invention, the screen-cleaning control device comprises means for selecting one of the screen-cleaning control patterns which include a simplified cleaning pattern in which the cleaning sheet is used, and the ultrasonic vibrator or the washing-agent supplying device is not used, for cleaning the screen, and a normal cleaning pattern in which the cleaning sheet, the ultrasonic vibrator, and the washing-agent supplying device are used for cleaning the screen. For example, in the case where a screen is cleaned which has so large through-holes that the PM is squeezed through the through-holes to the contact surface of the screen and is adhered around the openings of the throughholes in the contact surface, the contact surface is effectively wiped with the CS according to the simplified cleaning pattern.

According to another feature of the first aspect of the invention, the screen cleaning apparatus further comprises a moving device which moves at least one of the screen and a unit including the ultrasonic vibrator and the cleaning sheet, toward and away from each other, such that one of opposite surfaces of the screen and the portion of the cleaning sheet is brought into contact with each other and subsequently is separated from each other. The unit may, not may not, include the WA supplying device. The WA supplying device may supply the WA to the CS, with the CS being in contact with, or away from, the one surface of the screen.

According to another feature of the first aspect of the invention, the screen cleaning apparatus further comprises a cleaning-sheet-related moving device which moves at least one of the screen and a first unit including the ultrasonic vibrator, relative to each other, in a direction parallel to one of opposite surfaces of the screen. In this case, the cleaning portion of the CS which is contacted with the screen for cleaning the same may have dimensions corresponding to the entirety of the screen, or dimensions corresponding to a portion of the screen. The CS may be provided by a cut sheet which entirely provides the cleaning portion, or by a web which has a constant width and each unit portion of which continuously provides the cleaning portion. In the former case, the ultrasonic vibrator may be moved relative to the screen and the CS, for cleaning the one surface of the screen. In the latter case, the first unit including the CS in addition to the vibrator may be moved relative to the screen. The WA supplying device may be moved with the vibrator relative to the screen while supplying the WA to the CS, or otherwise may be made immovable relative to the screen and supply the WA to the CS before a cleaning operation is started. In the case where the cleaning portion of the CS is smaller than the screen, only the small portion or area is used in each cleaning operation and the total amount of use of the CS is reduced as such. Thus, each cleaning operation can be effected at low cost. In this case, since the CS functions as a wiping sheet ("WS") when being moved on the screen, the cleaning apparatus enjoys a higher cleaning efficiency.

According to another feature of the first aspect of the invention, the cleaning-sheet-related moving device comprises a first-unit moving device which moves, when the screen is cleaned, the first unit relative to the screen such that the first unit continues to face the one surface of the screen and moves, before the screen is used to effect a screen printing, the first unit to a position away from the screen. The present screen printing apparatus is employed in a screen printing machine, and the ultrasonic vibrator is moved to a position away from the screen when the screen is used for printing. Thus, the vibrator does not interfere with the printing operation of the printing machine.

According to another feature of the first aspect of the invention, the screen cleaning apparatus further comprises a wiping-sheet supporting device which supports at least a portion of a porous wiping sheet, such that the portion of the wiping sheet is contactable with the screen, the wiping-sheet supporting device being provided on one of two sides of the screen which is opposite to the other side thereof on which the ultrasonic vibrator is provided, a wiping-sheet-related moving device which moves at least one of the screen and a second unit including the wiping sheet, relative to each other, in a direction parallel to the other surface of the screen, and a synchronizing device which synchronizes the respective movements of the first unit and the second unit with each other. The two units may mechanically be connected with each other. Otherwise, in the case where the CS-related and WS-related moving devices have electric motors as their drive sources, those motors may electrically be controlled such that the respective movements of the first and second units are synchronized with each other.

According to another feature of the first aspect of the invention, the synchronizing device comprises a connecting device which connects the first unit and the second unit with each other, and the first-unit moving device comprises the second-unit moving device. In this case, the first and second units are moved by the common moving device, which contributes to simplifying the construction of the present screen cleaning apparatus and reducing the production cost of the same. In the case where the common moving device also function as the above-described squeegee moving device, the present screen cleaning apparatus enjoys a still simpler construction and a still lower production cost. The synchronizing device may be controlled by the screen-cleaning control device. In the latter case, the screen-cleaning control patterns may be provided by employing the synchronizing device as one of the cleaning elements. For example, in the case where a control pattern in which the CS is used but the WS is not used is selected, the synchronizing device is not operated so that only the CS is moved. Similarly, if a control pattern in which the WS is used but the CS is not used is selected, the synchronizing device is not operated so that only the WS is moved.

According to another feature of the first aspect of the invention, the screen cleaning apparatus further comprises a changing device which changes the portion of the cleaning sheet with a different portion of the same cleaning sheet. Otherwise, the changing device may change the current cleaning sheet with a different, new cleaning sheet. In the former case, the CS may be provided by a web having a constant width, and the cleaning portion of the web strained in each cleaning operation may be fed forward and changed with a new, cleaning portion of the same web by a feeding device. The new cleaning portion is located between the ultrasonic vibrator and the screen. In the latter case, the CS may be provided by a cut sheet, and the cut sheet stained in each cleaning operation is changed with a new cut sheet for the next cleaning operation. In either case, since the CS is very cheap, the cleaning operation is effected at a low cost as compared with the case where a screen is cleaned by vibrating an ultrasonic vibrator held in direct contact with the screen, because in the last case the screen may be damaged and the cleaning of the stained vibrator may be needed.

According to another feature of the first aspect of the invention, the ultrasonic vibrator and the washing-agent supplying device are provided on a same side of the cleaning sheet. In this case, the WA supplying device and the ultrasonic vibrator may be provided as a unit, which contributes to simplifying the construction of the present screen printing apparatus.

According to another feature of the first aspect of the invention, the washing-agent supplying device comprises a washing-agent supplying member which is provided on one of two sides of the cleaning sheet which is opposite to the other side thereof on which the ultrasonic vibrator is provided, a washing-agent supplying source which supplies the washing agent to the washing-agent supplying member, and a supporting member which supports the washing-agent supplying member such that the supplying member is movable between a pressing position where the supplying member presses the cleaning sheet against the ultrasonic vibrator and a releasing position where the supplying member releases the cleaning sheet. In this case, the CS is pressed against the vibrator and the vibration is transmitted with reliability to the screen via the CS, so that the PM adhered to the screen is effectively removed from the same. In addition, since the WA supplying member has not only the WA supplying function but also the CS pressing function, the present apparatus enjoys a simpler construction and a lower production cost, as compared with the case where an exclusive CS pressing member is employed.

According to another feature of the first aspect of the invention, the screen cleaning apparatus further comprises a drying device which dries one of opposite surfaces of the screen which has been cleaned with the cleaning sheet supplied with the washing agent.

According to another feature of the first aspect of the invention, the drying device is provided on a downstream side of the portion of the cleaning sheet in a direction in which the ultrasonic vibrator is moved relative to the screen when the screen is cleaned. The drying device is moved with the vibrator relative to the screen. In this case, when the vibrator is moved back to a screen-cleaning starting position, the screen is dried up by the drying device. However, it is possible that the drying device be provided on the upstream side of the cleaning portion of the cleaning sheet in the same direction. In the latter case, the drying device dries up the screen just after the screen is washed.

According to another feature of the first aspect of the invention, the drying device comprises an air jetting member which jets air toward the screen. The drying device may be controlled by the above-described screen-cleaning control device. In the latter case, the screen-cleaning control patterns may be provided by employing the drying device as one of the cleaning elements and, if one of the control patterns in each of which the drying device is used is selected, a screen cleaning operation including the screen drying step is effected.

According to another feature of the first aspect of the invention, the screen cleaning apparatus further comprises a scratching member which is movable on the screen to scratch a printing material adhered to the screen.

According to another feature of the first aspect of the invention, the scratching member is provided on one of two sides of the wiping sheet which is opposite to the other side thereof on which the screen is provided. In this case, since the scratching member scratches, via the WS, the PM adhered to the screen, the scratching member does not damage the screen, even if the scratching member may be formed of a metallic material.

According to another feature of the first aspect of the invention, the scratching member is provided on a downstream side of the portion of the wiping sheet in a direction in which the wiping sheet is moved relative to the screen when the screen is wiped. The operation of the scratching member for scratching the PM may be controlled by the screen-cleaning control device, so that the PM scratching operation is automatically carried out. In the latter case, the screen-cleaning control patterns may be provided by employing the scratching member as one of the cleaning elements.

According to another feature of the first aspect of the invention, the cleaning-sheet supporting device supports the cleaning sheet formed of a hygroscopic paper. The CS may be formed of pure paper, or a complex paper in which a reinforcing material is mixed. Otherwise, the CS may include a first sheet formed of paper and a second sheet which is fed with the first sheet while supporting the first sheet. Since paper is cheap, the cleaning operation is carried out at low cost.

The second object has been achieved according to a second aspect of the invention, which provides a method of cleaning a screen of a screen printing machine, comprising the steps of supplying a washing agent to a porous cleaning sheet at least a portion of which is located between the screen and an ultrasonic vibrator, contacting the portion of the cleaning sheet with the screen and the ultrasonic vibrator, and vibrating the ultrasonic vibrator at an ultrasonic frequency, thereby causing the portion of the cleaning sheet to clean the screen.

In the screen cleaning method in accordance with the second aspect of the invention, the ultrasonic vibrator is contacted with the screen via a portion or an entirety of the CS, and the WA is supplied to the CS. When the vibrator is vibrated, the stains adhered to the screen are removed from the screen and diffused into the WA carried by the CS. Thus, the screen is cleaned. In the present screen cleaning method, the screen is cleaned without being damaged or without involving the staining of the vibrator.

According to another feature of the second aspect of the invention, the screen cleaning method further comprises the step of moving the ultrasonic vibrator and the cleaning sheet along one of opposite surfaces of the screen, for cleaning the screen.

According to another feature of the second aspect of the invention, the screen cleaning method further comprises the step of wiping, with a wiping sheet, the other surface of the screen.

The third object has been achieved according to a third aspect of the invention, which provides apparatus for cleaning a contact surface of a screen of a screen printing machine, the contact surface contacting a substrate when the screen is used to effect a screen printing on the substrate, the apparatus comprising a feeding device which supports a wiping sheet in a form of a web having a constant width, such that a portion of the web is contactable with the contact surface of the screen, and which feeds the web in a longitudinal direction thereof, a pressing device which presses the portion of the web against a portion of the contact surface of the screen, and a moving device which moves at least one of the screen and a unit including the pressing device, relative to each other, in a direction parallel to the contact surface of the screen.

In the screen cleaning apparatus in accordance with the third aspect of the invention, the WS and/or the pressing device are/is moved relative to each other, with the WS being pressed on the contact surface of the screen by the pressing device. Thus, the entire contact surface of the screen is wiped by the WS. For example, in the case where a PM squeezed into through-holes of the screen is easily separable from the inner surfaces of the through-holes and accordingly substantially no PM is left on the inner surfaces, the screen is cleaned by wiping, with the WS, the contact surface thereof and thereby removing the PM adhered to the surface. In addition, in the case where a screen is cleaned which has so large through-holes that the WS can enter the through-holes and wipe the inner surfaces thereof when being moved relative to the screen, the screen is placed in a highly clean state which ensures that a sufficient amount of PM is printed on a substrate, by just wiping, with the WS, the contact surface of the screen. The screen may be cleaned with the WS, in such a manner that a length of the WS which corresponds to a portion of the contact surface of the screen is pressed on the contact surface by the pressing device and the pressing device and the WA feeding device are moved relative to the screen, or in such a manner that a portion of a length of the WS which corresponds to the entirety of the contact surface of the screen is pressed on the contact surface by the pressing device and only the pressing device is moved relative to the screen. The web of WS may be provided as a roll which is supported on a supplying rotatable member and, after being used for cleaning the screen, is taken up by a taking-up rotatable member. In this case, the taken-up web is not used again. Otherwise, the web of WS may be provided like an endless belt such that the web is stretched between, and around, a drive axis and a driven axis which extend parallel to each other and each of which is rotatable. In the latter case, the drive axis is rotated to circulate the WS, so that the web may be used several times. The speed of relative movement of the pressing device and the screen may be changed depending upon the circumstances. For example, in the case where a screen is cleaned or wiped which has so small through-holes that it is considerably difficult to wipe off the PM left around the openings of the throughholes, the speed is lowered. On the other hand, in the case of a screen having large through-holes, the speed is increased. Similarly, in the case of a screen having through-holes at a high density, the speed is lowered, and vice versa. Like in the case where the CS is used to clean the screen, the speed of relative movement of the pressing device and the screen may be kept constant, or changed according to a desired speed map or pattern, in each screen cleaning operation. The present screen cleaning apparatus cleans a screen without damaging it. In addition, since no ultrasonic vibrator nor WA supplying device is employed, the present apparatus enjoys a simple construction. Moreover, in the case where the area of a portion of the web of WS which is contacted with the contact surface of the screen is smaller than that of the entire contact surface, only the small portion or area is stained in each cleaning operation and accordingly the total amount of use of the web is reduced. Thus, even in the case where the web used once is not used twice, the present screen cleaning apparatus can be operated at low cost. On the other hand, in the case where an endless, circulating web is employed as the WS for cleaning the screen, the present apparatus can be run at still lower cost.

According to another feature of the third aspect of the invention, the unit comprises the feeding device in addition to the pressing device, and wherein the apparatus further comprises a moving device which moves at least one of the unit and the screen relative to each other such that the portion of the web is brought into contact with the portion of the contact surface of the screen and subsequently is separated from each other.

According to another feature of the third aspect of the invention, the pressing device comprises a pressing roller which is rotatable about an axis line perpendicular to a direction in which the web is fed by the feeding device.

According to another feature of the third aspect of the invention, the feeding device comprises an adjusting device which adjusts a pitch of feeding of the web.

BRIEF DESCRIPTION OF THE DRAWINGS

The above and optional objects, features, and advantages of the present invention will be better understood by reading the following detailed description of the preferred embodiments of the invention when considered in conjunction with the accompanying drawings, in which.

DETAILED DESCRIPTION OF THE PREFERRED EMBODIMENTS

Referring to FIGS. 1 through 23, there will be described a screen printing machine including a screen cleaning device 24 to which the present invention is applied.

Figure 1:
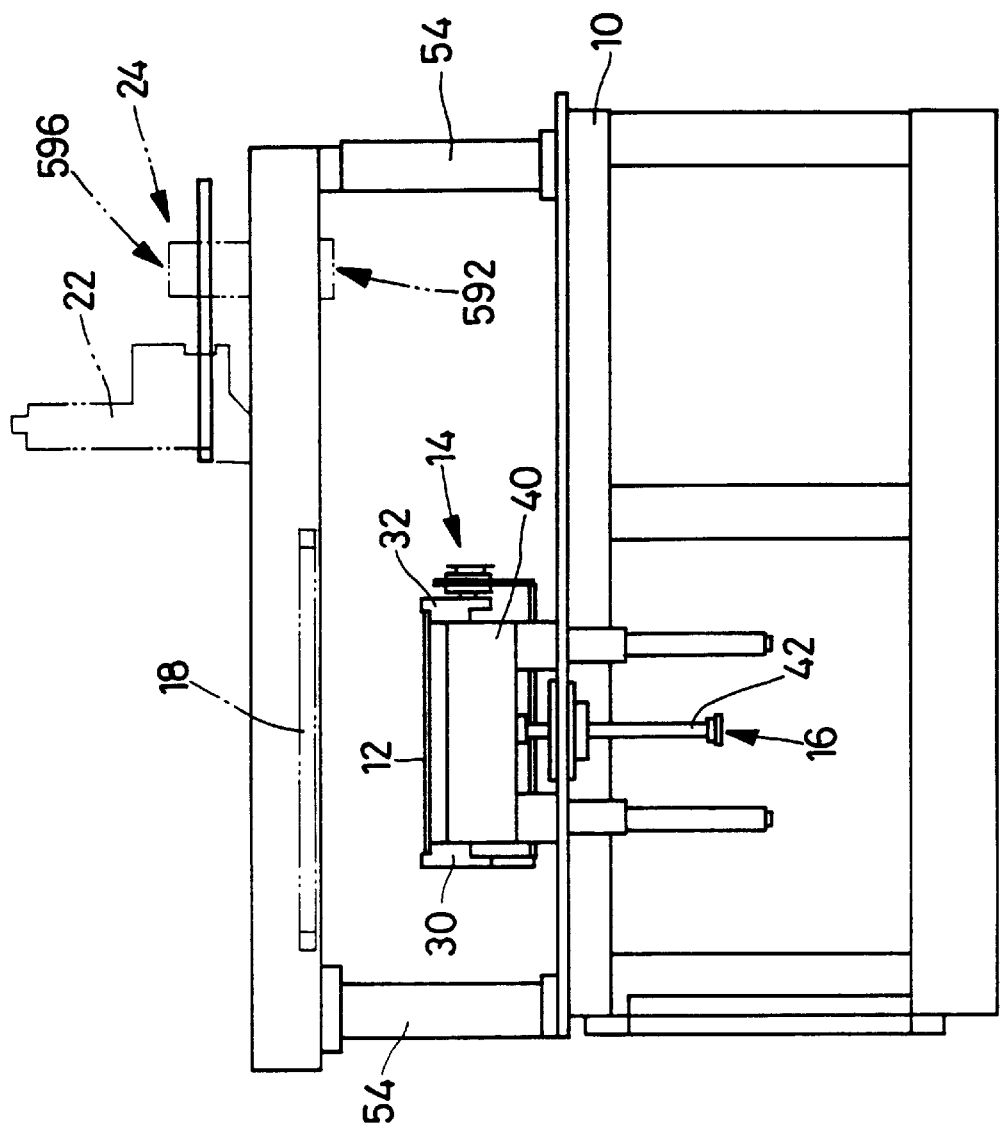
FIG. 1 is a side view of a screen printing machine including a screen cleaning device to which the present invention is applied.

In FIG. 1, reference numeral 10 designates a base. On the base 10, there are provided a PCB (printed circuit board) conveyor 14, a PCB elevator 16, a PCB holddown device (not shown), a screen positioning device 20 (FIG. 3), a printing device 22, and the screen cleaning device 24. The PCB conveyor 14 conveys, to the PCB elevator 16, a PCB 12 as a substrate on which a PM (printing material) is printed by the printing device 22. The PCB elevator 16 supports the PCB 12 conveyed thereto by the PCB conveyor 14, and elevates the same 12 upward and downward. The PCB holddown device holds down the PCB 12 being supported on the PCB elevator 16. The screen positioning device 20 supports and positions a screen 18. The printing device 22 prints, on the PCB 12, creamed solder as a sort of PM. The screen cleaning device 24 cleans the screen 18.

Figure 3:
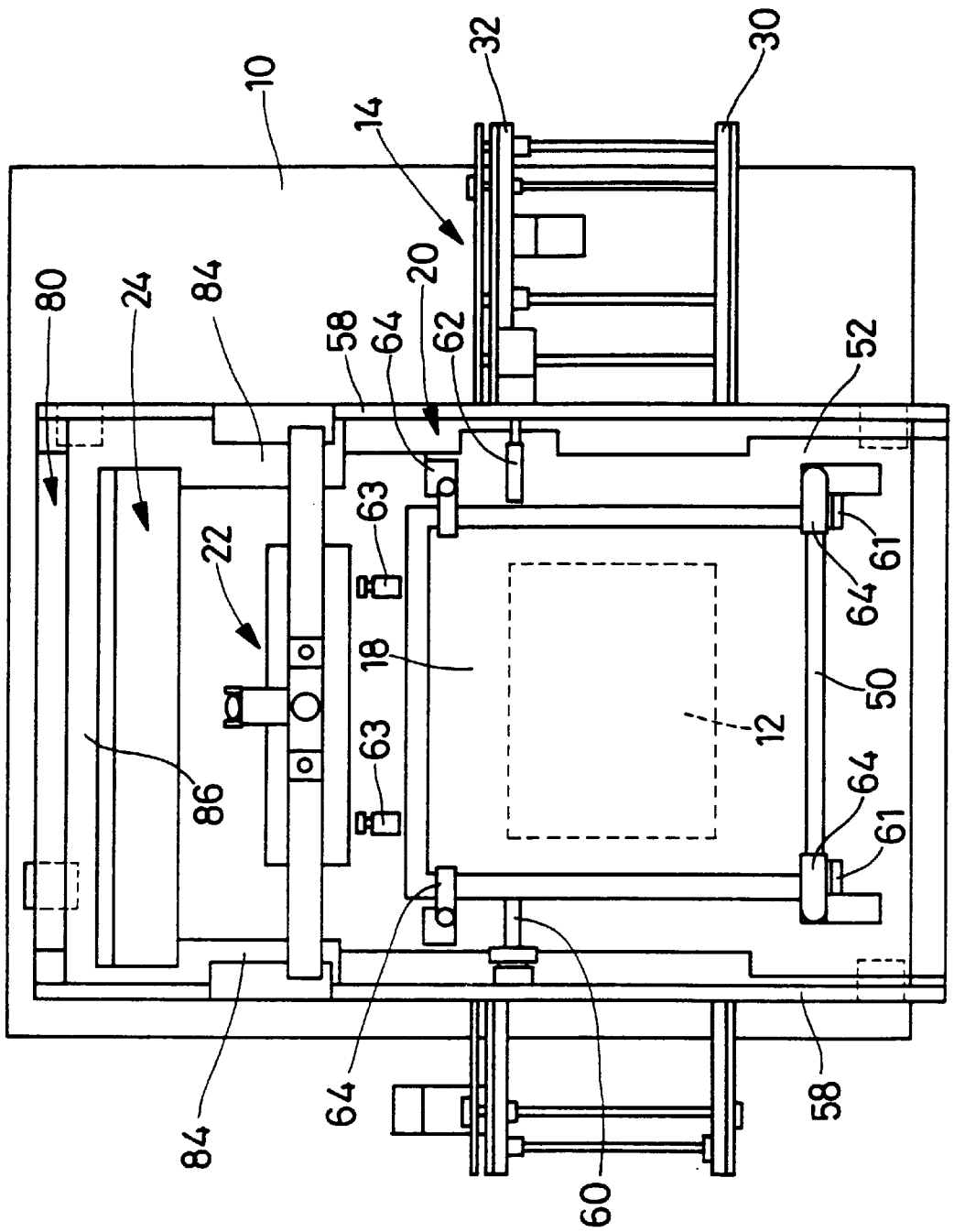
FIG. 3 is a plan view of the screen printing machine of FIG. 1.

As shown in FIG. 3, the PCB conveyor 14 includes a fixed rail 30, and a movable rail 32 which extends parallel to the fixed rail 30 and which is movable toward, and away from, the fixed rail 30. Each of the two rails 30, 32 is provided with an endless chain (not shown) which extends in a lengthwise direction of the rails 30, 32. The PCB 12 are placed on the two chains and, when the chains are moved by a chain drive device (not shown), the PCB 12 is conveyed. The distance between the two rails 30, 32 is adjustable depending upon the dimensions of the PCB 12.

A feed-in conveyor 34 (FIG. 23) which feeds the PCB 12 into the PCB conveyor 14 is provided on the upstream side of the PCB conveyor 14 in the PCB conveying direction, and a feed-out conveyor 36 (FIG. 23) which feeds the PCB 12 out of the PCB conveyor 14 is provided on the downstream side of the PCB conveyor 14 in the PCB conveying direction.

Figure 2:
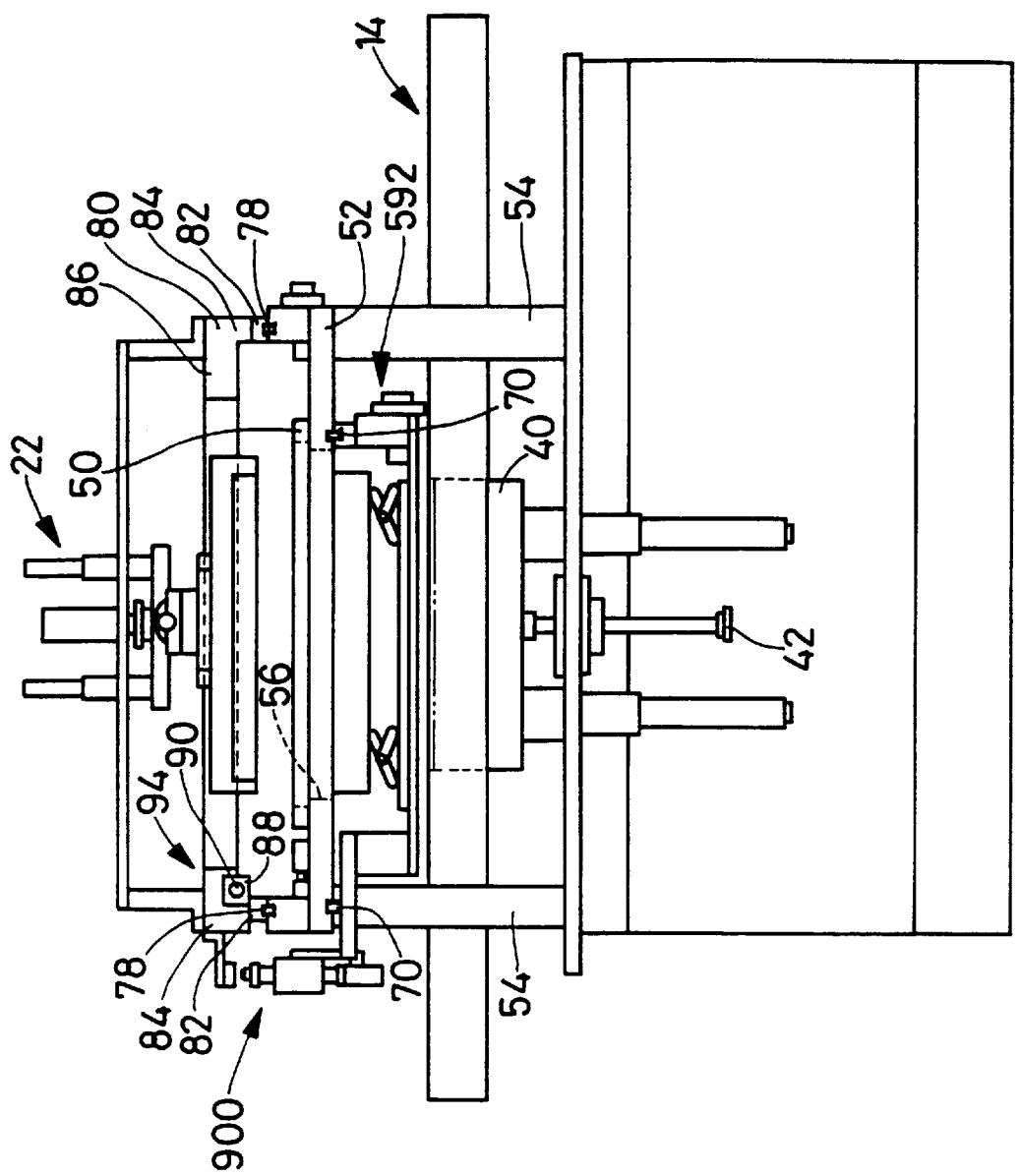
FIG. 2 is a front view of the screen printing machine of FIG. 1.

As shown in FIGS. 1 and 2, the PCB elevator 16 is provided below the printing device 22, and includes a PCB support table 40 which is movable upward and downward through the spacing between the fixed and movable rails 30, 32. The PCB support table 40 attracts the PCB 12 by negative pressure for supporting the same 12, and is moved by a PCB-elevating air cylinder 42 between its lowermost position below the PCB conveyor 14 and its uppermost position where the PCB 12 supported thereby contacts the lower surface of the screen 18. The dimension of the PCB support table 40 in a direction perpendicular to the PCB conveying direction in a horizontal plane is adjustable to the width of the PCB 12. The PCB holddown device, not shown, is provided between the PCB conveyor 14 and the screen positioning device 20.

The screen 18 has a thin-plate-like configuration, and has a number of through-holes formed through the thickness thereof. As shown in FIG. 3, the screen 18 is supported by a screen frame 50, and the screen positioning device 20 includes a screen support table 52 which supports the screen frame 50. The screen support table 52 has a plate-like configuration, and is fixed to four columns 54 supported by the base 10. As shown in FIG. 2, the screen support table 52 has an opening 56 formed through the thickness thereof, and the screen frame 50 is supported on the outer peripheral portion of the screen support table 52 which externally defines the opening 56.

As shown in FIG. 3, two projecting portions 58 project upward from two side portions of the screen support table 52 which are opposite to each other in a direction perpendicular to the PCB conveying direction, respectively. One of the two projecting portions 58 is provided with an X-direction positioning device 60 which defines a position of the screen 18 in an X direction parallel to the PCB conveying direction. The other projecting portion 58 is provided with an X-direction moving device 62 which moves the screen 18, more specifically the screen frame 50, to the X-direction position defined by the X-direction positioning device 60. On the screen support table 52, there are provided a pair of Y-direction positioning devices 61 which define a position of the screen 18 in a Y direction perpendicular to the PCB conveying direction, and a pair of Y-direction moving devices 63 which press the screen 18, more specifically the screen frame 50, against the Y-direction positioning devices 61. On the screen support table 52, there are also provided four screen fixing devices 64 which fix the screen 18 positioned by the two positioning devices 60, 61 and the two moving devices 62, 63. The screen support table 52, two positioning devices 60, 61, two moving devices 62, 63, four fixing devices 64, etc. cooperate with one another to provide the screen positioning device 20.

As shown in FIG. 2, a pair of guide rails 70 are fixed to the lower surface of the screen support table 52, such that the guide rails 70 extend perpendicular to the PCB conveying direction. Another pair of guide rails 78 are fixed to the respective upper surfaces of the two projecting portions 58, such that the guide rails 78 extend perpendicular to the PCB conveying direction. Thus, the guide rails 78 extend parallel to the guide rails 70. The printing device 22 includes a slide 80 which is supported by the two guide rails 78 via two guide blocks 82, such that the slide 80 is movable relative to the screen 18 by being guided by the guide rails 78. As shown in FIG. 3, the slide 80 has a generally U-shaped configuration which includes a pair of leg portions 84 and a connection portion 86 connecting between the two leg portions 84. The two guide blocks 82 are fixed to the respective lower surfaces of the two leg portions 84. As shown in FIG. 2, the connection portion 86 is provided with a nut 88 which is threaddedly engaged with a ball screw 90 supported by the screen support table 52. When the ball screw 90 is rotated by a squeegee-moving servomotor 92 (FIG. 23), the slide 80 is moved in a printing direction perpendicular to the PCB conveying direction in a horizontal plane.

The slide 80 supports squeegees 162 which will be described later. The nut 88, ball screw 90, and servomotor 92 cooperate with one another to provide a squeegee moving device 94.

Figure 4:
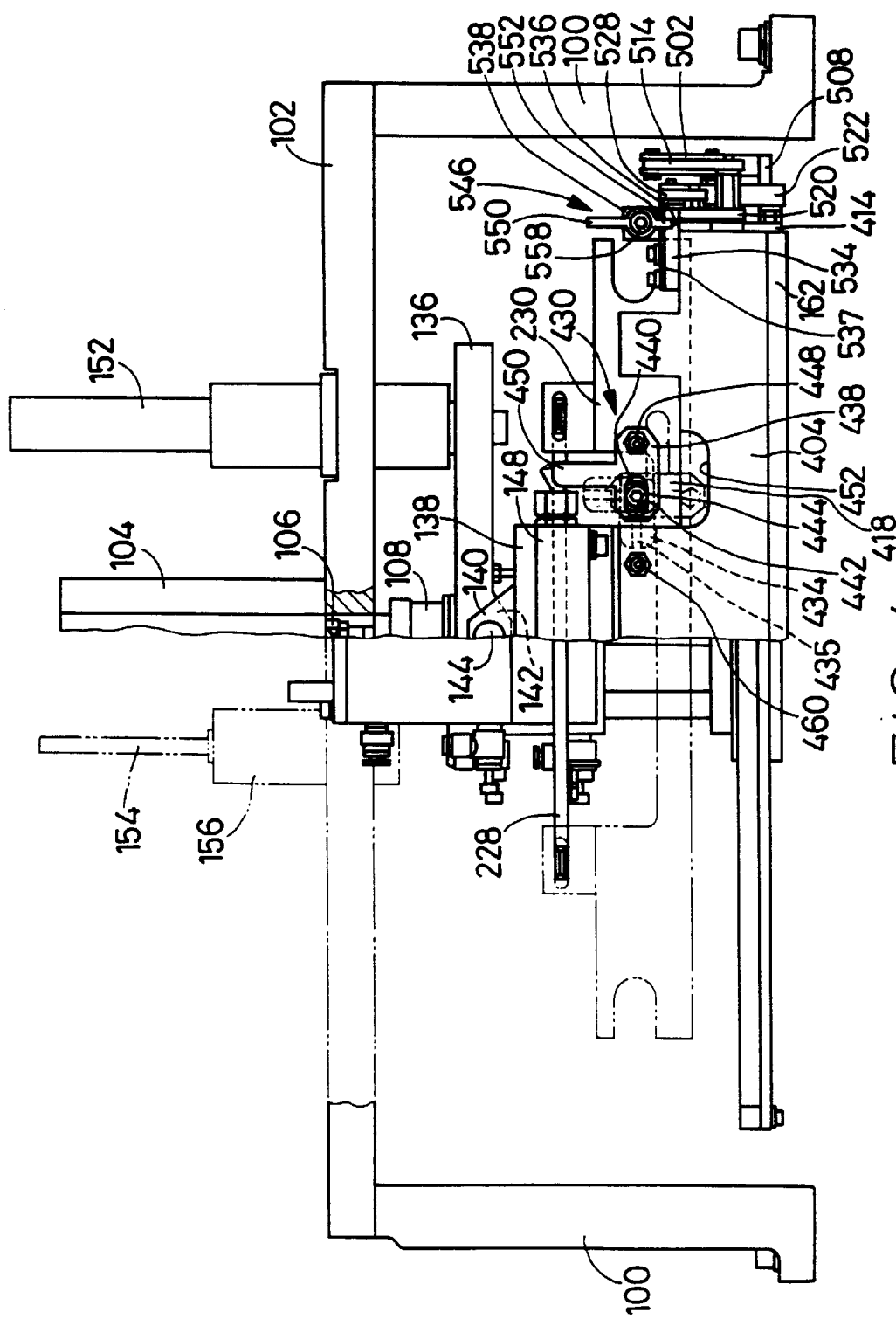
FIG. 4 is a front view of a printing device of the screen printing machine of FIG. 1.
Figure 5:
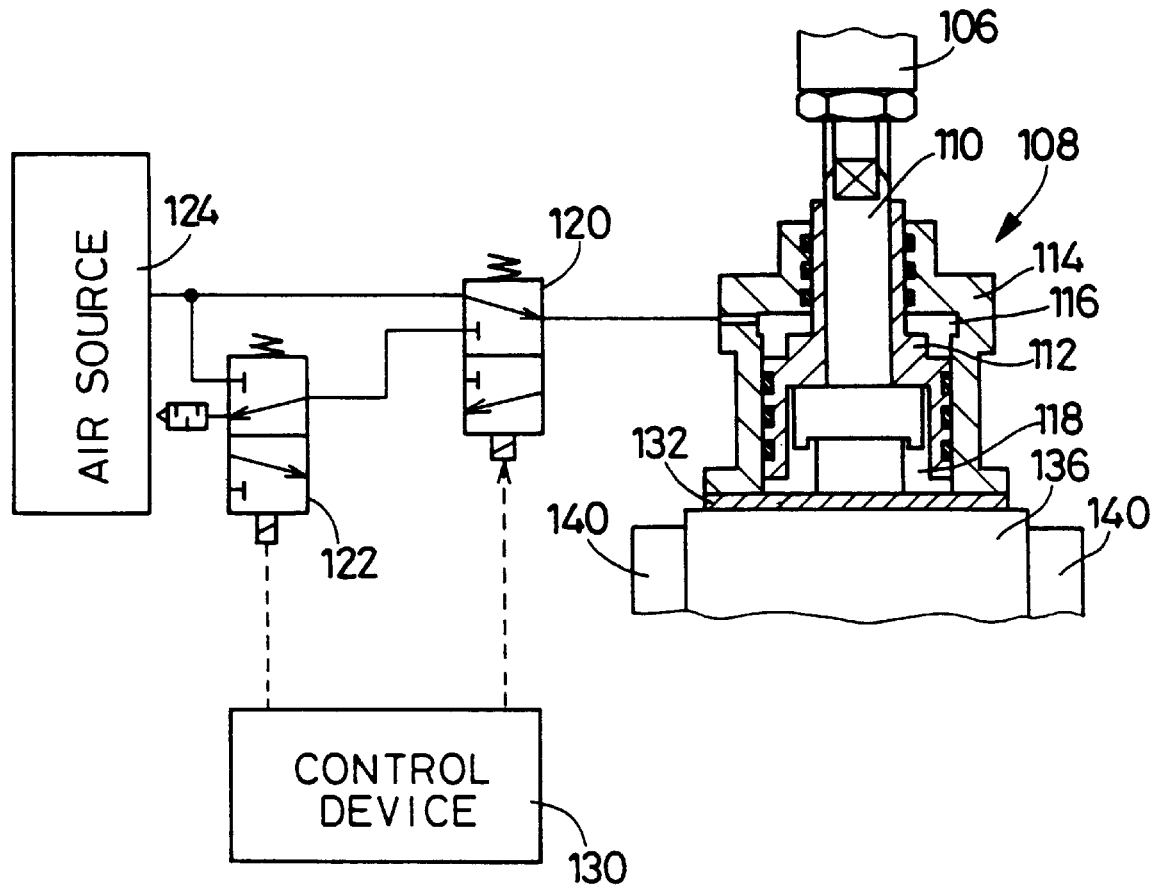
FIG. 5 is a view showing an electric circuit employed for supplying air to a contact-load adjusting air cylinder which adjusts the contact load of the printing device of FIG. 4.

As shown in FIGS. 2 and 4, two support members 100 are provided on the two leg portions 84 of the slide 80, respectively. Two opposite end portions of a support plate 102 are fixed to the respective upper ends of the two support members 100. The support plate 102 extends in a widthwise direction of the screen 18 which is perpendicular to the printing direction in a horizontal plane. A printing-head elevating air cylinder 104 is fixed to a middle portion of the support plate 102 in a lengthwise direction thereof, such that the air cylinder 104 is oriented downward. The air cylinder 104 has a piston rod 106 which extends through a hole formed through the thickness of the support plate 102. As shown in FIG. 5, the piston rod 106 is connected to a piston rod 110 of a contact-load adjusting air cylinder 108 which adjusts a load which is applied to the screen 18 by the squeegees 162 described later when the squeegees 162 contact the screen 18. The adjusting air cylinder 108 is moved up and down by the elevating air cylinder 104.

The combination of the contact-load adjusting air cylinder 108 and the elevating air cylinder 104 is a contact load changing device within the meaning of the claims.

As shown in FIG. 5, a piston 112 fixed to the piston rod 110 is airtightly fit in a cylinder housing 114 of the air cylinder 108 such that the piston 112 is movable relative to the housing 114. An air chamber 116 is provided above, and an atmospheric-pressure chamber 118 is provided below, the piston 112. The air chamber 116 is selectively communicated with an air source 124 and the atmosphere by the cooperation of a solenoid-operated directional control valve 120 and a solenoid-operated proportional control valve 122, so that the housing 114 is moved upward and downward relative to the piston 112, respectively. The atmospheric-pressure chamber 118 always communicates with the atmosphere.

The directional control valve 120 is provided between the air chamber 116 and the air source 124, and the proportional control valve 122 is provided between the directional control valve 116 and the air source 124. The switching of the directional control valve 120 is controlled by a control device 130. More specifically described, the directional control valve 120 is selectively switched to a first state in which the valve 120 causes the air chamber 116 to communicate with the air source 124 and a second state in which the valve 120 causes the air chamber 116 to communicate with the atmosphere. While the directional control valve 120 is placed in its first state, the cylinder housing 114 is held at its uppermost position where a bottom wall 132 thereof contacts the lower end of the piston rod 110.

The control device 130 is a changing device control device within the meaning of the claims.

Figure 6:
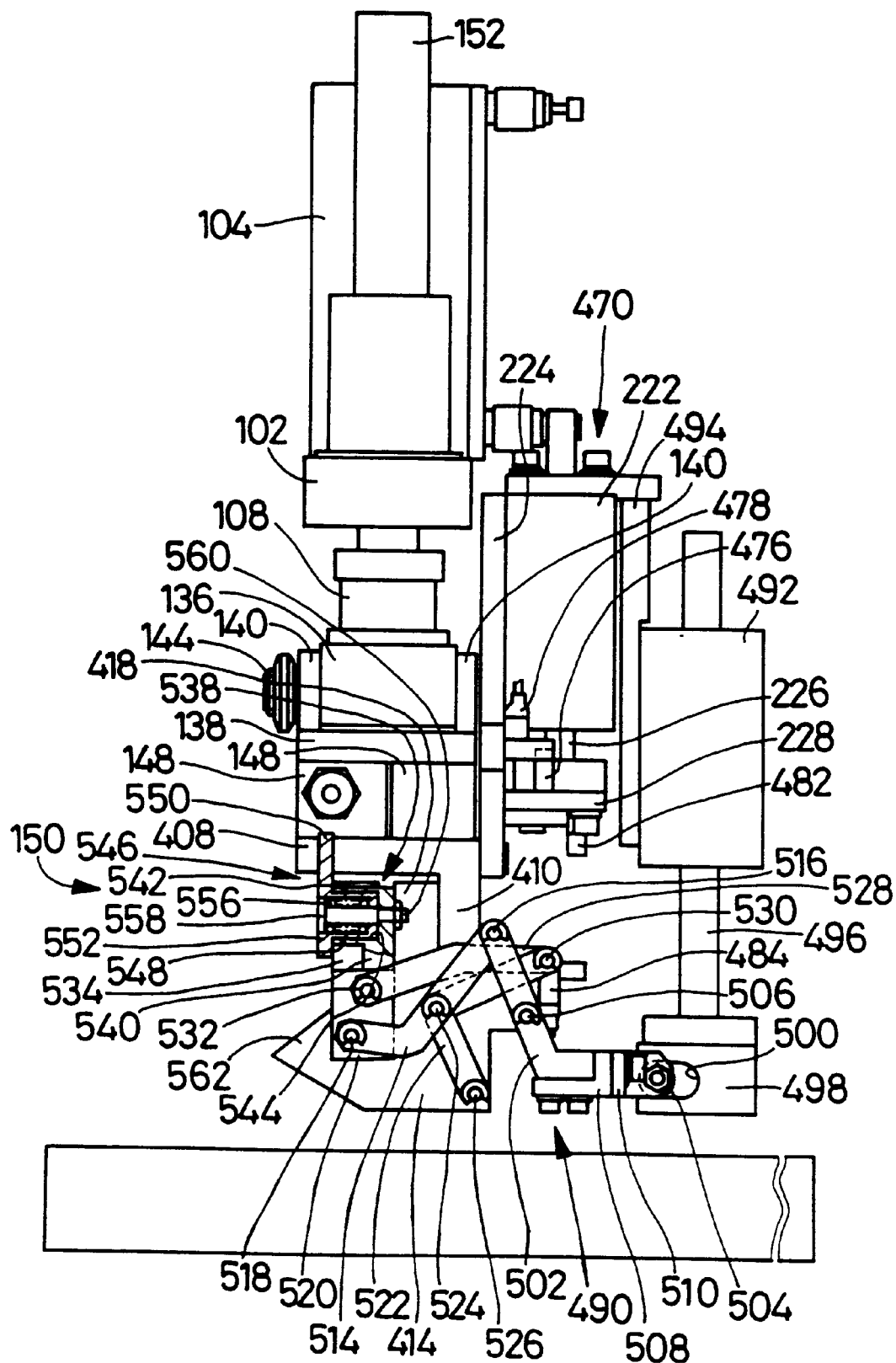
FIG. 6 is a side view of the printing device of FIG. 4.

As shown in FIGS. 4 through 6, an attachment plate 136 is fixed to the lower surface of the cylinder housing 114 (or the bottom wall 132) of the contact-load adjusting air cylinder 108, such that the attachment plate 136 extends parallel to the widthwise direction of the screen 18. A rotary plate 138 is attached to the attachment plate 136 such that the rotary plate 138 is rotatable about an axis line parallel to the printing direction. As shown in FIG. 4, the rotary plate 138 is elongate in the widthwise direction of the screen 18, and a pair of support plates 140 project upward from the upper surface of a middle portion of the rotary plate 138. The two support plates 140 sandwich a connection block 142 which projects downward from the lower surface of the attachment plate 136. The support plates 140 and the connection block 142 are rotatable about an axis member 144, so that the rotary plate 138 is rotatable about the axis line parallel to the printing direction.

As shown in FIG. 6, a printing head 150 is attached to the lower end of the rotary plate 138 via two load sensors 148. The load sensors 148 and the printing head 150 are rotatable with the rotary plate 138 about the axis line parallel to the printing direction, and are moved upward and downward by each of the printing-head elevating air cylinder 104 and the contact-load adjusting air cylinder 108. This movement is guided by a pair of guide rods 152 which are fixed to the attachment plate 136 and extend through respective holes formed through the thickness of the support plate 102. A rod 154 which projects upward through the support plate 102 is attached to the attachment plate 136 such that the rod 154 is movable upward and downward together with the plate 136. A holding device 156 which is attached to the support plate 102, holds and releases the rod 154 for positioning the attachment plate 136 at a desired height and permitting the upward or downward movement of the plate 136, respectively.

As shown in FIG. 6, the two load sensors 148 are provided side by side between the rotary plate 138 and an attachment member 408 of the printing head 150, in a middle range of the width of the screen 18. Each load sensor 148 includes four strain gauges (not shown) providing a bridge circuit which detects a strain produced in a support member to which the strain gauges are fixed, when the squeegees 162 contact the screen 18. The bridge circuit generates a detection signal representing the detected strain, and supplies the detection signal to the control device 130 via a signal processing circuit (not shown). Each load sensor 148 is provided between the attachment member 408 and the rotary plate 138 such that there are left respective small spaces between one of two opposite ends of the support member of each sensor 148 and the attachment member 408 and between the other end of the support member and the rotary plate 138. When a load is applied to the screen 18 in a vertical direction, a strain is produced in each load sensor 148. The control device 130 calculates a negative value as the contact load applied to the screen 18 by the squeegees 162, based upon the strain produced in the support member or strain gauges of each load sensor 148.

The control device 130 is a thrusting-force-relating-amount control device, and the combination of the control device 130 and the load sensors 148 is a thrusting-force-relating-amount determining device, within the meaning of the claims. The load sensors 148 together are a contact load measuring device within the meaning of the claims.

Figure 7:
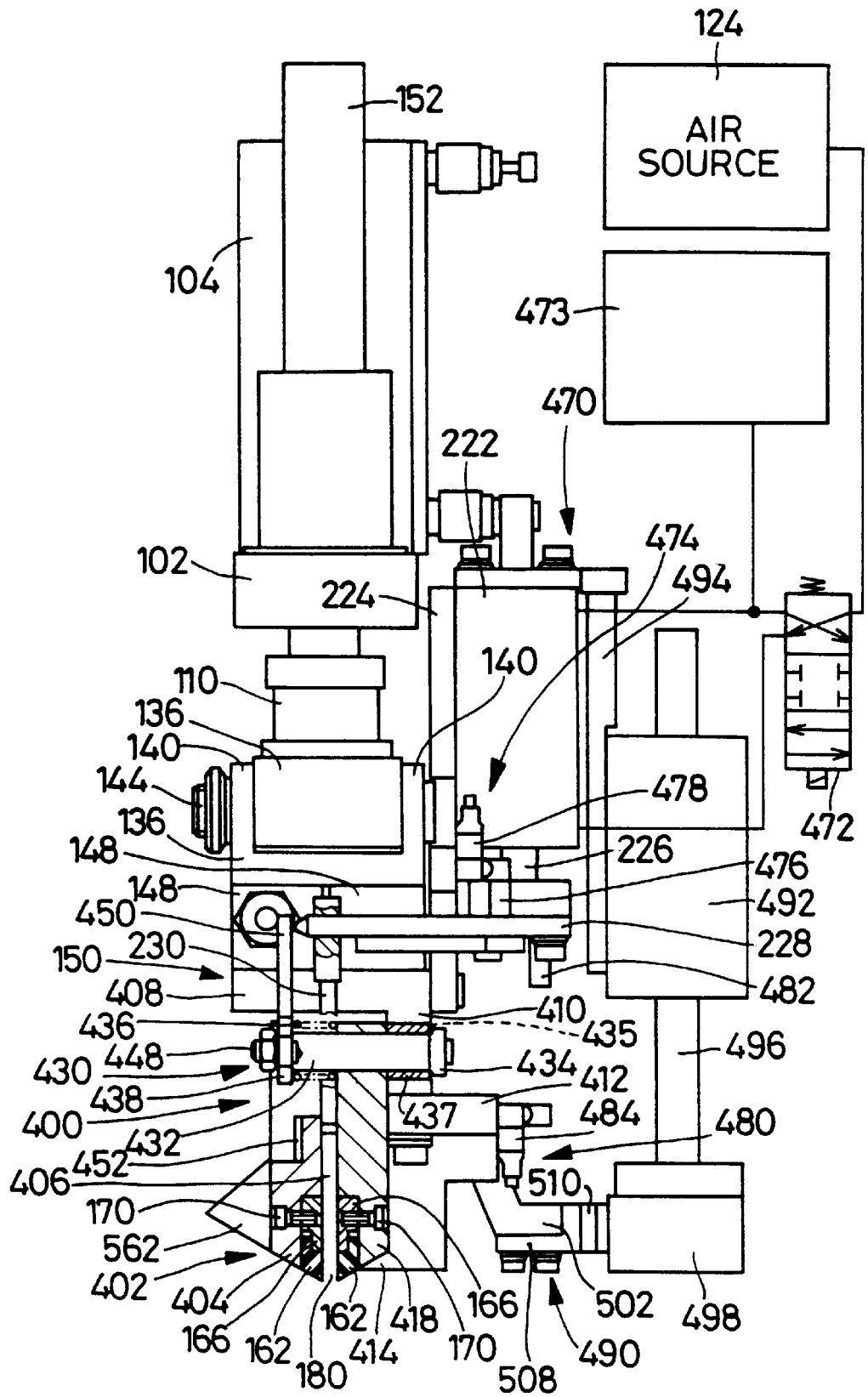
FIG. 7 is another side view of the printing device of FIG. 4.

As shown in FIG. 7, the attachment member 408 is provided below the lower surfaces of the two load sensors 148. An elongate plate-like support member 412 is fixed to the lower surface of an attachment portion 410 which projects downward from the attachment member 408. The support member 412 extends parallel to the widthwise direction of the screen 18. Two side plates 414 are fixed to two end faces of the support member 412, respectively, which are opposite to each other in a lengthwise direction thereof.

A printing-material ("PM") container 400 for accommodating the creamed solder as the PM is detachably attached to the attachment portion 410, between the two side plates 414. The PM container 400 includes a main housing 402 which has a PM chamber 406 defined by a first and a second elongate plate-like member 418, 404, and two closure plates 420 (FIG. 8) fixed to two end faces of the first plate-like member 418 which are opposite to each other in a lengthwise direction thereof. The closure plates 420 project from the first plate-like member 418 toward the second plate-like member 404, and are fixed to the first-plate-like-memberside surface of the second plate-like member 404 so as to close two end openings of the PM chamber 406 which are opposite to each other in a lengthwise direction thereof. The closure plates 420 also define the distance between the two plate-like members 418, 404.

Each of the two plate-like members 418, 404 has a recess in which a rubber squeegee 162 and a squeegee holding member 166 are fit. Each of the squeegees 162 has a plate-like configuration, and the two squeegees 162 are attached to the two plate-like members 418, 404, respectively, with the holding members 166 being fixed to the plate-like members 418, 404 with screws 170, respectively. The lower ends of the two squeegees 162 define a PM outlet 180 which communicates with the PM chamber 406.

Either one of the two squeegees 162 is a squeegee and the other is an outlet defining member, within the meaning of the claims.

Figure 8:
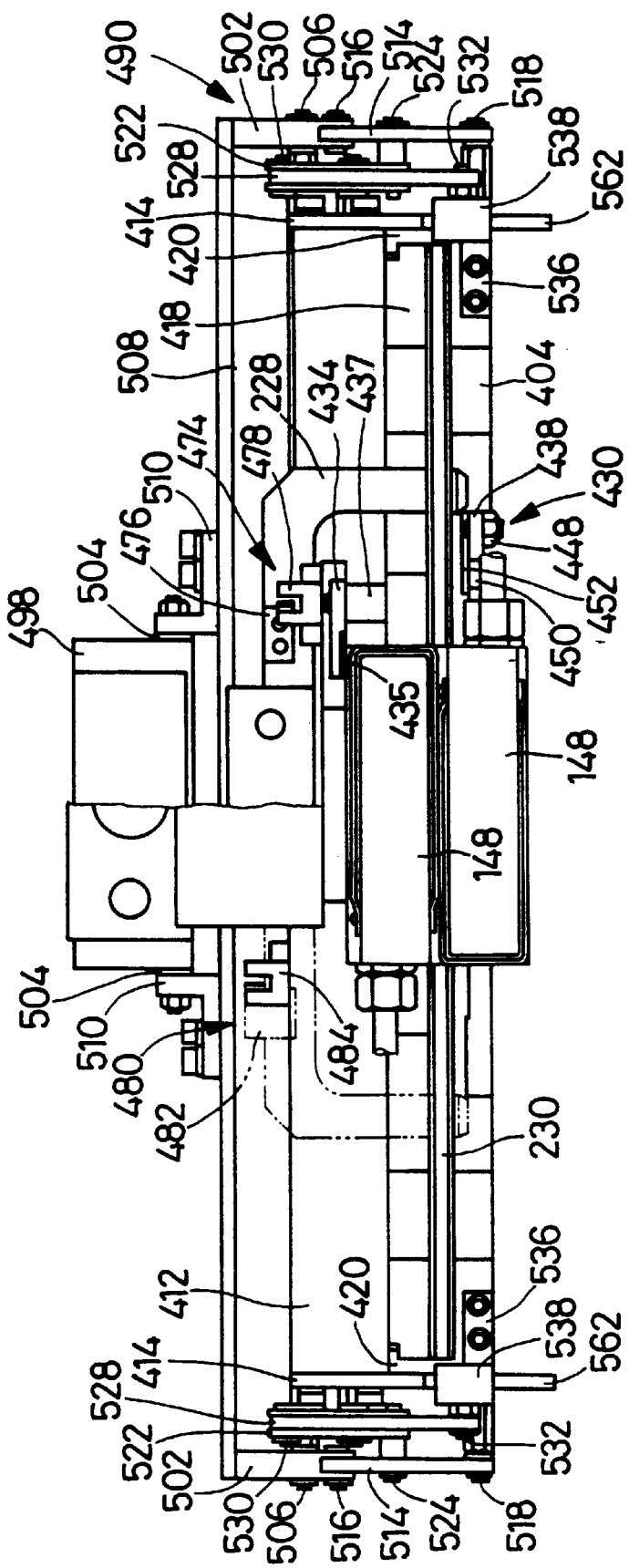
FIG. 8 is a plan view of the printing device of FIG. 4.

While the PM container 400 is detached from, and not supported by, the attachment portion 410, the first and second plate-like members 418, 404 are securely held in engagement with each other by a pair of engaging devices 430 (only one 430 is shown in FIGS. 4 and 8) which are provided such that the two engaging devices 430 are distant from each other in a direction perpendicular to the screen-printing direction.

As shown in FIG. 7, each engaging device 430 includes an axis member 432 which extends through a hole formed through the thickness of the first plate-like member 418, such that the axis member 432 is rotatable relative to the first member 418. A bush 437 is fit on a projecting portion of the axis member 432 which projects from the first member 418 in a direction away from the second member 404, such that the bush 437 is movable relative to the axis member 432 in an axial direction thereof. One end portion of a plate-like engagement member 434 is fixed to a projecting end portion of the axis member 432 which projects from the bush 437, such that the engagement member 434 extends perpendicularly to the axis line of the axis member. The other end portion of the engagement member 434 has a part-cylindrical engagement surface 435 which faces toward the first member 418. Accordingly, the engagement member 434 is thick in a widthwise middle portion thereof and is thin in widthwise end portions thereof, as shown in FIG. 7.

A lever 438 is fixed to the other projecting end portion of the axis member 432 which projects from the first member 418 toward the second member 404, and a coil spring 436 as a sort of elastic biasing member is provided around the projecting end portion of the axis member 432, between the first member 418 and the lever 438. Since the second member 404 has a recess corresponding to the end portion of the axis member 432 projecting from the first member 418, the projecting end portion of the axis member 432 does not interfere with the second member 404. As shown in FIG. 4, the projecting end portion of the axis member 432 has an engagement projection 440 having an oval cross section. An internally threaded hole (not shown) is formed in the engagement projection 440.

As shown in FIG. 4, the lever 438 has a T-shaped configuration, and has an oval hole 442 formed through the thickness of one of opposite two arms of the T shape. With the oval hole 442 being engaged with the engagement projection 440 and with a bolt 444 being threadedly engaged with the internally threaded hole of the engagement projection 440, the lever 438 is fixed to the axis member 432 such that the lever 438 is not rotatable relative to the member 432. The coil spring 436 is sandwiched and compressed between the lever 438 and the first member 418, so that the engagement member 434 is pressed against the attachment portion 410 and simultaneously the first member 418 is pressed against the attachment portion 410.

An engaging mechanism 448 is supported by the other arm of the T-shaped lever 438. The engaging mechanism 448 includes an externally threaded member having a central hole and a bottom wall. The externally threaded member is threadedly engaged with an internally threaded hole formed in the other arm of the lever 438 and is fixed to the arm with a lock nut. Thus, the threaded member is movable relative to the lever 438 and accordingly the position of the former relative to the latter is adjustable. The central hole of the threaded member opens in the end face thereof facing the first member 418, and a ball is provided in the opening end face such that the ball is partially exposed and is prevented from coming off the threaded member. The ball is biased by a compression coil spring provided in the central hole, in a direction in which the ball projects from the opening of the end face. The engagement mechanism 448 extends from the axis member 432 in a direction opposite to the direction in which the engagement member 434 extends from the axis member 432.

Accordingly, an operative portion 450 provided by the vertical portion of the T-shape lever 438 is operable to rotate the lever 438 about the axis member 432. When the lever 438 is rotated to a position indicated at two-dot chain line in FIG. 4, the ball of the engagement mechanism 448 engages an engagement groove 452 of the second member 404, thereby engaging the first and second members 418, 404 with each other. Simultaneously, the engagement member 434 is disengaged from the rear surface of the attachment portion 410 of the attachment member 408, thereby permitting the first member 418 to be disengaged from the attachment portion 410. The axis member 432 is inhibited by the bush 437 from being moved in a direction in which the engagement member 434 approaches the first member 418, and the ball of the engagement mechanism 448 is held in engagement with the engagement recess 452, so that the first and second members 418, 404 are sandwiched by and between the engagement mechanism 448 on one side and the engagement member 434 and the bush 437 on the other side. Thus, the first and second members 418, 404 are securely held in engagement with each other.

On the other hand, when the lever 438 is rotated to a position indicated at solid line in FIG. 4, the engagement mechanism 448 is disengaged from the engagement groove 452, thereby disengaging the first and second members 418, 404 from each other. Simultaneously, the engagement member 434 is engaged with the rear surface of the attachment portion 410, thereby causing the first member 418 to be engaged with the attachment portion 410. More specifically described, the engagement member 434 is guided by the part-cylindrical guide surface 435 and is engaged with the attachment portion 410 against the biasing action of the coil spring 436, while the first member 418 is pressed on the attachment portion 410 owing to the biasing action of the spring 436. Thus, the PM container 400 is attached to the attachment member 408 with stability.

Figure 9:
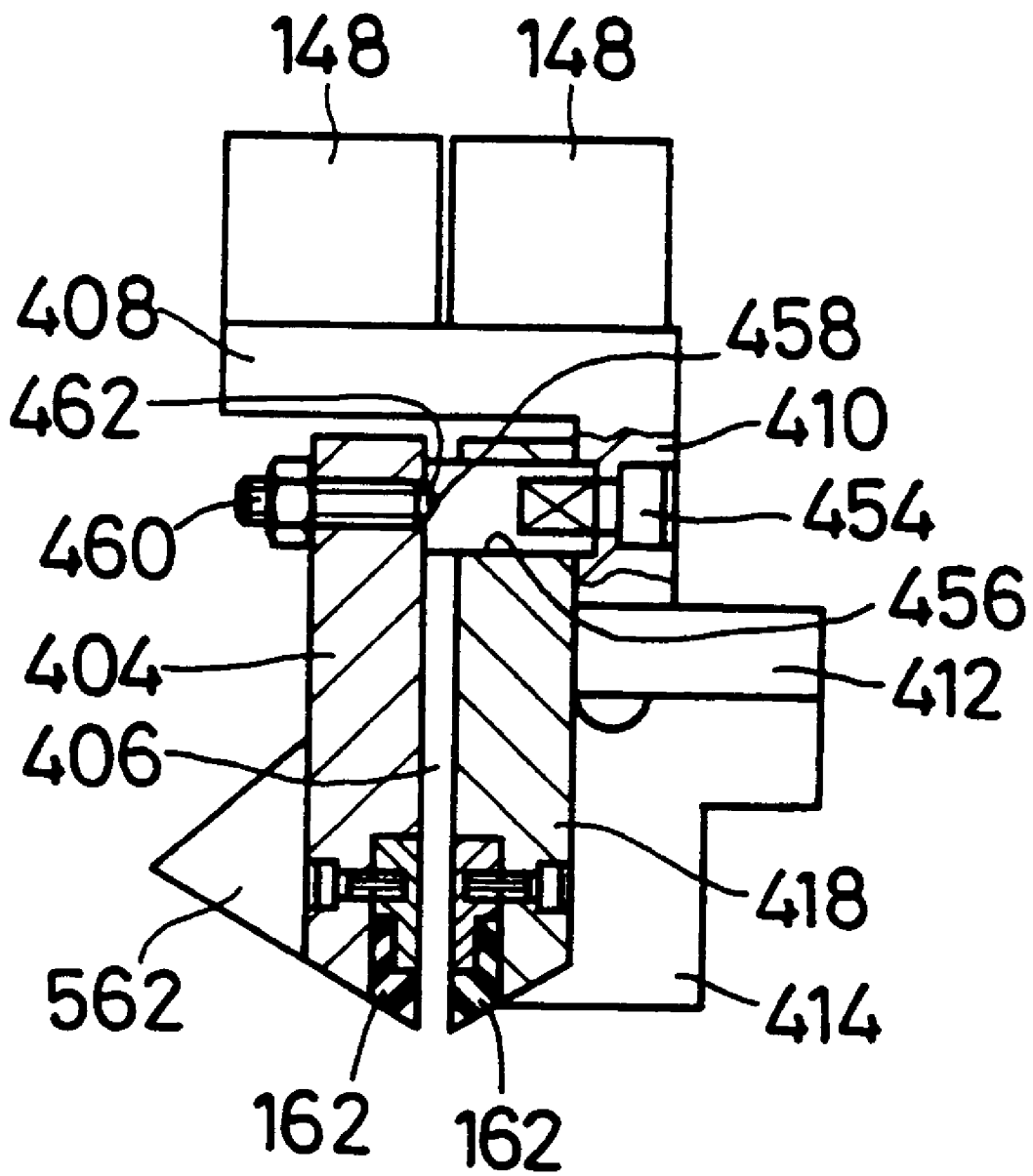
FIG. 9 is a transverse cross-section view of a positioning device which positions a first plate-like member relative to a second plate-like member which cooperates with the first member to provide a printing-material container of the printing device of FIG. 4.

As shown in FIG. 9, a pair of positioning pins 454 (only one 454 is shown in the figure) project from the attachment portion 410 such that the two pins 454 are spaced apart from each other in the widthwise direction of the screen 18. When the PM container 400 is attached to the attachment member 408, a pair of positioning holes 456 formed in the first plate-like member 418 are fit on the two positioning pins 454, respectively. The positioning pins 454 extend through the first member 418 and project into the PM chamber 406. A conical positioning recess 458 is formed in the end face of the projecting portion of each pin 454. A positioning member 460 is threadedly engaged with an internally threaded hole of the second plate-like member 404 and is fixed to the second member 404 with a lock nut, such that the positioning member 460 projects from the second member 460. A conical positioning projection 462 projects from an end face of a projecting portion of the positioning member 460 which projects from the side surface of the second member 404 which partially defines the PM chamber 406.

In a state in which the positioning holes 456 of the first member 418 are engaged with the positioning pins 454, the side surface of the second member 404 which partially defines the PM chamber 406 is held in abutting contact with the end faces of the positioning pins 454, so that the distance between the two members 418, 404 is defined as being slightly greater than the thickness of a thrust plate 230 (FIGS. 4 and 8) of a PM thrusting device 470 (FIGS. 6 and 7). In addition, the positioning projection 462 is engaged with the positioning recess 458, so that the second plate-like member 404 is positioned relative to the first plate-like member 418 with respect to all directions in a plane parallel to the first member 418.

The thrust plate 230 is a printing-material thrust member, and the PM thrusting device 470 is a thrust-member moving device, within the meaning of the claims.

The PM container 400 is attached to, and detached from, the attachment member 408, in a state in which the thrust plate 230 of the PM thrusting device 470 is sandwiched between the first and second members 418, 404. As shown in FIG. 6 and 7, the thrusting device 470 includes a thrusting air cylinder 222. The air cylinder 222 is attached to a support member 224 fixed to the rear surface of the attachment portion 410, such that the air cylinder 222 is oriented downward. A hold member 228 fixed to an end of a piston rod 226 of the air cylinder 222 holds the thrust plate 230.

As shown in FIG. 8, the hold member 228 has a U-shaped configuration and, as shown in FIG. 7, one of two arm portions of the holder member 228 extends toward the second member 404 and supports the thrust plate 230. The thrust plate 230 has such a dimension which ensures that the thrust plate 230 is just fit in the PM chamber 406 such that the plate 230 is movable relative to the first and second members 418, 404. A seal member formed of a resilient material, such as rubber or soft synthetic resin, is attached to the lower end of the thrust plate 230, for preventing the creamed solder as the PM from entering a small space between the plate 230 and the walls of the PM chamber 230 (i.e., first and second members 418, 404).

The thrust plate 230 has a dimension which ensures that even when the plate 230 is moved upward to its uppermost position by the thrusting air cylinder 222, the lower end of the plate 230 does not come out of the PM chamber 406. Accordingly, the PM container 400 is attached to the attachment member 408 by first fitting the thrust plate 230 in the PM chamber 406, subsequently engaging the plate 230 with the hold member 228, and then attaching the container 400 to the attachment member 408.

The thrusting air cylinder 222 is of a double-action type and has two air chambers. As shown in FIG. 7, each of the two air chambers of the air cylinder 222 is selectively placed, by the switching of a solenoid-operated directional control valve 472, in a first state in which each air chamber is communicated with the air source 124, a second state in which each chamber is communicated with the atmosphere, and a third state in which each chamber is not communicated with neither of the air source 124 and the atmosphere and the air pressure in each chamber is maintained. The air pressure of the upper one of the two chambers of the air cylinder 222 that thrusts down the thrust plate 230 is detected by a thrust pressure sensor 473. Based on the pressure detected by the pressure sensor 473, the control device 130 controls the switching of the directional control valve 472, so that the pressure of the upper air chamber of the air cylinder 222 is adjusted to a pressure value which ensures that the thrust plate 230 thrusts the creamed solder from the PM chamber 406 with a predetermined thrust force.

The thrust pressure sensor 473 is pressing-force-relating-amount measuring device within the meaning of the claims. The control device 130 is a moving-device-driving force control device within the meaning of the claims. The control device 130 is also a measured-value-dependent control device within the meaning of the claims.

As shown in FIG. 7, the upward movement of the thrust plate 230 to its uppermost position is detected by an upper-position detecting device 474 including a dog 476 attached to the upper surface of the hold member 228 and an upper-position sensor 478 which is attached to the support member 224 supporting the thrust air cylinder 222 and which detects the dog 476. The downward movement of the thrust plate 230 to its lowermost position is detected by a lower-position detecting device 480 including a dog 482 attached to the lower surface of the hold member 228 and a lower-position sensor 484 which is attached to the support member 412 supporting the side plates 414 and which detects the dog 482. The lowermost position of the thrust member 230 is pre-determined as being higher than the height of the PM outlet 180 by a small distance, e.g., 7.5 mm.

The second plate-like member 404 is rotated by a rotating device 490. In the present embodiment, the printing head 150 includes the PM container 400, the PM thrusting device 470, and the rotating device 490. As shown in FIG. 6, the rotating device 490 includes a rotating air cylinder 492. The air cylinder 492 is attached to a support member 494 fixed to the thrusting air cylinder 222 of the PM thrusting device 470, such that the air cylinder 492 is oriented downward. An engagement member 498 is fixed to the lower end of a piston rod 496 of the air cylinder 492, such that the member 498 extends parallel to the widthwise direction of the screen 18. An engagement groove 500 is formed in each of two end faces of the engagement member 498 which are opposite to each other in a lengthwise direction thereof.

A roller 504 which is rotatably attached to one end of a lever 502, is engaged with each of the two engagement grooves 500. As shown in FIG. 6, each of the two levers 502 is rotatably attached to the corresponding side plate 414 via an axis member 506. Respective one ends of the two levers 502 are connected to each other via an L-shaped connection plate 508, such that the two levers 502 are not movable relative to each other. As shown in FIG. 8, each of the rollers 504 is rotatably attached to a bracket 510 fixed to the connection plate 508, such that each roller 504 is engaged with the corresponding engagement groove 500.

One end of a first link 514 is connected via an axis member 516 to the other end of each of the two levers 502, such that the first link 514 is rotatable relative to the lever 502. The other end of each of the first links 514 is connected via an axis member 518 to a rotary plate 520 such that the first link 514 is rotatable relative to the rotary plate 520. Each of the rotary plates 520 is provided outside the corresponding side plate 414 such that a very small space is left between the two elements 520, 414.

An L-shaped second link 522 is connected via an axis member 524 to a middle portion of each of the first links 514 such that the second link 522 is rotatable relative to the first link 514. One end of each of the second links 522 is rotatably attached via an axis member 526 to the corresponding side plate 414. One end of a third link 528 is rotatably connected via an axis member 530 to the other end of the corresponding second link 522. The other end of each of the third links 528 is rotatably attached via an axis member 532 to the rotary plate 520. Therefore, when the piston rod 496 of the rotating air cylinder 492 is advanced and retracted, the engagement member 498 is moved upward and downward, and this movement is converted into respective rotary motions of the rotary plates 520 via the levers 502 and the first, second, and third links 514, 522, 528.

Figure 10:
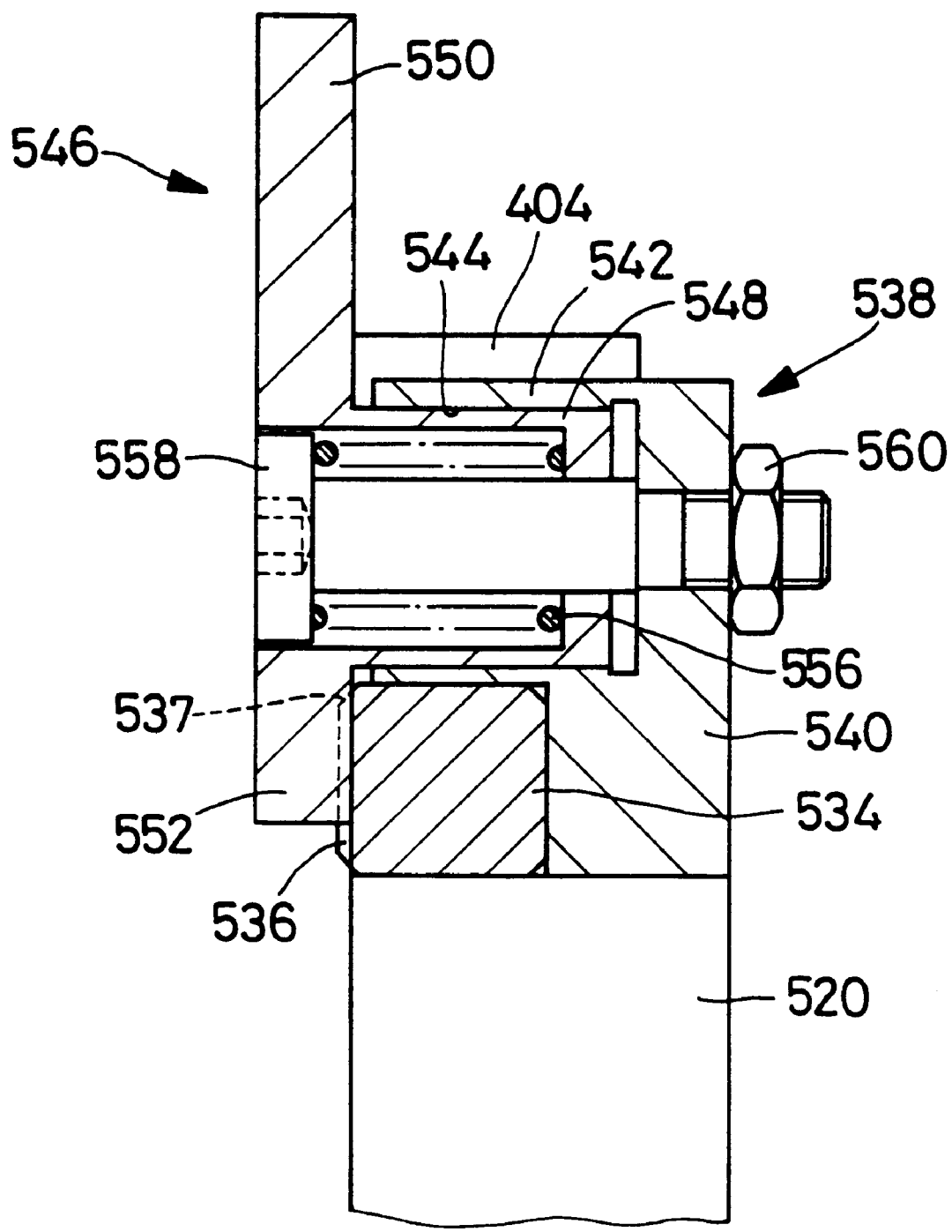
FIG. 10 is an enlarged view of a connection between the second plate-like member and a rotary plate of a rotating device.

As shown in FIG. 4, the upper surface of each of the rotary plates 520 is flush with that of the second plate-like member 404. As shown in FIGS. 4 and 6, a rectangular engagement block 534 is fixed to the upper surface of the second member 404. Each of the engagement blocks 534 extends over the corresponding side plate 414 and the corresponding rotary plate 520. As shown in FIGS. 4 and 10, a V-shaped engagement groove 536 is formed in a middle portion of a front surface of each of the engagement blocks 534. A cut surface 527 is provided in the upper end of the front surface of each block 534.

As shown in FIG. 10, an L-shaped support block 538 is fixed to the upper surface of each of the rotary plates 520. As shown in FIGS. 4 and 6, each of the support blocks 538 has a dimension which ensures that each block 538 extends over the corresponding side plate 414 and reaches the corresponding one end of the second plate-like member 404. One arm portion 540 of each block 538 is held in contact with the rear surface of the corresponding engagement block 534, and the other arm portion 542 thereof extends upward from the same 534. Thus, each of the engagement blocks 534 is fit in a rectangular space defined by the upper surface of the corresponding rotary plate 520 and the two arm portions 540, 542 of the corresponding support block 538. Each of the support blocks 538 has a support hole 544 with a bottom in which a cylindrical spring seat 548 of an engaging lever 546 is fit.

As shown in FIG. 4, each of the engaging levers 546 includes a bar-like operative portion 550 and a bar-like engagement portion 552 which project radially outward from diametrically opposite two portions of the spring seat 548 with a bottom wall, respectively. A coil spring 556 as a sort of an elastic biasing member is provided in the spring seat 548 fit in the support hole 544 of each support block 538. A screw member 558 extends through two holes which are respectively formed through the respective bottom walls of the spring seat 548 and the support hole 544. With a nut 560, the screw member 558 is fixed to those bottom walls.

Therefore, each of the engaging levers 546 is biased by the corresponding coil spring 556, so that with the biasing force the engagement portion 552 is engaged with the V-shaped groove 536 of the corresponding engagement block 534. The engagement portion 552 has a projection which has a V-shaped cross section and is engageable with the V-shaped groove 536. This projection cooperates with the cut surface 537 to help the engagement portion 552 engage the engagement block 534 when the engaging lever 546 is manually rotated by an operator. When the lever 546 is rotated, the engagement or disengagement of the engagement portion 552 with or from the engagement block 534 is guided by the respective inclined surfaces of the V-shaped projection and the cut surface 537.

As shown in FIG. 4, the engagement portion 552 of each of the engaging levers 546 is engaged with the engagement groove 536 of the corresponding engagement block 534. Accordingly, this engagement is maintained with stability. Each of the engagement blocks 534 is received in the rectangular space defined by the corresponding rotary plate 520 and support block 538, and is sandwiched between the front, engagement portion 552 of the engaging lever 546 and the rear, arm portion 540 of the support block 538. Thus, each engagement block 538 is securely engaged with the rotary plate 520, so that the engagement block 534 or the second plate-like member 404 and the rotary plate 520 are rotatable as a unit. This engagement is released by rotating the engaging lever 546 against the biasing force of the coil spring 556, from its engaged position shown in FIG. 4 to its released position which is away from the engaged position over 90 degrees.

As shown in FIG. 6, each of the -side plates 414 includes a closure portion 562 which closes an opening provided between the corresponding closure plate 420 and the second plate-like member 404 when the second member 404 is rotated with the rotary plates 520.

When the PM container 400 provided by engaging the first and second plate-like members 418, 404 with each other using the two engaging devices 430, is attached to the attachment member 408 as described above, first, the engaging levers 546 are rotated to their released positions, subsequently the first member 418 is engaged with the positioning pins 454, and then the levers 546 are rotated to their engaged positions, so that the engagement portions 552 are engaged with the engagement blocks 534 of the second member 404, respectively. Thereafter, the levers 438 of the engaging devices 430 are operated to attach the first member 418 to the attachment member 408 and simultaneously disengage the second member 404 from the first member 418. Thus, the second plate 404 is made rotatable with the rotary plates 520 relative to the first member 418.

Figure 11:
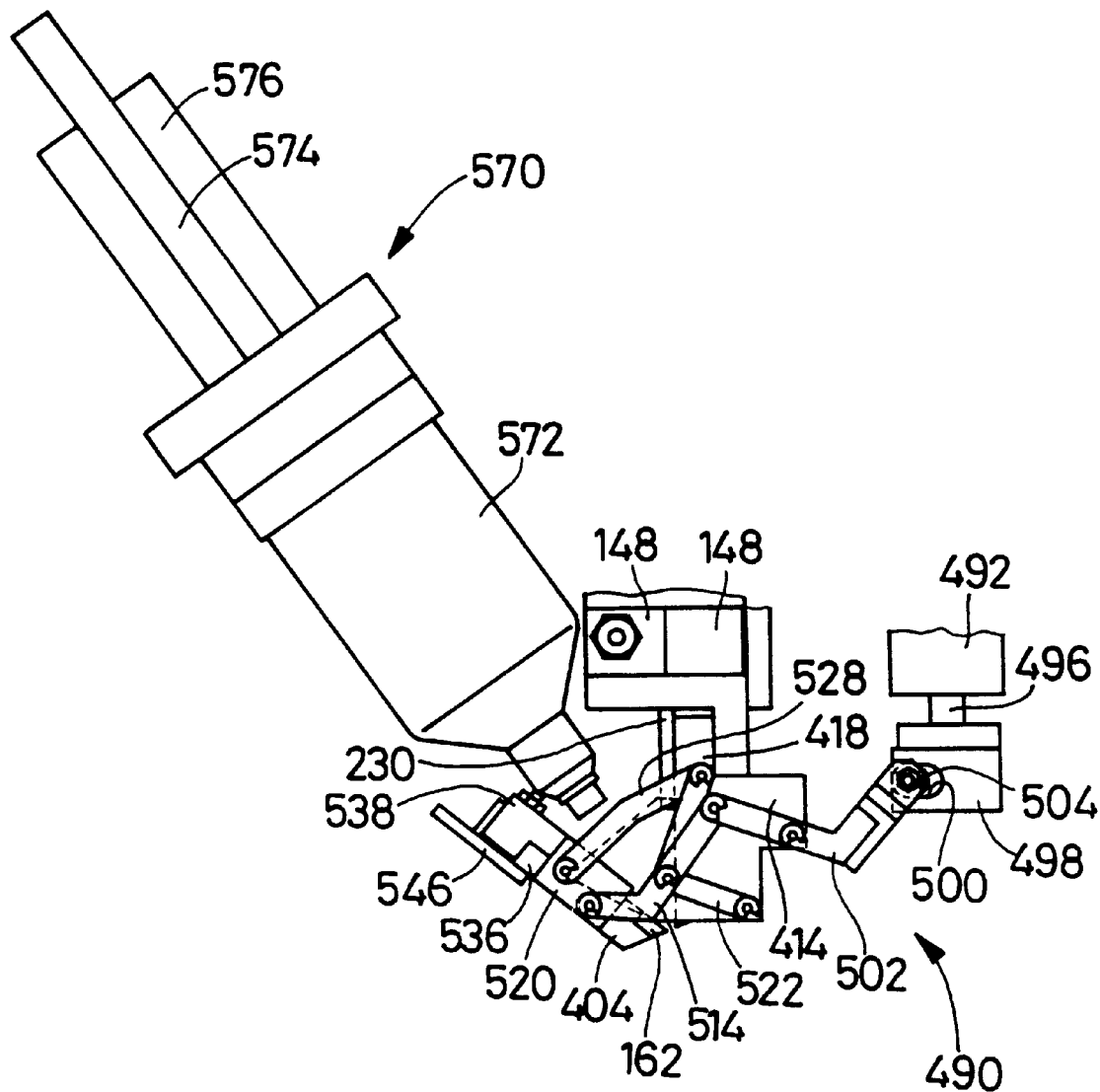
FIG. 11 is a view for illustrating the operation of the printing device of FIG. 4 for supplying a printing material ("PM") to the PM container.

A PM supplying device 570, shown in FIG. 11, is provided at a PM supplying position located at one of opposite extreme ends of movement of the printing device 22. The supplying device 570 includes a PM supplying member 572 in which the creamed solder is accommodated. The supplying device 570 also has a pair of air cylinders 574 and an agitating motor 576. When the air cylinders 574 are operated to move their pistons downward and the agitating motor 576 is rotated in a positive direction, the creamed solder is supplied; and when the motor 576 is rotated in a negative or reverse direction, the solder is not supplied but is agitated to keep an appropriate degree of viscosity. The PM supplying member 572 is moved by an elevating device (not shown) to its uppermost position where a PM supply outlet thereof is distant away from the PM chamber 406 and to its lowermost position, shown in FIG. 11, located inside the PM chamber 406. At the lowermost position, the supplying device 570 is moved by a moving device (not shown) along the PM chamber 406 while supplying the creamed solder into the PM chamber 406.

The air cylinders 574 together comprise a printing-material moving device within the meaning of the claims.

Next, the screen cleaning device 24 will be described.

Figure 12:
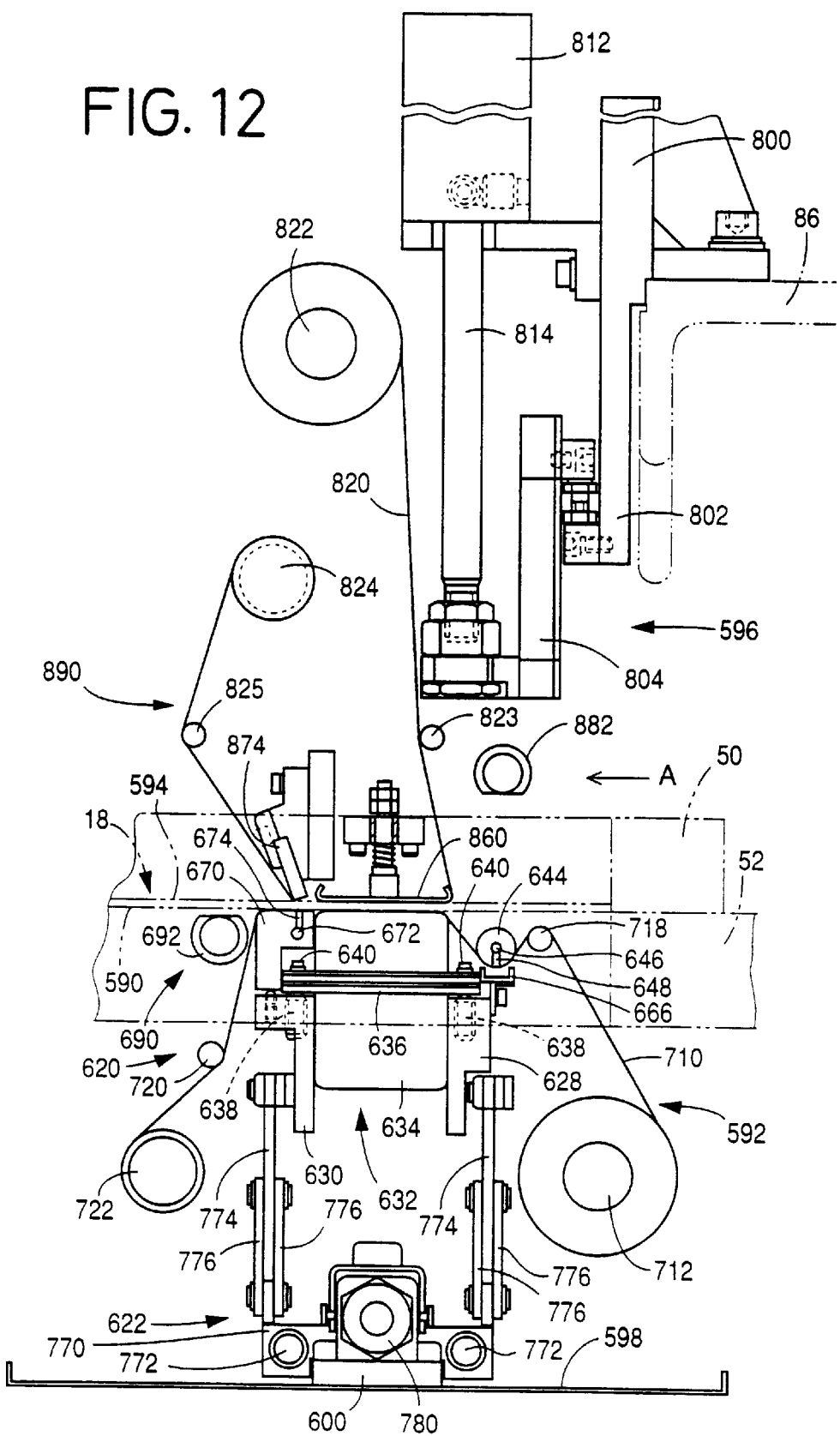
FIG. 12 is a side view of the screen cleaning device of FIG. 1.

As shown in FIGS. 1 and 12, the screen cleaning device 24 includes a washing device 592 and a wiping device 596. The washing device 592 includes a washing head 620 which is provided on the side of a lower surface 590 of the screen 18 where the PCB 12 contacts the lower surface 590 in a manner described later. The wiping device 596 includes a wiping head 890 which is provided on the side of an upper surface 594 of the screen 18 where the creamed solder is forced or squeezed into the through-holes of the screen 18.

Figure 13:
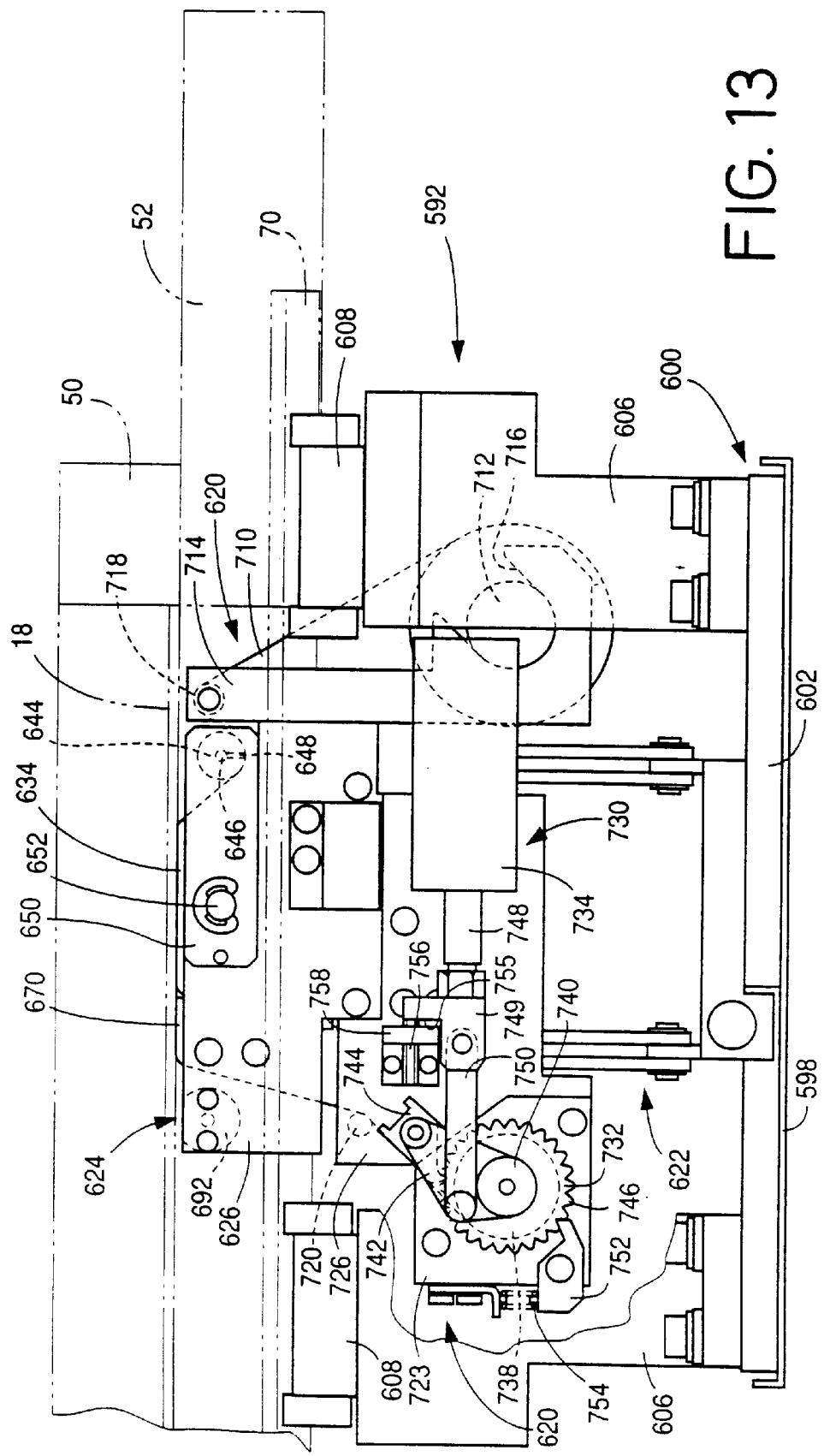
FIG. 13 is a side view of a portion of a washing device of the screen cleaning device of FIG. 12.
Figure 16:
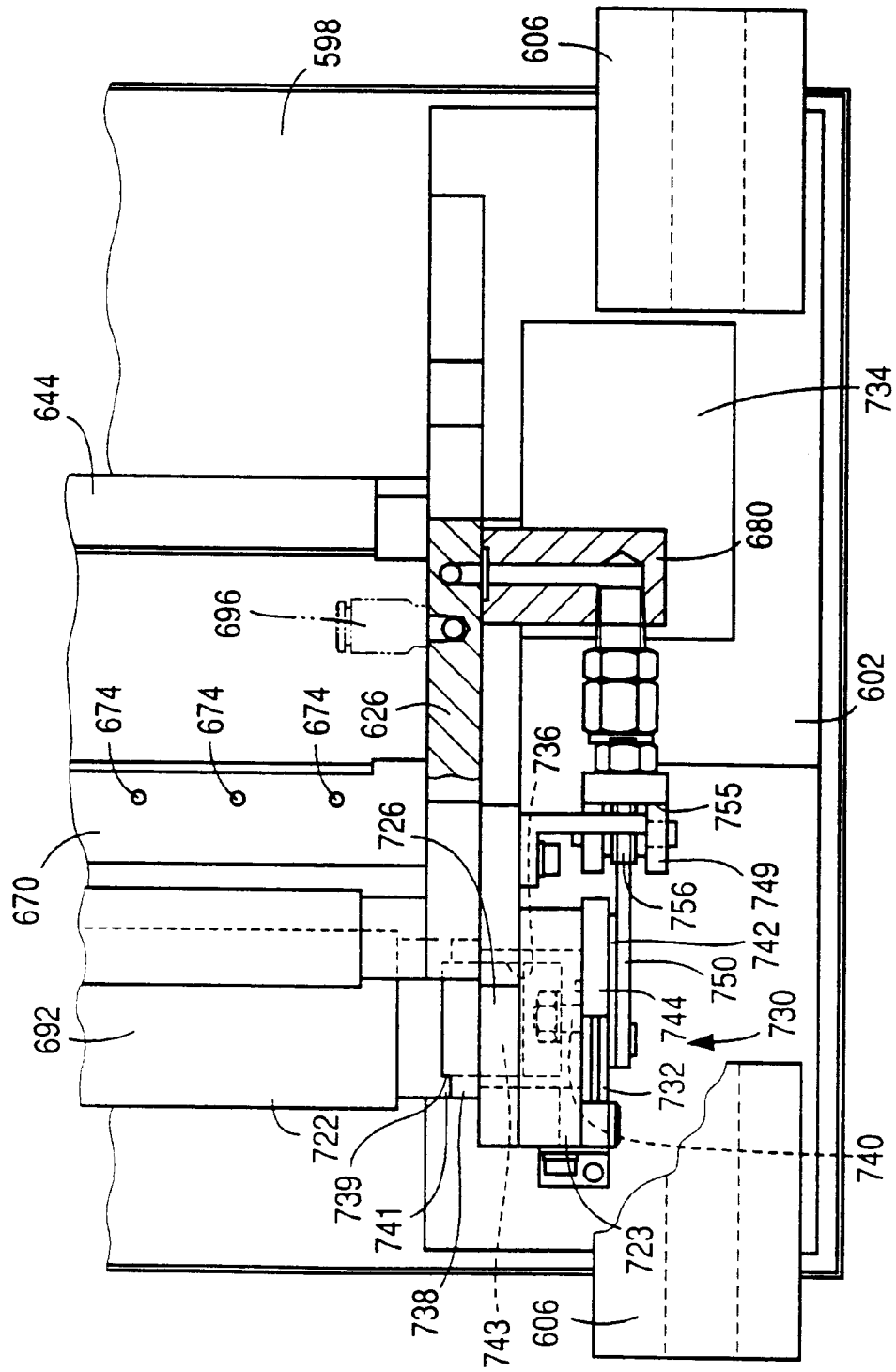
FIG. 16 is a plan view of the CS feeding device of FIG. 15.
Figure 18:
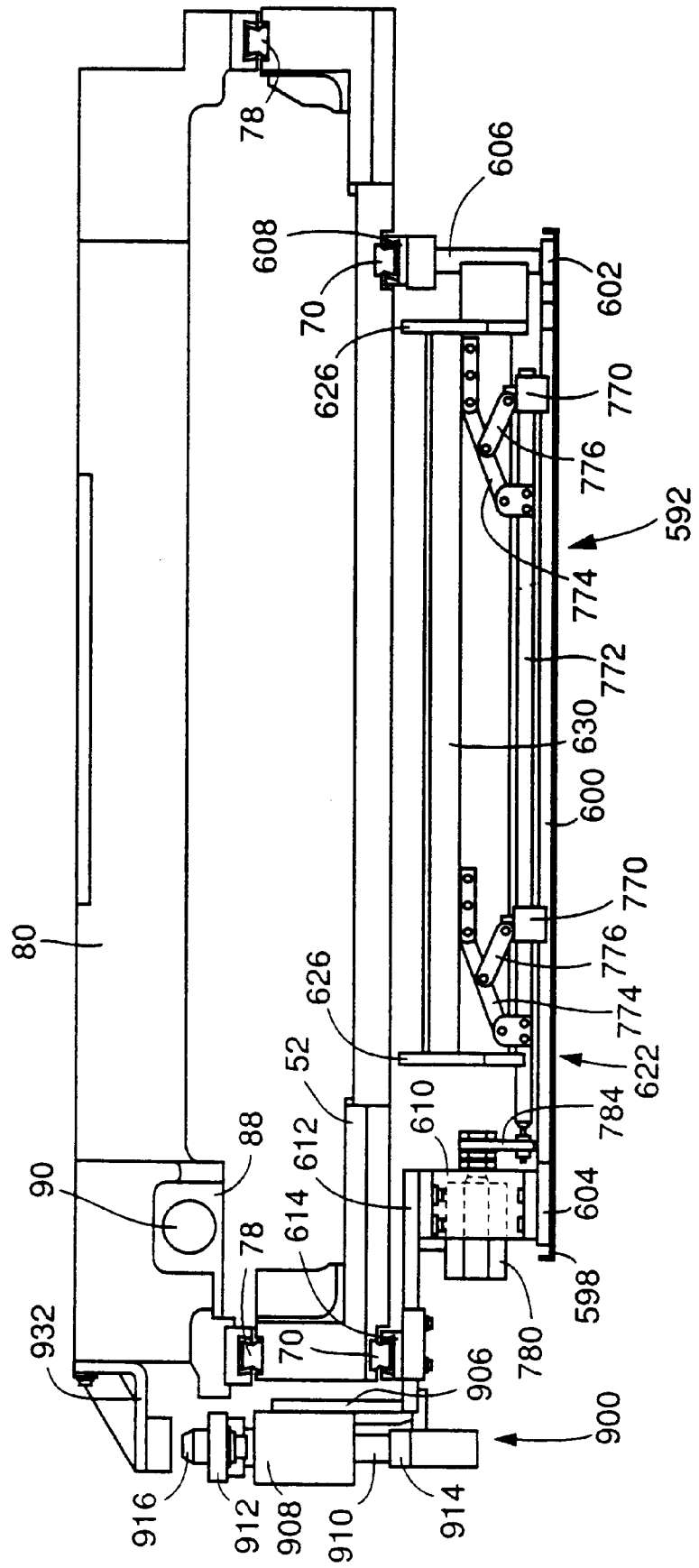
FIG. 18 is a side view of the washing device of FIG. 13, additionally showing a screen support table which supports a screen.

As shown in FIG. 13, the washing device 592 includes a palette 598 which is a shallow-container-like configuration and is elongate in the widthwise direction of the screen 18. In FIG. 13, the side walls or plates of the palette 598 are omitted. The palette 598 opens upward, and a plate-like base table 600 is fixed to the upper surface of the bottom wall of the palette 598. The base table 600 is elongate in the lengthwise direction of the palette 598. As shown in FIG. 18, the base table 600 includes two support portions 602, 604 corresponding to two end portions thereof which are opposite to each other in the lengthwise direction thereof. The support portions 602, 604 are elongate in the printing direction of the printing device 22. As shown in FIGS. 13 and 16, two columns 606 are provided at two opposite end portions of one 602 of the support portions 602, 604, respectively. A guide block 608 is fixed to the upper surface of each of the columns 606. The guide blocks 608 are engaged with one of the guide rails 70 fixed to the screen support table 52, such that the guide blocks 608 are movable relative to the guide rail 70.

As shown in FIG. 18, a support member 610 is provided on the other support portion 604 of the base table 600. A bracket 612 is fixed to the upper surface of the support member 610. Two guide blocks 614 are fixed to two portions of the bracket 612 which are distant from each other in the printing direction. The two guide blocks 614 are engaged with the other guide rail 70 such that the guide blocks 614 are movable relative to the guide rail 70. Thus, the palette 598 is supported below the screen support table 52 via the four guide blocks 608, 614 such that the palette 598 is movable in the printing direction.

The washing head 620 is attached via an elevator device 622 to the base table 600. As shown in FIGS. 12, 13, and 18, a head frame 624 of the washing head 620 includes a pair of side plates 626 (FIG. 18) and a pair of support members 628, 630 (FIGS. 12 and 18). The two side plates 626 are provided at two positions distant from each other in the widthwise direction of the screen 18, and extend parallel to the printing direction. The two support members 628, 630 are elongate and are fixed between the two side plates 626.

As shown in FIG. 12, an ultrasonic vibrator 632 is provided between, and fixed to, the two support members 628, 630. The ultrasonic vibrator 632 includes a casing 634 and six ultrasonic-vibration heads accommodated in the casing 634. An attachment portion 636 projects from the casing 634 and is positioned with respect to a vertical direction by two positioning pins 638 which are provided in the support members 628, 630, respectively. As shown in FIG. 13, the upper surface of the casing 634 projects upward by a small length over the upper ends of the side plates 626.

The attachment portion 636 is fixed to the support members 628, 630 with bolts 640 (FIG. 12).

Each of the six ultrasonic-vibration heads includes a magnetostrictive vibrator, a corn, and a horn. The horn has a rectangular transverse cross section and tapers into an end like a wedge. The upper surface of the horn of each ultrasonic-vibration head is fixed to the top wall of the casing 634. When the upper surfaces of the horns of the heads vibrate at an ultrasonic frequency, the casing 634 is vibrated at the ultrasonic frequency.

Figure 14:
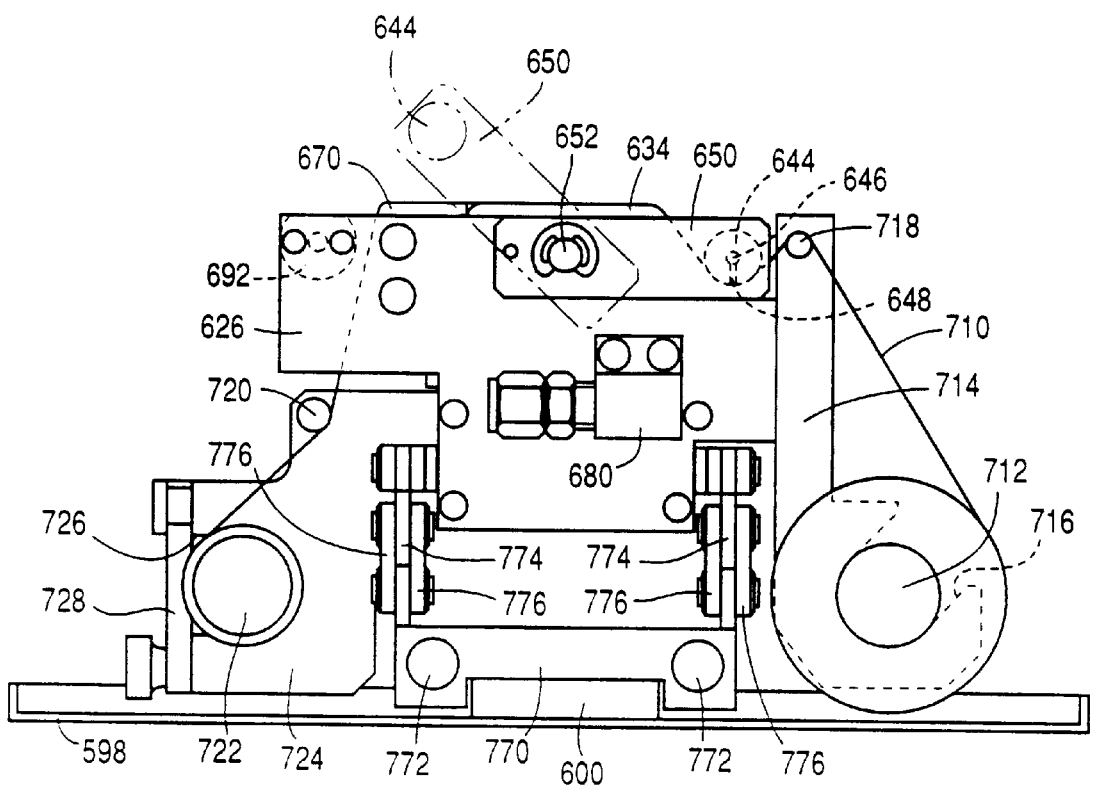
FIG. 14 is a side view of another portion of the washing device of FIG. 13.
Figure 17:
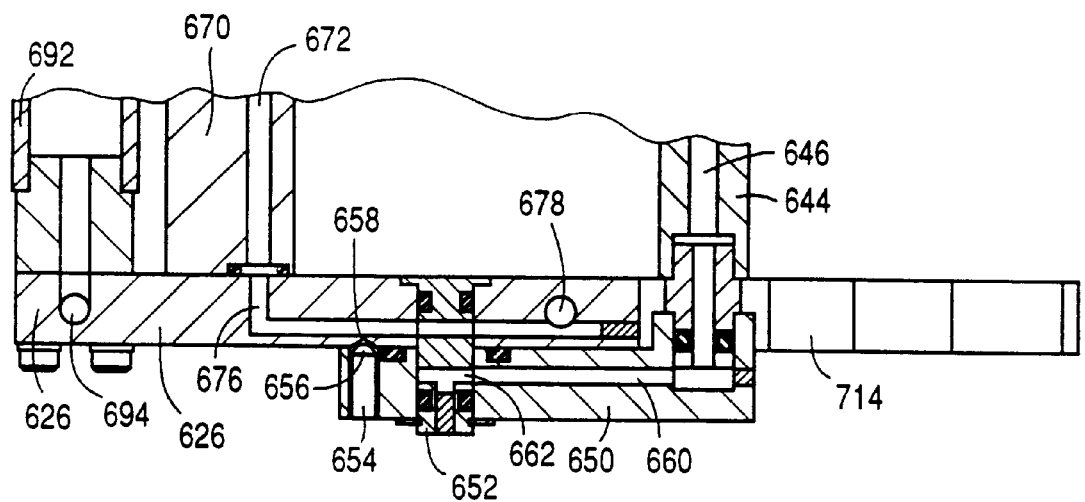
FIG. 17 is a plan cross-section view of the washing device of FIG. 13, showing a washing-agent supplying passage and an air supplying passage.

A movable washing-agent ("WA") supplying member 644 is provided on an upstream side of the ultrasonic vibrator 632 in a direction, indicated at arrow A in FIG. 12, in which the washing head 592 is moved to clean the screen 18. The WA supplying member 644 has a cylindrical shape and, as shown in FIGS. 13 and 17, a washing-agent supplying passage 646 and a plurality of supplying outlets 648 are formed in the supplying member 644. The supplying passage 646 extends in a lengthwise direction of the supplying member 644. The supplying outlets 648 are provided at a regular interval of distance, communicate with the supplying passage 646, and open in the outer surface of the supplying member 644. As shown in FIG. 14, a rotatable arm 650 is fixed via an axis member 652 to the outer surface of each of the two side plates 626 such that the arm 650 is rotatable about an axis line parallel to the widthwise direction of the screen 18. Two opposite end portions of the supplying member 644 are attached to respective free end portions of the arms 650. Thus, the WA supplying member 644 extends in the widthwise direction of the screen 18.

When the rotatable arms 650 are rotated, the WA supplying member 644 is moved to an operative position thereof, indicated at solid line in FIG. 14, where the supplying member 644 is located under the upper surface of the casing 634 of the ultrasonic vibrator 632 and the supplying outlets are directed downward to supply a WA (washing agent), and to a retracted position thereof where the supplying member 644 is located above the upper surface of the casing 634 and does not supply the WA. As shown in FIG. 17, a ball plunger 654 is provided in the other end portion of each of the arms 650 which is opposite to the one end portion thereof to which the supplying member 644 is attached. The ball plunger 654 includes a ball 656 which is received in an externally threaded, cylindrical casing with a bottom wall such that the ball 656 is prevented from coming off the casing. The ball 656 is biased by a spring in a direction in which the ball 656 projects from the casing. The casing of each of the plungers 654 is threadedly engaged with an internally threaded hole formed in a corresponding one of the arms 650. The WA supplying member 644 is held at the operative position with the balls 656 being engaged with respective notches 658 formed in the two side plates 626.

As shown in FIG. 17, each arm 650 has a liquid passage 660 which communicates with the WA supplying passage 646 and which also communicates with a liquid passage 662 formed in the corresponding axis member 652. The liquid passage 662 is connected to a WA supplying source (not shown) provided for the supplying member 644. A solenoid-operated switch valve 664 (FIG. 23) is provided between the liquid passage 662 and the WA supplying source. The supplying source supplies the WA to the liquid passage 662, and stops the supplying of the WA agent to the liquid passage 662, when the solenoid valve 664 is opened and closed, respectively.

As shown in FIG. 12, a palette 666 is provided below the WA supplying member 644. The palette 666 extends parallel to the supplying member 644 and collects the WA dropping downward from the supplying member 644.

A fixed WA supplying member 670 is provided on a downstream side of the ultrasonic vibrator 632 in the direction "A". The fixed supplying member 670 is elongate as shown in FIG. 17. As shown in FIG. 12, the supplying member 670 is provided on the support member 630 such that the WA supplying member 670 extends parallel to the widthwise direction of the screen 18 and the upper surface thereof is flush with that of the casing 634 of the ultrasonic vibrator 632. Two opposite end portions of the supplying member 670 are fixed to the two side plates 626, respectively. A WA supplying passage 672 and a plurality of supplying outlets 674 are formed in the supplying member 670. The supplying passage 672 extends in a lengthwise direction of the supplying member 670. The supplying outlets 674 are provided at a regular interval of distance, communicate with the supplying passage 672, and open in the upper surface of the supplying member 670.

As shown in FIG. 17, the supplying passage 672 is connected to another WA supplying source (not shown) employed for the fixed WA supplying member 670 via liquid passages 676, 678 formed in each of the side plates 626, a coupling member 680 (FIGS. 14 and 16) fixed to each side plate 626, and a hose (not shown). A solenoid-operated switch valve 684 (FIG. 23) is provided between the liquid passage 672 and the supplying source. The WA supplying source supplies the WA to the liquid passage 672, and stops the supplying of the WA to the liquid passage 672, when the solenoid valve 684 is opened and closed, respectively.

As shown in FIG. 12, an air jetting member 692 of a lower-surface drying device 690 is provided, between the two side plates 626, on the downstream side of the fixed WA supplying member 670 in the direction "A". The air jetting member 692 has a cylindrical shape, and two opposite end portions thereof are connected to the two side plates 626, respectively. As shown in FIG. 17, the air jetting member 692 is connected to an air supplying source (not shown) via an air passage 694 formed in each of the side plates 626, a coupling member 696 (FIG. 15) attached to the inner surface of each side plate 626, etc. A solenoid-operated switch valve 698 (FIG. 23) is provided between the air jetting member 692 and the air supplying source. The supplying source supplies the air to the jetting member 692, and stops the supplying of the air to the jetting member 692, when the solenoid valve 698 is opened and closed, respectively. The jetting member 692 has a linear slit formed through the thickness thereof. When the air is supplied to the jetting member 692, the air jets from the linear slit of the jetting member 692.

As shown in FIG. 12, a cleaning sheet ("CS") 710 is provided on the ultrasonic vibrator 632 and the fixed WA supplying member 670. The CS 710 is a web which has substantially the same width as that of the screen 18 and which is formed of a porous and hygroscopic paper. The CS 710 is wound around an axis member 712. Two support members 714 (only one 714 is shown in FIG. 14) which support the axis member 712 are fixed to the two side plates 626, respectively. The two support members 714 have respective recesses 716 which support two opposite end portions of the axis member 712 such that the axis member 712 is rotatable about an axis line parallel to the widthwise direction of the screen 18, perpendicular to a direction in which the CS 710 and the screen 18 are moved relative to each other, and parallel to the opposite surfaces of the screen 18. The axis member 712 is easily attached to, or detached from, the support members 714, by engaging or disengaging the opposite end portions of the former 712 with or from the recesses 716, respectively.

Figure 15:
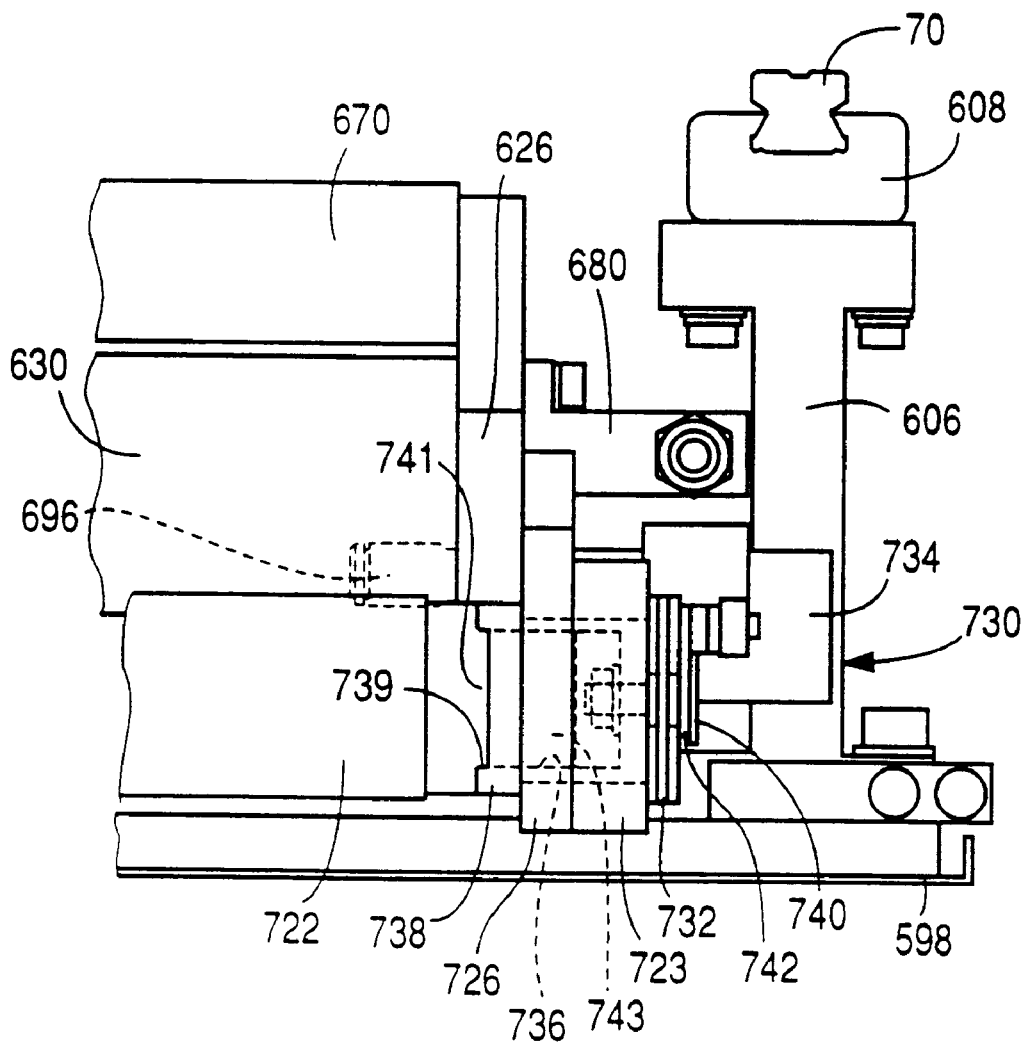
FIG. 15 is a side view of a cleaning-sheet ("CS") feeding device of the washing device of FIG. 13.

As shown in FIG. 14, the CS 710 which is drawn from the axis member 712 is first engaged with an upper portion of a guide roller 718 which is rotatably attached to the support members 714. Subsequently, the CS 710 is engaged with a lower portion of the movable WA supplying member 644, and further engaged with respective upper surfaces of the ultrasonic vibrator 632 and the fixed WA supplying member 670. Then, the CS 710 is passed between the fixed supplying member 670 and the air jetting member 692, is guided by a guide roller 720, and is taken up by a taking-up axis member 722. As shown in FIG. 15, one of opposite end portions of the axis member 722 is supported by support plates 723, 726 fixed to one of the two side plates 626, and the other end portion of the same 722 is supported by a support member 724 fixed to the other side plate 626, such that the axis member 722 is rotatable about an axis line parallel to the axis line of rotation of the axis member 712.

The support member 724 has a recess 726 with which the other end portion of the axis member 722 is engaged such that the axis member 722 is rotatable. A stopper plate 728 prevents the axis member 722 from coming out of the recess 726. The manner in which the one end portion of the axis member 722 is supported by the support plates 723, 726 will be described later. The guide roller 720 is rotatably supported by the support member 724 and the support plate 726. As shown in FIG. 14, the two support members 714, 724 support respective one end portions of the two axis members 712, 722 which are opposite to the other end portions thereof nearer to a CS feeding device 730 which will be described below.

When the CS 710 is set between the two axis members 712, 722, the movable WA supplying member 644 is moved to its retracted position. After the setting of the CS 710, the WA supplying member 644 is moved to its operative position. Consequently the CS 710 is pressed, by the WA supplying member 644, on the upper surfaces of the ultrasonic vibrator 632 and the fixed WA supplying member 670. While the movable WA supplying member 644 is located at its retracted position, the CS 710 can be released from the axis members 712, 722.

As shown in FIG. 13, the CS feeding device 730 which feeds the CS 710 is attached to the outer surface of the support plate 723. Thus, the washing head 620 is provided by the head frame 624, and the axis members 712, 722, ultrasonic vibrator 632, movable and fixed WA supplying members 644, 670, air jetting member 692, and CS feeding device 730 all of which are supported by the head frame 624.

The CS feeding device 730 includes a ratchet wheel 732, and a CS feeding air cylinder 734 which intermittently rotates the ratchet wheel 732 by a predetermined feeding pitch and thereby feeds the CS 710. As shown in FIG. 15, the support plates 723, 726 supports a stepped rotatable body 738 which has a circular cross section and which is rotatable about an axis line parallel to the widthwise direction of the screen 18. The stepped rotatable body 738 has a hole 738 which has a bottom wall and which opens in an end surface of a large-diameter portion of the stepped body 738. A shallow and wide groove 739 is formed, diametrically in the end surface of the large-diameter portion, adjacent to the opening of the hole 738. One end portion of the axis member 722 includes a projection 741 which has an oval cross section and has a length equal to the diameter of the large-diameter portion of the rotatable body 738. A small-diameter projection 743 projects from an end surface of the projection 741. The small-diameter projection 743 of the axis member 722 is engaged with the hole 736 of the rotatable body 738, and the projection 741 is engaged with the groove 739. Thus, the rotatably body 730 and the axis member 722 are prevented from being rotated relative to each other, and the rotation of the body 738 is transmitted to the axis member 722.

An axis member 740 is fixed to a bottom wall of the rotatable member 738 such that the axis member 740 is concentric with the member 738 and is not rotatable relative to the same 738. The ratchet wheel 732 is fixedly connected to a projecting portion of the axis member 740 which projects from the bottom wall of the rotatable member 738. A rotary plate 742 is connected to the projecting portion of the axis member 740 such that the plate 742 is sandwiched between the ratchet wheel 732 and a head portion of the axis member 740 and such that the plate 742 is rotatable relative to the axis member 740. A ratchet pawl 744 is rotatably attached to the rotary plate 742, and is biased by a spring (not shown) in a direction to engage teeth 746 of the ratchet wheel 732.

As shown in FIGS. 13 and 16, one end portion of a link 750 is connected via a coupling member 749 to a piston rod 748 of the CS feeding air cylinder 734, such that the link 750 is rotatable relative to the coupling member 749. The other end portion of the link 750 is rotatably connected to the rotary plate 742. When the piston rod 748 is advanced from, and retracted into, the air cylinder 734, the rotary plate 742 is rotated in a forward and a backward direction thereof, respectively. Reference numeral 752 designates a stopper lever which inhibits the rotation of the ratchet wheel 732 in the backward direction opposite to the forward direction, i.e., CS-feeding direction to feed the CS 710. The stopper lever 752 is biased by a spring 754 in a direction to engage the teeth 746 of the ratchet wheel 732.

When the piston rod 748 of the air cylinder 734 is advanced and the rotary plate 742 is rotated in a forward direction thereof, the ratchet pawl 744 is moved while being engaged with the teeth 746 of the ratchet wheel 732, so that the ratchet wheel 732 is rotated in the forward direction. Thus, the rotatable member 738 is rotated and the axis member 722 is rotated, so that the CS 710 is fed forward and taken up by the axis member 722.

The advancing movement of the piston rod 748 is stopped when a stopper face 755 of the coupling member 749 abuts on a stopper member 756 provided on the outer surface of the support plate 726. Therefore, the position of the stopper member 756 defines the pitch of feeding of the CS 710, i.e. length of the CS 710 fed by one-time advancing movement of the piston rod 748. The stopper member 756 is threadedly engaged with a bracket 758 fixed to the outer surface of the support plate 726. Accordingly, the CS feeding pitch can be adjusted by changing the amount of engagement of the stopper 756 and the bracket 758.

When the piston rod 748 is retracted and the rotary plate 742 is rotated in the reverse direction, the ratchet pawl 744 moves over some of the teeth 746 of the ratchet wheel 732. Since the rotation of the wheel 732 in the backward direction is inhibited by the stopper lever 752, only the pawl 744 moves. Thus, the axis member 722 is prevented from being rotated in a backward direction thereof, and the CS 710 is prevented from being rewound from the axis member 722.

As shown in FIG. 18, the elevating device 622 includes four groups of links (only two groups are shown in the figure). Two support members 770 are fixed to two portions of the base table 600, respectively, which are distant from each other in the widthwise direction of the screen 18. As shown in FIG. 14, two rods 772 extend through respective holes formed in two end portions of each of the support members 770 which are opposite to each other in a direction parallel to the printing direction, such that the support members 770 are movable relative to the rods 772 in an axial direction of the same 772. Thus, the rods 772 extend parallel to the widthwise direction of the screen 18. As shown in FIG. 18, one end of each of four first links 774 are rotatably connected to the two rods 772 such that two of the four links 774 are connected to two portions of each of the rods 772 which are distant from each other in a lengthwise direction thereof. As shown in FIG. 12, the other end portion of each of the two links 774 connected to one of the two rods 772 are rotatably connected to the support member 628, and the other end portion of each of the two links 774 connected to the other rod 772 are rotatably connected to the support member 630. As shown in FIG. 18, one end portion of a second link 776 is rotatably connected to an intermediate portion of each of the four first links 774, and the other end portion of each of the four second links 776 is rotatably connected to a corresponding one of the two end portions of a corresponding one of the two support members 770.

As shown in FIG. 18, a washing-head elevating air cylinder 780 is supported by the support member 610 provided on one of two end portions of the base table 600 which are opposite to each other in a lengthwise direction thereof. The two rods 772 are connected via a connection plate 784 to a piston rod of the air cylinder 780. When the piston rod is advanced by the air cylinder 780, the rods 772 are moved and the four groups of first and second links 774, 776 are operated, so that the washing head 620 is moved vertically upward. Thus, a cleaning portion of the CS 710 contacts the lower surface 590 of the screen 18, and the ultrasonic vibrator 630 and the fixed washing-agent supplying member 590 indirectly contact the lower surface 590 via the cleaning portion of the CS 710. On the other hand, when the piston rod of the air cylinder 780 is retracted, the rods 772 are moved in the reverse direction and the four groups of first and second links 774, 776 are returned to their initial positions. Thus, the washing head 620 is moved downward. In other words, the elevating device 622 provides a device which moves the CS 710, the vibrator 630, and the supplying member 670, toward the lower surface 590 of the screen 18, and moves those members 710, 630, 670 away from the same 18.

Next, there will be described the wiping device 596.

Figure 19:
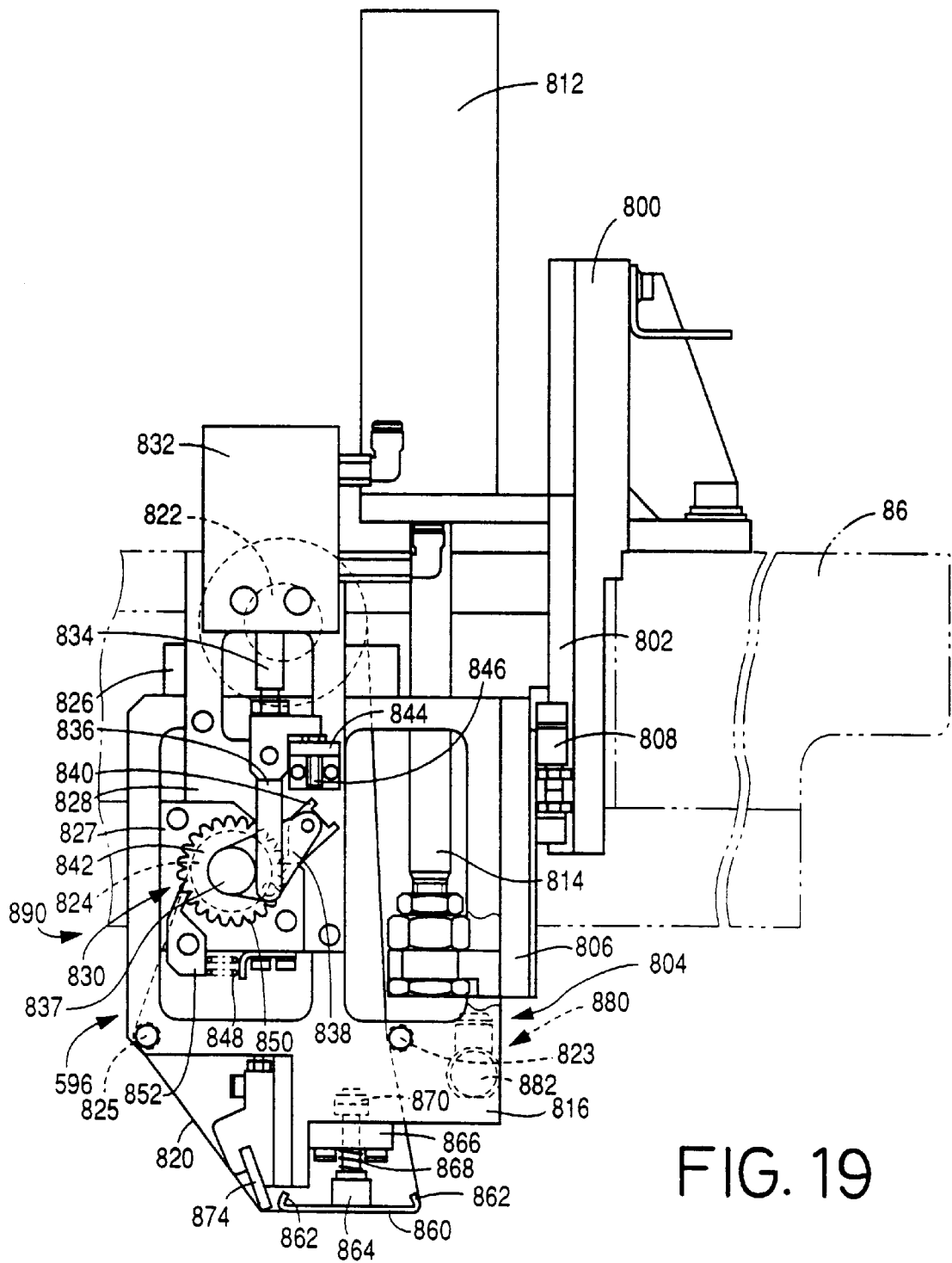
FIG. 19 is a side view of a wiping device of the screen cleaning device of FIG. 1.

As shown in FIG. 19, a support plate 800 is fixed to the connection portion 86 of the slide 80 of the printing device 22, such that the support plate 800 extends vertically. Two guide rails 802 are provided at two locations on the support plate 800 which are distant from each other in the widthwise direction of the screen 18. The guide rails 802 extend vertically. An elevator member 804 is engaged with the guide rails 802 such that the elevator member 804 is movable upward and downward. The elevator member 804 has a generally U-shaped cross section including two arm portions and a connection portion 806 connecting the two arm portions. Two guide blocks 808 (only one 808 is shown in FIG. 19) fixed to the connection portion 806 of the elevator member 804 are engaged with the two guide rails 802, respectively, such that the elevator member 804 is movable relative to the support plate 800.

A wiping-head elevating air cylinder 812 is attached to the support plate 800 such that the air cylinder 812 is oriented downward, and a piston rod 814 of the air cylinder 812 is connected to the elevator member 804. When the piston rod 814 is advanced and retracted, the elevator member 804 is moved downward and upward, respectively, by being guided by the guide rails 802. A wiping sheet ("WS") 820 is supported on the elevator member 804. The WS 820 is a web having substantially the same width as that of the screen 18, and is formed of a porous and highly hygroscopic paper. The WS 820 is wound around, and supplied from, a supplying axis member 822, is guided by guide rollers 823, 825, and is taken up by a taking-up axis member 824.

The axis member 822 is supported by a pair of support members 826 (only one 826 is shown in FIG. 19) fixed to the elevator member 804, such that the axis member 822 is rotatable about an axis line which is perpendicular to the printing direction, is perpendicular to the direction of movement of the WS 820 relative to the screen 18, and is parallel to the opposite surfaces of the screen 18 and such that the axis member 822 is detachable from the support members 826. One end portion of the axis member 824 is supported by a support member (not shown) fixed to the elevator member 804, such that the axis member 824 is rotatable relative to the elevator member 804 and detachable from the same 804, and the other end portion of the axis member 824 is, like the axis member 722 of the CS feeding device 730, fixed to a rotatable member (not shown) which is rotatably supported by support plates 827, 828 fixed to the elevator member 804. Thus, the axis member 824 is rotatable about an axis line parallel to that of the axis member 822.

The WS 820 is fed by a WS feeding device 830 having a construction similar to that of the CS feeding device 730. When a piston rod 834 of a WS feeding air cylinder 832 attached to the support plate 828 is advanced, a link 836 is moved downward, and a rotary plate 838 which is rotatably attached to an axis member 837 is rotated in a forward direction thereof. Thus, a ratchet wheel 842 is rotated with a ratchet pawl 840. Since the axis member 837 is fixed to the rotatable member (not shown) which is rotatably supported by the support plates 827, 828 and the ratchet wheel 824 is attached to the axis member 837 such that the wheel 824 is not rotatable relative to the axis member 837, the rotation of the ratchet wheel 842 results in rotating the axis member 824 fixed to the rotatable member and thereby feeding the WS 820. The downward movement of the piston rod 834 is stopped by a stopper member 846 which is threadedly engaged with a bracket 844. Therefore, the pitch of feeding of the WS 820, i.e., length of the WS 820 fed by one-time downward movement of the piston rod 834 can be adjusted by changing the amount of engagement of the stopper member 846 with the bracket 844.

On the other hand, when the piston rod 834 is moved upward, the link 836 is moved upward and the rotary plate 838 is rotated in the reverse direction. Thus, the ratchet pawl 840 moves over some of teeth 850 of the ratchet wheel 842. Since the rotation of the wheel 842 in the reverse direction is inhibited by a stopper lever 852 which is biased by a spring 848 in a direction to engage the teeth 850 of the wheel 842, only the pawl 840 moves. Thus, the axis member 824 is prevented from being rotated in the reverse direction, and the WS 820 is prevented from being rewound from the axis member 824.

A WS holddown member 860 is attached to the elevator member 804. The holddown member 860 is opposed to the ultrasonic vibrator 630 via the CS 710, screen 18, and WS 820, in a state in which the washing device 592 and the wiping device 596 are located at the screen-cleaning starting position, i.e., their retracted position away from the screen 18 and are connected with each other.

The WS holddown member 860 has a plate-like shape which is wide in the printing direction and is elongate in the widthwise direction of the screen 18. The WS holddown member 860 has upwardly curved end portions 862 which are parallel to the widthwise direction of the screen 18. Owing to the curved end portions 862, the WS holddown member 860 does not interfere with the feeding of the WS 820. A plurality of support members 864 are provided on a plurality of portions of the WS holddown member 860 which are distant from each other in a lengthwise direction thereof. The support members 864 extend through the thickness of a support plate 866 whose opposite end portions are fixed to respective lower surfaces of a pair of side walls 816 of the elevator member 804. Each support member 864 is movable upward and downward, and is biased downward by a compression coil spring 868 as a sort of elastic biasing member. Thus, the WS holddown member 860 is pressed on the WS 820. The downward movement of the holddown member 860 caused by the biasing action of the spring 868 is stopped with a head portion 870 of each support member 864 being engaged with the support plate 866.

A wiping portion of the WS 820 which is held down by the WS holddown member 860 extends parallel to the screen 18. When a wiping head 890, described below, is moved upward and kept away from the screen 18, the head portion 870 is kept in contact with the support plate 866. On the other hand, when the wiping head 890 is moved downward so that the WS holddown member 860 contacts the ultrasonic vibrator 632 via the WS 820, screen 18, and CS 710, the head portion 870 of each support member 864 is kept away from the support plate 866, as shown in FIG. 19, so that owing to the biasing action of the compression coil spring 868, the holddown member 860 holds down a portion of the WS 820 on the screen 18, thereby providing the wiping portion extending parallel to the screen 18.

An elongate scratching member 874 formed of rubber is attached to the elevator member 804, on the downstream side of the WS holddown member 860 in a WS feeding direction in which the WS 820 is fed for cleaning the screen 18, and on one side of the WS 820 opposite to the other side thereof on which the screen 18 is. The scratching member 874 extends in the widthwise direction of the screen 18, while being inclined with respect to the horizontal portion of the WS holddown member 860.

An air jetting member 882 of an upper-surface drying device 880 is attached to the elevator member 804, on the upstream side of the WS holddown member 860 in the WS feeding direction. The air jetting member 882 has a cylindrical shape, and has a linear slit opening downward. When air is supplied from an air source (not shown), the air jetting member 882 jets air downward. A solenoid-operated switch valve 884 (FIG. 23) which is provided between the air source and the air jetting member 882, is opened and closed to cause and stop the supplying of air from the air source to the air jetting member 882, respectively.

The wiping head 890 is provided by the axis members 822, 824, WS feeding device 830, WS holddown member 860, air jetting member 882, etc. which are provided on the elevator member 804. When the elevator member 804 is moved downward and upward, the wiping head 890 contacts, and separates from, the screen 18. In addition, the wiping head 890 is moved in the printing direction by the squeegee moving device 94. The cleaning of the screen 18 is carried out by moving the WS 820 in the same direction as the printing direction.

The wiping-head elevating air cylinder 812 provides a wiping-head elevating device, which provides a device for moving the WS 820 to contact, and separate from, the upper surface 594 of the screen 18 on which the creamed solder as the PM is forced or squeezed into the through-holes of the screen 18, and for moving the WS holddown member 860 and the scratching member 874 to contact, and separate from, the upper surface 594 via the WS 820. The squeegee moving device 94 provides a wiping-head moving device, which cooperates with a movable wiping device including the wiping head 890 and the wiping-head elevating device, to provide the wiping device 596.

Figure 20:
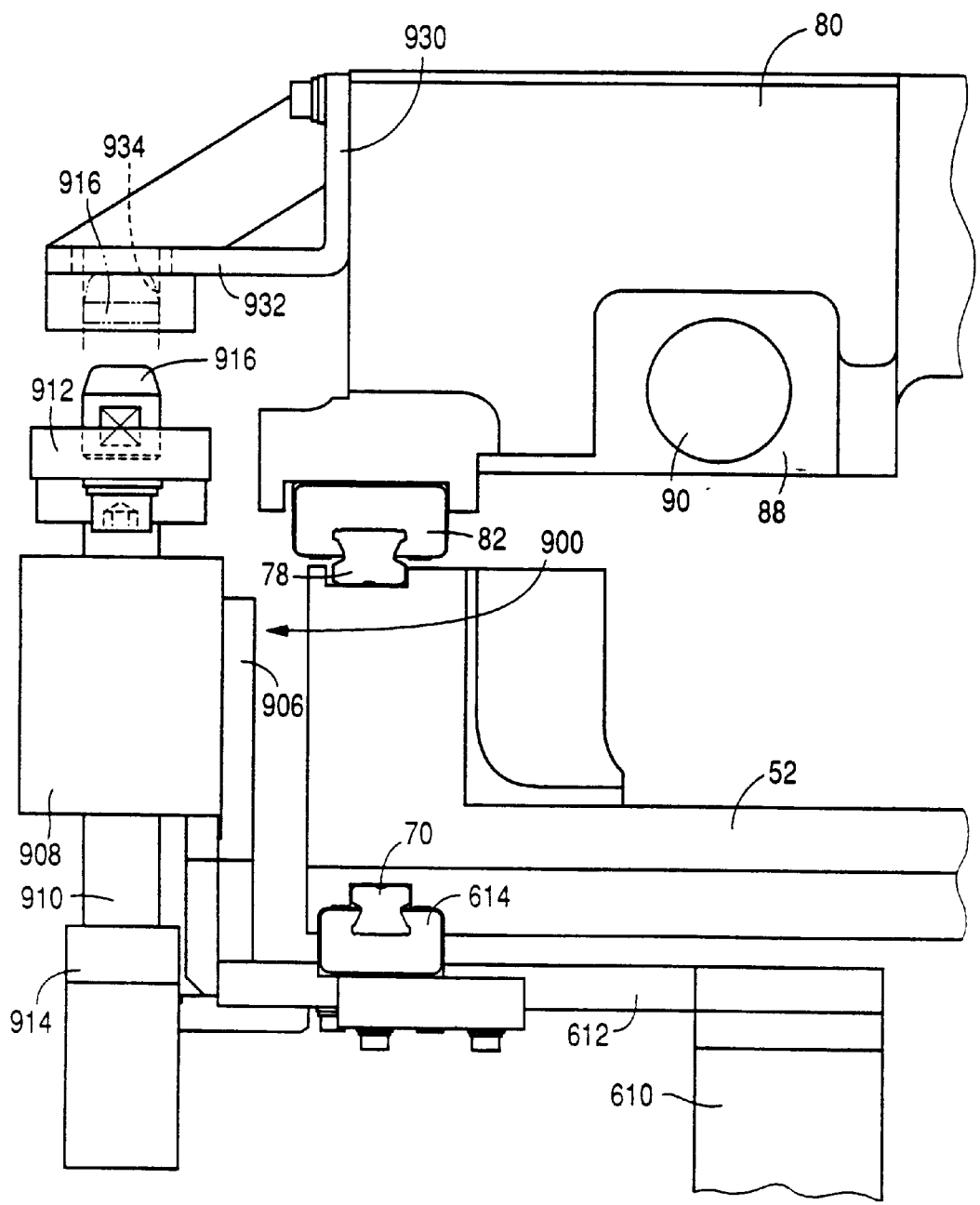
FIG. 20 is a side view of a connecting device which connects the washing device and the wiping device with each other.
Figure 21:
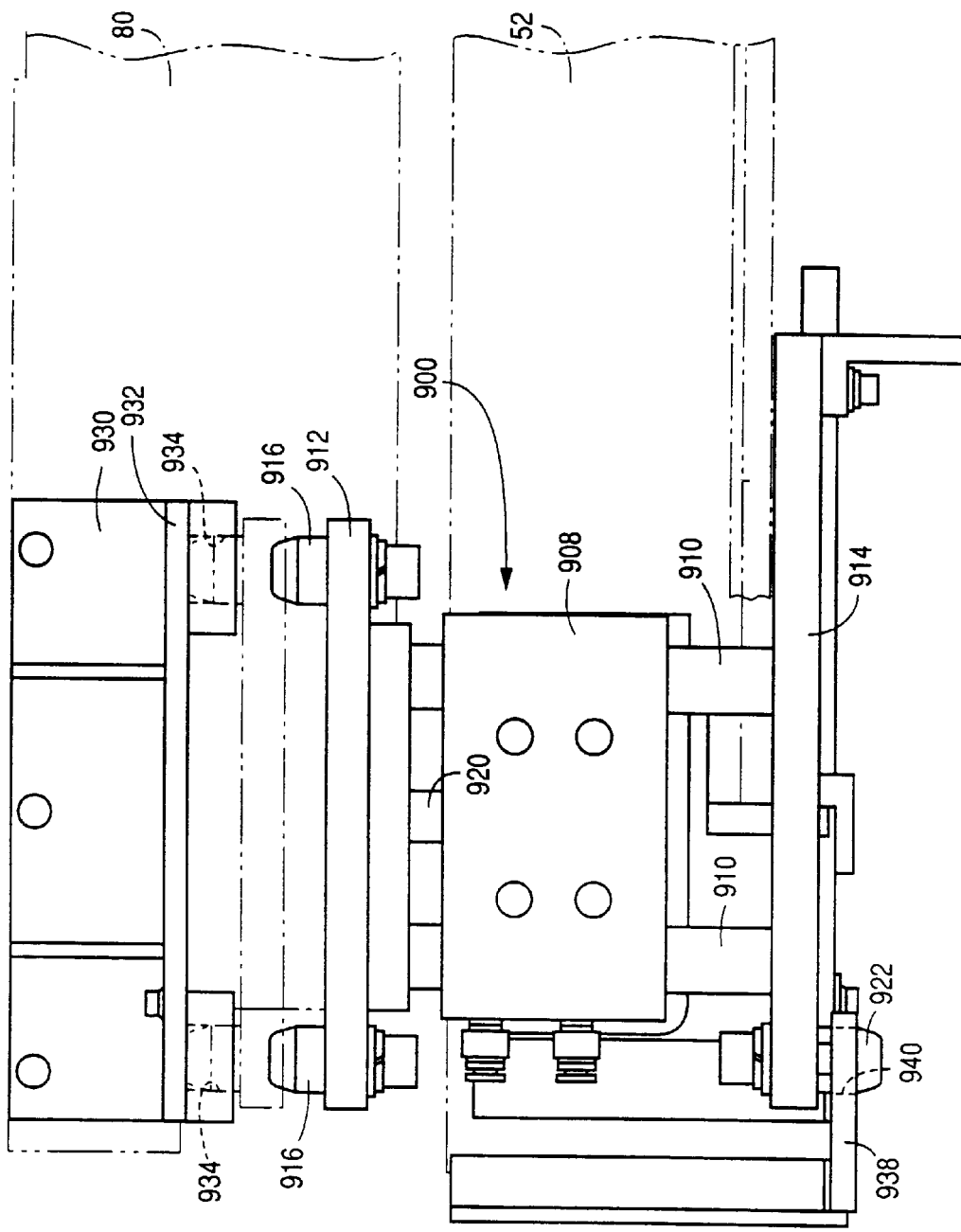
FIG. 21 is another side view of the connecting device of FIG. 20.
Figure 22:
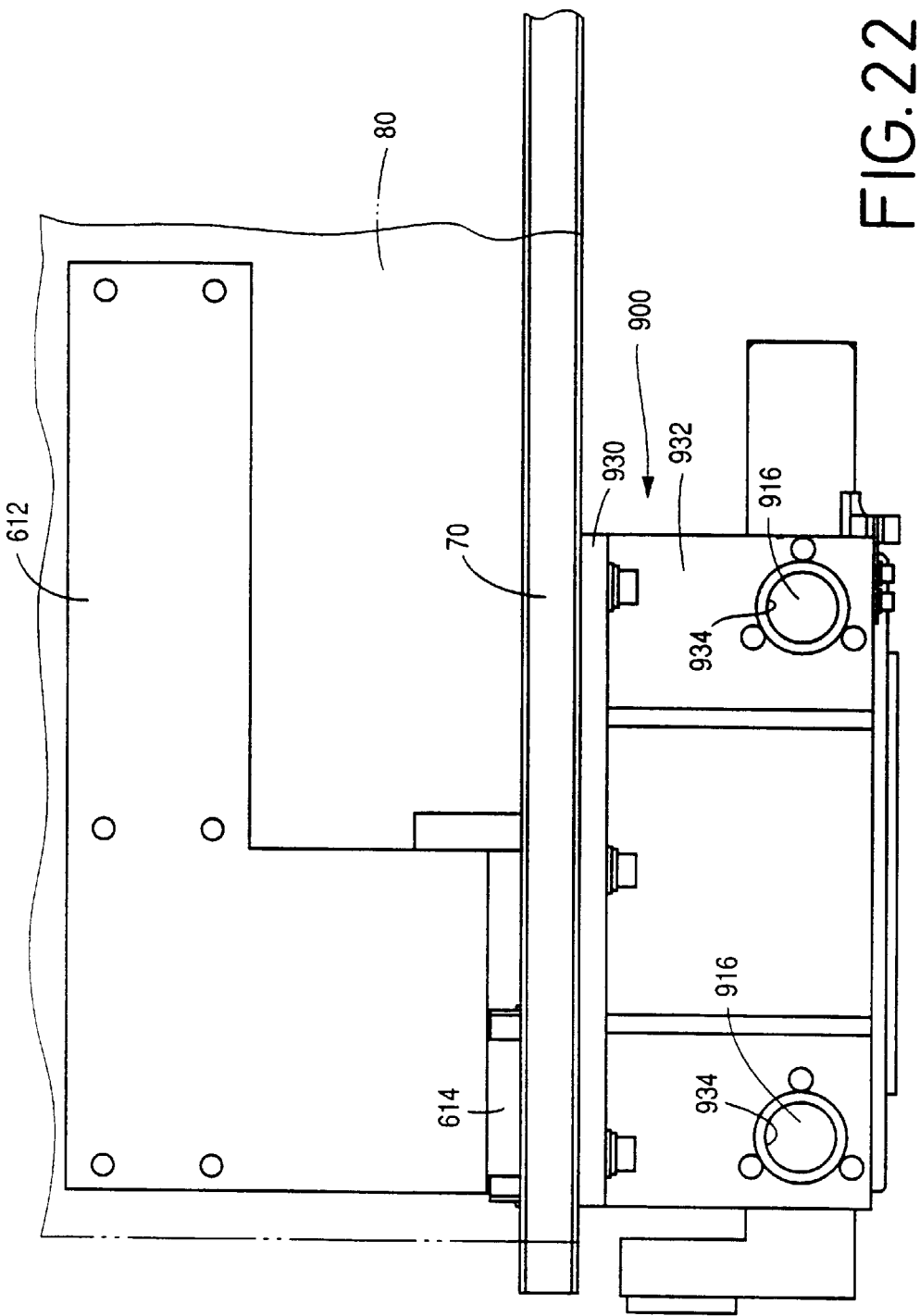
FIG. 22 is a plan view of the connecting device of FIG. 20.

When the screen 18 is cleaned, the washing head 620 and the wiping head 890 are connected with each other via the slide 80, by a connecting device 900 shown in FIG. 18, so that the two heads 620, 890 are movable as a unit. As shown in FIGS. 20 and 21, an attachment member 906 which extends vertically is fixed to the bracket 612 fixed to the support member 610 which supports the washing-head elevating air cylinder 780. A support block 908 is fixed to the attachment member 906. A pair of guide rods 910 extend through the support block 908 such that the guide rods 910 are movable upward and downward relative to the block 908. An attachment plate 912 is fixed to respective upper end portions of the two guide rods 910 which project upward from the support block 908, and an attachment plate 914 is fixed to respective lower end portions of the two guide rods 910 which project downward from the same 908. Two engagement pins 916 as engagement portions are fixed at two locations on the attachment plate 912, respectively, which are distant from each other in the screen-cleaning direction, i.e., printing direction. A piston rod 920 of an engaging air cylinder 918 (FIG. 23) accommodated in the support block 908 is fixed to the attachment member 912, between the two engagement pins 916. An engagement pin 922 is fixed to the attachment plate 914 such that the pin 922 is oriented downward.

As shown in FIG. 20, a bracket 930 having an L-shaped cross section is fixed to a side surface of the slide 80. As shown in FIGS. 20 and 21, the bracket 930 includes a horizontal arm portion 932 which has two engagement holes 934 at two locations thereof which are distant from each other in the printing direction. The engagement holes 934 vertically extend through the thickness of the arm portion 932. The two engagement holes 934 provides engagement portions which are engageable with the engagement pins 916. A bracket 938 is fixed to a side surface of the screen support table 52 that is one of opposite ends of the table 52 in the screen-cleaning direction and corresponds to the screen-cleaning starting position. The bracket 938 has an engagement hole 840 which extends through the thickness of the bracket 938.

When the piston rod 920 of the engaging air cylinder 918 is moved upward, the attachment plates 912, 914 are moved upward and the engagement pin 922 is moved away from the engagement hole 940. When the engagement pins 916 are engaged with the engagement holes 934, the washing head 620 is disengaged from the screen support table 52, and is connected to the wiping head 890 so that the two heads 620, 890 are movable as a unit in the screen-cleaning direction. When the wiping head 890 is moved by the squeegee moving device 94, the washing head 620 is moved with the wiping head 890 along the screen 18. Thus, the squeegee moving device 94 also functions as a washing-head moving device, which cooperates with a movable washing device including the washing head 620 and the elevating device 622, to provide the washing device 592.

When the piston rod 920 is moved downward and the attachment plates 912, 914 are moved downward, the pins 916 are disengaged from the engagement holes 934 and the engagement pin 922 is engaged with the engagement hole 940. Thus, the washing head 620 is disengaged from the wiping head 890, and is engaged with the screen support table 52. The engagement pins 922 and the engagement holes 940 engageable with the pins 922 cooperate with each other to provide an engaging device which engages and disengages the washing head 620 with and from the screen support member 52.

Figure 23:
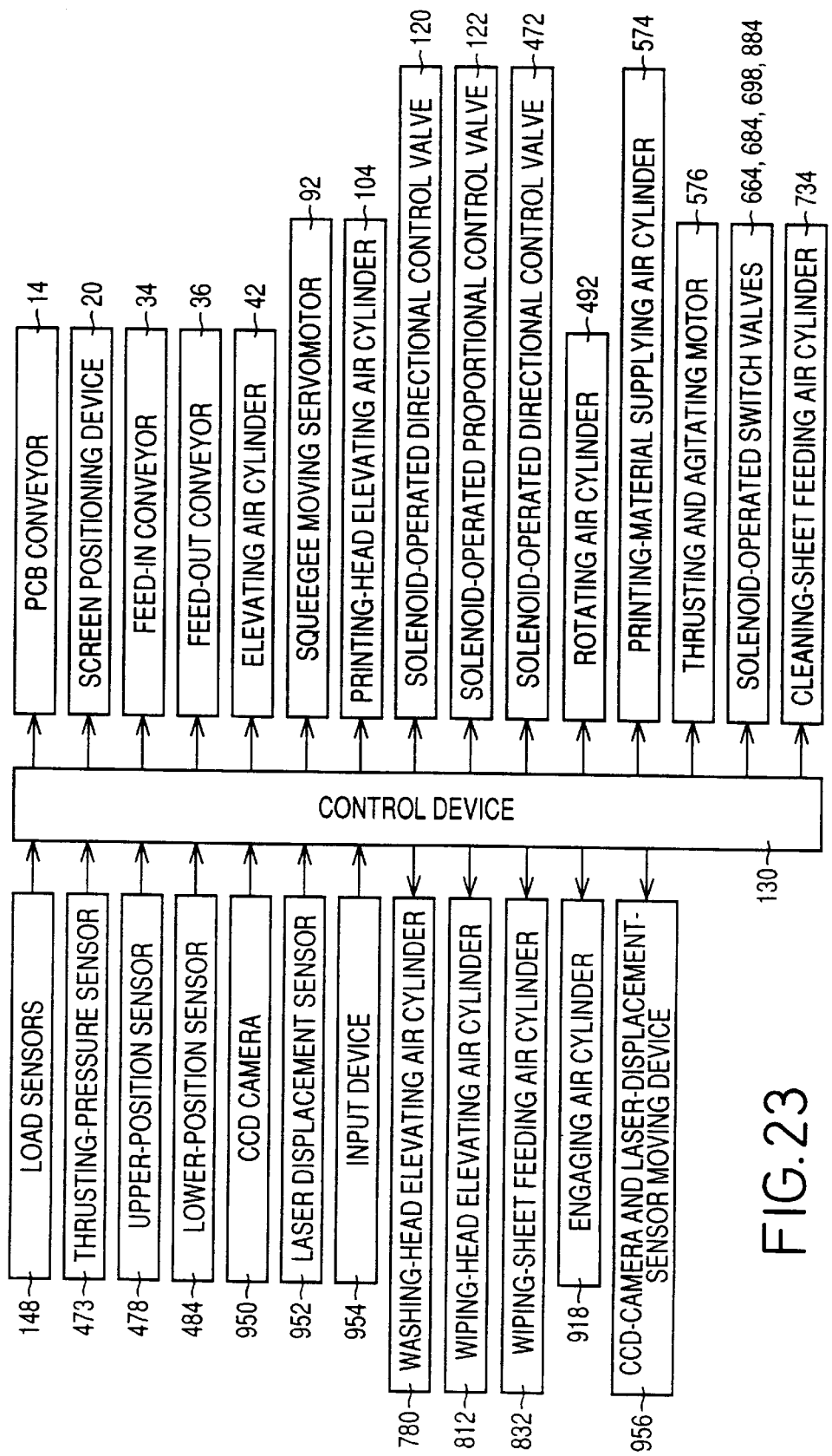
FIG. 23 is a view of a control device which controls the screen printing machine of FIG. 1.

The present screen printing machine is controlled by the control device 130. As shown in FIG. 23, the control device 130 which is essentially provided by a computer receives the respective detection signals supplied from the load sensors 148, the thrusting-pressure sensor 473, the upper-position sensor 478, the lower-position sensor 484, a CCD camera 950, and a laser displacement sensor 952. An input device 954 is connected to the control device 130. The control device 130 controls the respective operations of the PCB conveyor 14, the screen positioning device 20, the feed-in conveyor 34, the feed-out conveyor 36, the PCB elevating air cylinder 42, the squeegee moving servomotor 92, the printing-head elevating air cylinder 104, the solenoid-operated directional control device 120, the solenoid-operated proportional control device 122, the solenoid-operated directional control device 472, the rotating air cylinder 492 of the rotating device 490, the PM supplying air cylinders 574 of the PM supplying device 570, the thrusting and agitating motor 576, the solenoid-operated open/close valves 664, 684, 698, 884, the CS feeding air cylinder 734, the washing-head elevating air cylinder 780, the wiping-head elevating air cylinder 812, the WS feeding air cylinder 832, the engaging air cylinder 918, and a CCD-camera and laser-displacement-sensor moving device 956.

The CCD-camera and laser-displacement-sensor moving device 956 includes an X-direction slide, a Y-direction slide provided on the X-direction slide, an X-direction moving device for moving the X-direction slide in the X direction, and a Y-direction moving device provided on the X-direction slide, for moving the Y-direction slide in the Y direction. The CCD camera 950 and the laser displacement sensor 952 are provided on the Y-direction slide and, when the X-direction and Y-direction slides are moved, the camera and sensor 950, 952 are moved between a position corresponding to a portion of the screen support table 52 which supports the screen 18, and a position corresponding to a portion of the feed-out conveyor 36 which is adjacent to the PCB conveyor 14.

The CCD camera 950 is an image pick-up device which takes respective images of reference marks provided on the screen 18. The CCD camera 950 may be provided by a two-dimensional matrix of CCDs (charge-coupled devices), or a line of CCDs. Image data representing the image taken by the camera 950 are supplied to the control device 130, which calculates the respective positional errors of the screen 18 with respect to the X and Y directions. For example, when a screen 18 is changed with another screen 18, images of reference marks provided on the new screen 18 are taken and positional errors of the new screen 18 are calculated by the control device 130. Based on the calculated errors, the control device 130 controls the X-direction and Y-direction positioning devices 60, 61 to define or establish the correct X-direction and Y-direction positions of the screen 18, and controls the X-direction and Y-direction moving devices 62, 63 to move the screen 18 to the established positions. Subsequently, the control device 52 controls the screen fixing device 64 to fix the screen 18 to the screen support table 52.

The laser displacement sensor 952 emits a laser beam toward the creamed solder printed on the PCB 12, receives the light reflected from the PCB 12, and detects the position, area, and height distribution of each printed solder, based on the received light. More specifically, after a PCB 12 is transferred onto the feed-out conveyor 36 following a screen printing operation, the X-direction and Y-direction slides are moved so that the laser displacement sensor 952 moves over the PCB 12 and scans the entire surface of the same 12. Thus, the sensor 952 detects the position, area, and height distribution of each of the solders printed on the PCB 12.

The data obtained by the sensor 952 are supplied to the control device 130, which identifies whether the PCB 12 has a printed solder at each of predetermined positions, or whether the PCB 12 has an appropriate distribution of printed solders, and identifies whether the PCB 12 has an approximate amount of printed solder at each predetermined position, or whether the PCB 12 has an appropriate distribution of amounts of printed solders. The amount of each printed solder is calculated from the area and height distribution of the same.

If the control device 130 identifies an inappropriate printing on the PCB 12, a central processing unit (CPU) of the control device 130 stores, in a random access memory (RAM) of the same, data representing the inappropriate result. An inappropriate printing may be identified when the position of each printed solder is not correct, when the amount of each printed solder is not adequate, when the respective positions of almost all printed solders are correct but no creamed solder is printed at one or some positions only, or when creamed solder is adhered to a position different from the predetermined positions. An inappropriate printing may result from one of various causes of which the clogging of the creamed solder in the through-holes of the screen 18, or the sticking of the creamed solder to the lower surface 590 of the same 18 may be removed by cleaning the screen 18. There are other causes which may be removed by adjusting the viscosity of the creamed solder by agitating the same in an appropriate manner. Printing of the creamed solder at a position slightly away from a correct position results from an incorrect positioning of the PCB 12 relative to the screen 18. Printing of the creamed solder in an inadequate amount results from the adhesion of the creamed solder to the inner surfaces of the through-holes of the screen 18. A failure of printing at a predetermined position results from the clogging of the through-holes with the creamed solder. Printing at a position largely away from the predetermined positions results from the adhesion of the creamed solder to the lower surface 590 of the screen 18. The CPU of the control device 130 stores, in the RAM, each identified inappropriate printing together with a specific cause therefor. The laser displacement sensor 952, the CCD-camera and displacement-sensor moving device 956, and a portion of the control device 130 which calculates the position and amount of each printed solder, etc. based on the detection signal supplied from the sensor 952, cooperate with one another to a printing evaluating device which evaluates the screen printing carried out on the PCB 12.

Figure 24:
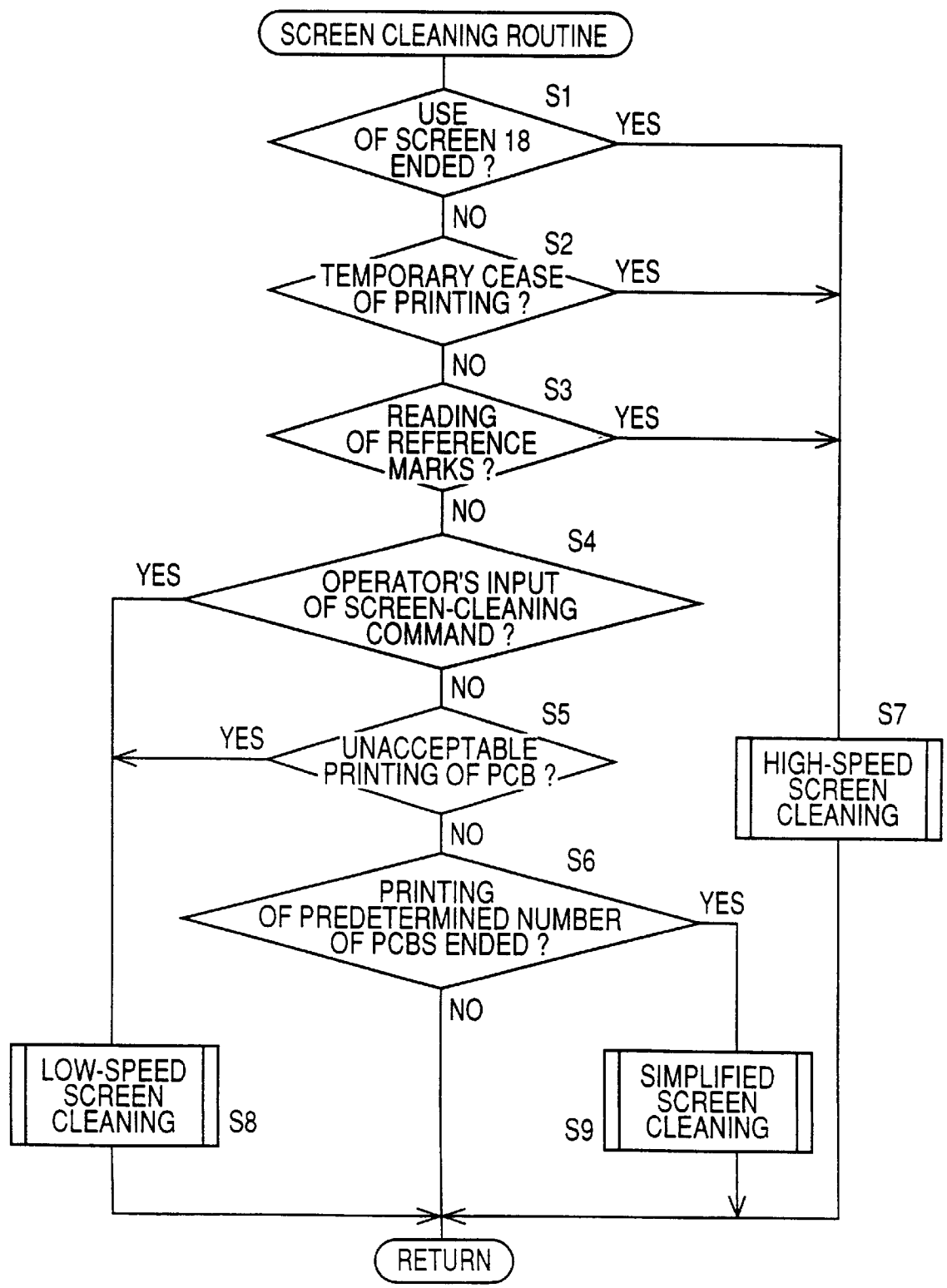
FIG. 24 is a flow chart representing a control program stored in a read only memory of a computer of the control device of FIG. 23.

The control device 130 includes a read only memory (ROM) which stores various control programs needed for carrying out a screen printing on the PCB 12 and a screen cleaning on the screen 18, including a screen cleaning routine represented by the flow chart of FIG. 24.

Next, there will be described the operation of the screen cleaning device 24 constructed as described above.

While a screen printing operation is carried out, the washing head 620 of the screen cleaning device 24 is not coupled with the wiping head 890, and is coupled with the screen support table 52. That is, the washing head 620 is held at the screen-cleaning starting position, i.e., its retracted position. In addition, the washing head 620 is located at its lowermost position and the wiping head 890 is located at its uppermost position, so that the cleaning sheet ("CS") 710 and the wiping sheet ("WS") 820 are kept away from the screen 18 and do not interfere with the printing operation.

In the screen printing operation, the PCB 12 is conveyed by the PCB conveyor 14 and is stopped above the PCB support table 40. Subsequently, a PCB holddown plate (not shown) is moved to a position above the PCB 12 and, then, the PCB support table 40 is moved upward, so that the PCB 12 is lifted up from the fixed and movable rails 30, 32 and is pressed against the PCB holddown plate. Thereafter, a negative pressure is applied to the PCB support table 40, to attract the PCB 12 by air suction.

After the PCB support table 40 holds the PCB 12 by air suction, the PCB holddown plate is retracted from the position above the PCB 12. Subsequently, the PCB 12 is further moved upward by the PCB support table 40, so that the PCB 12 contacts the lower surface 590 of the screen 18. Then, the printing-head elevating air cylinder 104 is operated to move the printing head 150 downward to its lowermost position. In addition, the contact-load adjusting air cylinder 108 is operated to move the squeegees 162 downward to contact the screen 18.

When a printing operated is started, the printing head 150 is stopped at a position above the screen 18 where the squeegees 162 are distant by 3 mm from the screen 18. In this state, a total weight, W, of the head 150 is applied downward to each of the two load sensors 148, and each sensor 148 produces a detection signal representing a negative value, $-W/2$. That is, the sum of the two output values is $-W$. The control device 130 reads the negative value, $-W$, and subtracts, from an absolute value, $|(-W)|$. a self weight, w, of the head 150 in a state in which no PM is accommodated in the PM container 400, i.e., the container 400 is vacant. Thus, the control device 130 calculates a weight, $(W-w)$, of the PM left in the container 400 and stores the calculated weight in the RAM. Subsequently, the solenoid-operated directional control valve 120 is switched to its state in which the valve 120 causes the air chamber 116 to communicate with the solenoid-operated proportional control valve 122, so that the pressure in the air chamber 116 is gradually lowered and accordingly the cylinder housing 114 and the printing head 150 are moved downward. During this downward movement of the head 150, the control device 130 iteratively calculates a positive contact load, F, applied to the screen 18 by the squeegees 162, by adding the absolute value $|(-W)|$ to the sum of respective current output values of the two load sensors 148, at a very short interval of time. The sum of current output values of the two load sensors 148 continues to be the negative value, $-W$, before the squeegees 162 contact the screen 18.

As the squeegees 162 are further moved downward after first contacting the screen 18, the squeegees 162 are elastically deformed, and a reaction force, F', is applied to the respective support members of the two load sensors 148, so that the tension load applied to the strain gauges of the sensors 148 are accordingly reduced. Since the control device 130 operates a display device (not shown) to display the contact load F iteratively calculated at the interval of time, the operator can see the current contact load F.

When the printing head 150 is moved downward so that the squeegees 162 contact the screen 18, the control device 130 controls the pressure of the air chamber 116 of the contact-load adjusting air cylinder 108, based on the contact load, F, applied to the screen 18 by the squeegees 162. If the contact load F is lower than a reference value, the control device 130 switches the proportional control valve 122 to its state in which the control valve 122 causes the air chamber 116 to communicate with the atmosphere. On the other hand, if the contact load F is higher than the reference value, the control device 130 switches the control valve 122 to its another state in which the control valve 122 causes the air chamber 116 to communicate with the air source 124.

As the number of printing operations increases, the amount of creamed solder left in the PM container 400 decreases little by little and accordingly the total weight of the printing head 150 decreases. A contact load suitable for effecting an appropriate printing operation can be kept by decreasing the pressure of the air chamber 116 as the amount of the creamed solder decreases. The decreasing of the pressure of the air chamber 116 can easily be done by the control device 130 based on the contact load F detected by the load sensors 148. The control of the pressure of the air chamber 116 is performed during each screen printing operation as well.

After the squeegees 162 contacts the screen 18 with the suitable pressing force, the thrust plate 230 is moved downward to apply a thrusting force to the creamed solder. Since, however, the PM outlet 180 of the PM container 400 is closed by the screen 12, the creamed solder is not pushed out and is subject to an appropriate pressure. In this state, when the printing head 150 is moved along the screen 18, the PM held in the PM chamber 406 is prevented from flowing out of the PM chamber 406, by the downstream-side one of the two squeegees 162 which is positioned on the downstream side of the other squeegee 162 as seen in the printing direction. The PM is scratched from the screen 18 by the other, upstream-side squeegee 162. As the PM container 400 is moved along the screen 18, the PM is applied to the screen 18 little by little while being held with safety in the PM chamber 406. More specifically, each time the PM outlet 180 is opposed to a certain number of through-holes of the screen 18, a corresponding amount of creamed solder is forced into the through-holes and the remaining creamed solder is scratched by the upstream-side squeegee 162. Thus, the through-holes are filled with the creamed solder.

The thrust plate 230 is moved downward to thrust the creamed solder from the PM chamber 406. The thrusting-pressure sensor 473 detects the pressure in the thrusting air chamber of the thrusting air cylinder 222. The pressure of the air cylinder 222 is controlled so that the creamed solder is pressed with a suitable pressure. Thus, the creamed solder is squeezed out with the predetermined pressing pressure, even if the creamed solder may be left in a small amount.

After a printing operation is finished on one PCB 12, the squeegees 162 are moved upward away from the screen 18 and the PCB 12 is fed out. More specifically described, the PCB support table 40 is moved downward and accordingly the PCB 12 is moved away from the screen 18. With the PCB 12 being supported on the PCB conveyor 14, the application of the negative pressure to the PCB support table 40 is stopped, so that the PCB 12 is released. The support table 40 is further moved downward away from the PCB 12, and the PCB 12 is fed out by the PCB conveyor 14.

In a state in which the squeegees 162 are moved upward and are held away from the screen 18, the total weight of the printing head 150 are applied downward to the load sensors 148, which detect this weight. When the PM container 400 is moved upward and the squeegees 162 are moved away from the screen 18, the two air chambers of the thrusting air cylinder 222 are communicated with the atmosphere, so that substantially no creamed solder is left on the screen 18, i.e., the creamed solder is moved away from the screen 18 together with the PM container 400. During this upward movement, the control device 130 calculates the amount of the creamed solder left in the PM container 400, based on the detected weight in the above-described manner. The calculated amount is stored in the RAM. If this amount is greater than a reference value, the control device 130 operates for moving the squeegees 162 toward the screen 18 and moving the printing device 22 in a direction opposite to the direction in which the device 22 is moved in the preceding printing operation. Thus, the creamed solder is printed on another PCB 12.

The load sensors 148 together are a remaining-printing-material-amount measuring device within the meaning of the claims.

Meanwhile, if the remaining amount of the creamed solder becomes less than the reference value, the printing head 150 is moved to the PM supplying position where the head 150 is supplied with the creamed solder. More specifically, as shown in FIG. 11, the second plate-like member 404 is rotated by the rotating devices 490 and the creamed solder is supplied to the PM chamber 406 from the PM supplying device 570.

The combination of the second plate-like member 404 and the rotating devices 490 is a backflow preventing device within the meaning of the claims.

Next, there will be described the manner in which the screen 18 is cleaned.

In the present embodiment, the screen cleaning device 24 cleans the screen 18 when the use of the screen 18 is ended, when a printing operation is temporarily stopped, when the reference marks provided on the screen 18 are detected, after the screen 18 is used to print the creamed solder on a predetermined number of PCBs 12, when the operator commands the present printing machine to carry out a cleaning operation, or when a specific sort of inappropriate printing is identified by the control device 130.

The control device 130 controls each screen cleaning operation according to the control program or routine represented by the flow chart of FIG. 24. First, at Step S1, the CPU of the control device 130 judges whether the use of the screen 18 has been ended. The use of the screen 18 is ended, for example, when the current screen 18 is replaced by a new screen 18 after the former 18 is used to print the creamed solder on the PCBs 12, or when a printing operation is ended by the present printing machine. The ending of use of the screen 18 can be identified based on a printing control program used to print the creamed solder on the PCBs 12. If a positive judgment is made at Step S1, the control of the CPU goes to Step S7 to clean the screen 18.

On the other hand, if a negative judgment is made at Step S1, the control of the CPU goes to Step S2 to judge whether a screen printing operation has been temporarily stopped. For example, in the case where it needs a long time to feed another PCB 12 to the printing device 24, because of some reason concerning a production line including the present printing machine, the printing operation is temporarily stopped. This judgment can be made based on the information interchanged in the production line including the present printing machine. If a positive judgment is made at Step S2, the control of the CPU goes to Step S7 to clean the screen 18.

On the other hand, if a negative judgment is made at Step S2, the control of the CPU goes to Step S3 to judge whether the reference marks on the screen 18 are detected or read, based on the printing control program. If a positive judgment is made at Step S3, the control goes to Step S7 to clean the screen 18. If the creamed solder is adhered to the reference marks, the marks cannot be read with accuracy. Hence, the screen 18 is cleaned at Step S7.

Next, there will be described the cleaning of the screen 18 carried out at Step S7.

The screen cleaning is carried out by using all of the CS 710, the WS 820, the ultrasonic vibrator 632, the movable and fixed washing-agent ("WA") supplying members 644, 670, the lower-surface and upper-surface drying devices 690, 880, and the WS holddown member 860.

When a screen cleaning operation is carried out, the slide 80 is moved to the screen-cleaning starting position or the retracted position where the washing head 620 stands by. The washing head 620 is disengaged from the screen support table 52 and is engaged with the wiping head 890, so that the two heads 620, 890 become movable as a unit in the screen-cleaning direction.

Subsequently, the CS feeding air cylinder 734 and the WS feeding air cylinder 832 are operated some times to advance and retract the respective piston rods 748, 834 to feed the CS 710 and the WS 820, respectively. A length of the CS 710 which is located on a cleaning stage defined by the vibrator 632 and the fixed WA supplying member 670 and which had been used in the preceding cleaning operation, is fed and taken up, and a new length of the CS 710 is fed onto the cleaning stage. During this feeding operation, the WA is supplied to the movable WA supplying member 644 and is impregnated into the CS 710. Similarly, a length of the WS 820 which is located on a wiping stage defined by the WS holddown member 860 and the scratching member 874 and which had been used in the preceding cleaning operation, is fed and taken up, and a new length of the WS 820 is fed onto the wiping stage.

Then, the washing head 620 is moved upward and the wiping head 890 is moved downward, so that the screen 18 is sandwiched by the two heads 620, 890. The upward movement of the washing head 620 is caused by the rotation of the first and second links 774, 776 which in turn is caused by the movement of the rod 772 of the washing-head elevating air cylinder 780. Thus, the CS 710 contacts the lower surface 590 of the screen 18. Meanwhile, when the elevator member 804 is moved downward, the wiping head 890 is moved downward, so that the WS 820 contacts the upper surface 594 of the screen 18.

After the WS holddown member 860 contacts the ultrasonic vibrator 632 via the WS 820, the screen 18, and the CS 710, the elevator member 804 is further moved downward by a small distance. This downward movement of the elevator member 804 is permitted because the spring 868 is compressed and the scratching member 874 is elastically deformed. Thus, the WS 820, the screen 18, the CS 710, and the ultrasonic vibrator 632 are elastically pressed on one another. The uppermost position of the washing head 620 is defined by the amount of rotation of the first and second links 774, 776, such that even though there may be assembling errors or other errors, the washing head 620 is moved upward by a sufficient amount ensuring that the CS 710 contacts the screen 18. In other words, the uppermost position of the washing head 620 is defined as being somewhat excessively higher than a normal or standard position. This excessive upward movement of the washing head 620 and the above-indicated excessive downward movement of the elevator member 804 are accommodated by the compression of the spring 868 and the elastic deformation of the scratching member 874.

After the CS 710 and the WS 820 contact the screen 18, the WA is supplied to the movable and fixed WA supplying members 644, 670, so that the CS 710 continues to keep a sufficient amount of WA. Simultaneously, air is supplied to the air jetting members 692, 882, and the ultrasonic vibrator 632 vibrates. In this state, the washing head 620 and the wiping head 890 are moved along the screen 18 by the squeegee moving device 94.

The washing head 620 and the wiping head 890 are moved at a low, constant speed. There is a sufficient amount of time to effect a cleaning operation after the end of use of the screen 18, during the temporary stopping of a screen printing operation, or during the reading of the reference marks of the screen 18. Thus, the washing head 620 and the wiping head 890 can be moved at so low a speed as to completely clean the screen 18.

In this connection, it is noted that the washing head 620 is moved below the screen support table 52. However, the washing head 620 does not interfere with the PCB conveyor 14, because between the screen 18 and the PCB conveyor 14 there is a sufficient space ensuring that the washing head 620, the palette 598, etc. can move therethrough.

The CS 710 in which the WA is impregnated is supplied with the WA from the fixed WA supplying member 670 at the downstream-side end of the cleaning stage in the direction of feeding of the CS 710. Thus, the CS 710 is prevented from drying up during the cleaning operation. A portion of the WA which is supplied from the movable WA supplying member 644 to the CS 710 but is not absorbed by the same 710, is collected by the palette 666. Similarly, a portion of the WA which is supplied from the fixed WA supplying member 670 to the CS 710 but is not absorbed by the same 710, falls in the form of drops that are collected by the palette 598.

A portion of the creamed solder adhered to the inner surfaces of the through-holes of the screen 18 is blown away by the air jetted from the air jetting member 692, before the screen 18 is cleaned with the CS 710. The CS 710 is held in contact with the lower surface 590 of the screen 18 and is moved while being vibrated by the ultrasonic vibrator 632. Thus, the creamed solder adhered to the inner surfaces of the through-holes, and the lower surface 590, of the screen 18 diffuses into the WA and then is absorbed into the bubbles and/or fibers of the CS 710. Thus, the creamed solder is removed from the screen 18.

Given a kinetic energy because of the vibration of the ultrasonic vibrator 632, the WA held by the CS 710 is moved into the through-holes of the screen 18 and eventually to the opposite, upper surface 594 of the screen 18. Therefore, before being wiped with the WS 820, the creamed solder adhered to the upper surface 594 is partly scratched by the scratching member 874, and partly diffuses into the WA away from the upper surface 594 because the screen 18 is vibrated by the ultrasonic vibrator 632. Then, the creamed solder is wiped off with the WS 820, i.e., is absorbed into the bubbles and/or fibers of the WS 820. In addition, the creamed solder adhered to the inner surfaces of the through-holes of the screen 18 diffuses into the WA, and is wiped off by the WS 820. Although the upper surface 594 is wetted with the WA, it is dried up with the air jetted from the air jetting member 882 of the wiping head 890.

After the washing head 620 and the wiping head 890 are moved from one end, to the other end, of the screen 18, the supplying of the WA to the movable and fixed WA supplying members 644, 670 is stopped and the vibration of the ultrasonic vibrator 632 is stopped. In addition, the supplying of air to the air jetting member 882 is stopped and the CS 710 and the WS 820 are moved away from the screen 18. Subsequently, the washing head 620 and the wiping head 890 are moved back to the cleaning-operating starting position. In this step, air is jetted from the air jetting member 692 of the washing head 620 so as to dry up the lower surface 590 of the screen 18. The air jetting member 82 may be adapted to jet air to dry up the upper surface 594 as well.

After the washing head 620 and the wiping head 890 are returned to the cleaning-operation starting position, the engagement pins 916 of the connecting device 900 are disengaged from the engagement holes 934, so that the washing head 620 and the wiping head 890 are released from each other. Simultaneously, the engagement pins 922 and the engagement holes 940 are engaged with each other, so that the washing head 620 is held by the screen support table 52.

As the number of cleaning operations carried out by the cleaning device 24 increases and accordingly the diameter of the CS 710 or the WS 820 taken-up by the axis member 722 or 824 increases, the length of the CS 710 or the WS 820 fed by one-time advancing and retracting movement of the piston rod 748 or 834 of the CS feeding air cylinder 734 or the WS feeding air cylinder 832 increases. However, since the length of the CS 710 or the WS 820 corresponding to that of the cleaning or wiping stage is constant, the excessive length of the CS 710 or the WS 820 also increases. Therefore, the number of advancing and retracting movements of the piston rod 748 or 834 of the CS or WS feeding air cylinder 734 or 832 is so decreased that a suitable length of the CS 710 or the WS 820 may newly be fed to the cleaning or wiping stage.

The control device 130 counts, from the beginning of use of the CS 710 or the WS 820, the total number of advancing and retracting movements of the piston rod 748 or 834 of the CS or WS feeding air cylinder 734 or 832. Based on this counted number, the control device 130 calculates the amount of the CS 710 or the WS 820 taken up by the axis member 722 or 824. Thus, the control device 130 decreases, by one, the number of advancing and retracting movements of the piston rod 748 or 834, each time the calculated amount exceeds one of different reference values each of which ensures that even if the number of advancing and retracting movements of the piston rod 748 or 834 is decreased by one, a sufficient length of the CS 710 or the WS 820 is newly fed to the cleaning or wiping stage. Those reference values are pre-stored in the ROM of the computer of the control device 130.

If a negative judgment is made at each of Steps S1 through S3, the control of the CPU of the control device 130 goes to Step S4 to judge whether the operator has input, in the present screen printing machine, a command to carry out a cleaning operation. If the operator judges, from a PCB 12 on which the creamed solder is printed, that an amount of printed solder is insufficient and accordingly a cleaning of the screen 12 is needed, he or she may input, through the input device 954, a command to carry out a cleaning operation, even though the screen printing machine may currently be operated to continuously print the solder on each of the PCBs 12. If a positive judgment is made at Step S4, the control of the CPU goes to Step S8 to carry out a screen cleaning operation.

On the other hand, if a negative judgment is made at Step S4, the control of the CPU goes to Step S5 to judge whether the printing carried out on each PCB 12 is acceptable. This judgment is made based on the data obtained by the previously-described printing evaluating device. A positive judgment is made at Step S5, even during a continuous printing operation, if a printing is judged as not acceptable because of such a specific cause which needs a cleaning of the screen 18. In this case, a screen cleaning operation is carried out at Step S8.

The cleaning operation at Step S8 is different from that at Step S7 only in that the speed of movement of the washing head 620 and the wiping head 890 in the former cleaning is higher than that in the latter cleaning. Thus, the duration of time during which a continuous printing operation is interrupted by the former cleaning, is made shorter. All the same elements as used in the latter cleaning are also used in the former cleaning. In the former cleaning, the average speed of movement of the washing head 620 and the wiping head 890 is increased by moving the heads 620, 890 at a higher speed along an intermediate length of the screen 18 than a speed at which the heads 620, 890 are moved along the entire length of the same 18 in the latter cleaning. The cleaning operation carried out at Step S8 is a high-speed cleaning operation and at the same time a normal or standard cleaning operation.

The through-holes formed through the thickness of the screen 18 have different diameters, that is, include large and small ones. A larger amount of WA enters each of the large through-holes, so that the creamed solder adhered to the inner surfaces of those through-holes more easily diffuses into the WA. In addition, the CS 710 or the WS 820 more easily enter each of the large through-holes, so that even if the CS 710 or the WS 820 is moved at a high speed, it effectively removes the creamed solder from the inner surfaces of the through-holes and the lower and upper surfaces 590, 594 of the screen 18. However, in the case of the small through-holes, it is necessary to move the CS 710 or the WS 820 at a lower speed, for effectively cleaning those through-holes. The manner of distribution of large and small through-holes of the screen 18 in the direction of movement of the washing and wiping heads 620, 890 is known from the data used to produce the screen 18. Based on the data, the pattern of speeds of the CS 710 or the WS 820 may be pre-determined and stored in the ROM of the control device 130. According to this pattern, the CPU of the control device 130 controls the operation of the squeegee moving servomotor 92.

If a negative judgment is made at each of Steps S4 and S5, the control of the CPU goes to Step S6 to judge whether the creamed solder is printed on each of a predetermined number of PCBs 12, in a continuous printing operation. This judgment is made based on the data obtained by executing the PCB printing control program. If a positive judgment is made at Step s6, the control of the CPU goes to Step S9 to carry out a screen cleaning operation.

In the cleaning operation at Step S9, the control device 130 uses the CS 710 only, i.e., operates for moving the CS 710 at a high speed. Also in this cleaning operation, the average speed of movement of the washing head 620 and the wiping head 890 is increased by moving the heads 620, 890 at a higher speed along an intermediate length of the screen 18 than a speed at which the heads 620, 890 are moved along the entire length of the same 18 in the cleaning operation effected at Step S7. The screen cleaning operation carried out at Step S9 is a high-speed cleaning operation and a simplified cleaning operation.

In the cleaning operation at Step S9, the slide 80 is moved to the cleaning-operation starting position or the retracted position where the washing head 620 is released from the coupling with the screen support table 52 and is coupled with the wiping head 890.

Subsequently, the CS 710 is fed in a manner similar to that employed at Step S7, but the WA is not supplied to the CS 710 being fed. After this feeding, the washing head 620 is moved upward so that the CS 710 is brought into contact with the lower surface 590 of the screen 18. The wiping head 890 is not moved downward, the WS 820 is not contacted with the upper surface 594 of the screen 18, or air is not jetted from the air jetting member 882. Then, the washing head 620 is moved along the screen 18 at a high speed via the wiping head 890 by the squeegee moving device 94, so that the creamed solder adhered to the lower surface 590 is cleaned off. In the case where the CS 710 is moved at a high speed, the printing operation is interrupted by the cleaning operation for a short time only, and the creamed solder is effectively removed from the lower surface 590 of the screen 18.

After the washing head 620 is moved with the wiping head 890 to the other end of the screen 18, the CS 710 is moved away from the screen 18 and subsequently the washing head 620 and the wiping head 890 are returned to the cleaning-operation starting position. After this return, the two heads 620, 890 are released from each other. Thus, in the case where the screen 18 is cleaned by the CS 710 only, the washing device 592 functions as a wiping device.

Thus, the screen cleaning device 24 enjoys the advantage that in each screen cleaning operation it is not necessary to move the creamed solder away from the screen 18 because the solder is accommodated in the PM container 400, and the advantage that it takes only a short time to carry out each screen cleaning operation because the washing device 592 and the wiping device 596 concurrently carry out the WA supplying, the washing, and the wiping. In addition, since the CS 710 and the WS 820 clean the screen 18 by being held in contact with the same 18 and the used lengths of the CS 710 and the WS 820 are taken up, the individual elements of the two devices 592, 596 are effectively prevented from being stained with the creamed solder, and the operation of the screen printing machine need not stop to clean the ultrasonic vibrator 632 or the like. Furthermore, the screen 18 can be cleaned under the condition that the screen 18 is attached to the screen support table 52. Thus, the cleaning of the screen 18 is easily carried out even during a continuous printing operation, and the efficiency of the screen printing operation including the screen cleaning operation is improved. Moreover, the screen printing machine can continuously be run for a longer period of time.

In addition, the control device 130 automatically selects one of the different screen-cleaning control patterns which respectively correspond to the different cleaning-operation starting conditions, and automatically controls the cleaning device 24 according to the selected control pattern. Thus, the present screen printing machine carries out a printing operation including a cleaning operation, on a full-automatic basis.

As is apparent from the foregoing description, in the present embodiment, the movable and fixed WA supplying members 644, 670, the two WS supplying sources for supplying the WS to the two supplying members 644, 670, respectively, and the rotatable arm 650 as a holder which holds the movable WA supplying member 644 such that the member 644 is movable between the CS pressing position (i.e., WA supplying position) and the CS releasing position (i.e., retracted position away from the WA supplying position), cooperate with one another to provide a WA supplying device; and the axis member 712 which provides a CS-supplying rotatable member, the guide rollers 718, 720, the axis member 722 which provides a CS-taking-up rotatable member, the ultrasonic vibrator 632, and the movable and fixed WA supplying members 644, 670 cooperate with one another to provide a CS supporting device. The two WA supplying members 644, 670 function as respective parts of each of the WA supplying device and the CS supporting device. The ratchet wheel 732, the rotatable member 738, the axis member 740, the rotary plate 742, the ratchet pawl 744, the link 750, the CS feeding air cylinder 734, etc. cooperate with one another to provide a rotating device, which cooperates with the axis members 712, 722 to provide a CS feeding device. The axis member 822, the guide rollers 823, 825, the axis member 824, the WS holddown member 860, and the scratching member 874 cooperate with one another to provide a WS supporting device. The ratchet wheel 842, the rotary plate 838, the ratchet pawl 840, the link 836, the WS feeding air cylinder 832, etc. cooperate with one another to provide a rotating device, which cooperates with the axis members 822, 824 to provide a WS feeding device. A portion of the control device 130 which counts the total number of advancing and retracting movements of the piston rod 748 of the CS feeding air cylinder 734 and which decreases, based on the counted number, the number of advancing and retracting movements of the piston rod 748 which are needed to feed a suitable length of the CS, provides a CS-feeding-pitch adjusting device. A portion of the control device 130 which counts the total number of advancing and retracting movements of the piston rod 834 of the WS feeding air cylinder 832 and which decreases, based on the counted number, the number of advancing and retracting movements of the piston rod 834 which are needed to feed a suitable length of the WS, provides a WS-feeding-pitch adjusting device.

A portion of the computer of the control device 130 which stores the screen cleaning routine or program represented by the flow chart of FIG. 24 provides a memory medium which stores the screen cleaning program; and a portion of the control device 130 which executes the screen cleaning program provides a screen-cleaning control device which may function as a WS-using screen-cleaning control device or a starting-condition-depending screen-cleaning control device.

Figure 25:
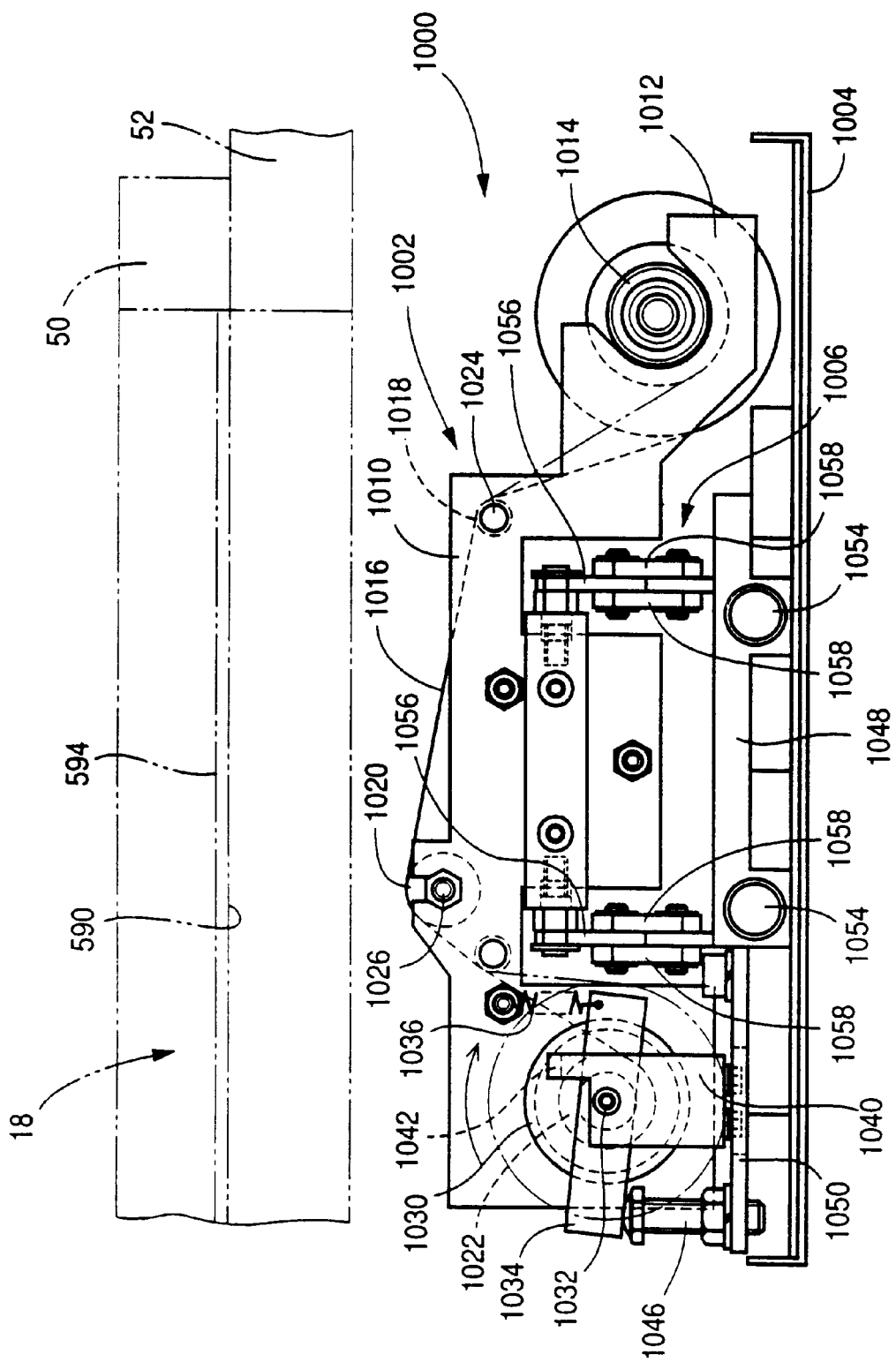
FIG. 25 is a side view of a portion of another screen cleaning device as a second embodiment of the present invention.

Referring next to FIG. 25, there will be described a screen cleaning device 1000 as a second embodiment of the present invention. The same reference numerals as used in the first embodiment shown in FIGS. 1 to 24 are used to designate the corresponding elements or parts of the second embodiment.

The screen cleaning device 1000 includes a wiping head 1002 which is provided on the side of a lower surface 590 of a screen 18 with which a printed circuit board ("PCB") 12 is contacted. Like the washing head 620 of the washing device 592 employed in the first embodiment, the wiping head 1002 is provided on a palette 1004 and is moved upward and downward by an elevating device 1006. Also in the second embodiment like in the first embodiment, a pair of guide rails (not shown) are fixed to the lower surface of a screen support table 52, and the two guide rails are engaged with four guide blocks (not shown) which are respectively fixed to two pairs of columns (not shown) provided on the palette 1004.

The wiping head 1002 includes a pair of plate-like support members 1010 (only one 1010 is shown in FIG. 25). The two support members 1010 are respectively provided on two end portions of the palette 1004 which are opposite to each other in a direction of width of the screen 18 (hereinafter, referred to as the "screen-width" direction or "SW" direction). Respective one end portions of the two support members 1010 as seen in a direction of printing (hereinafter, referred to as the "printing direction") provide support portions 1012 which cooperate with each other to support two opposite end portions of an axis member 1014 such that the axis member 1014 is rotatable about an axis line parallel to the screen-width ("SW") direction.

A wiping sheet ("WS") 1016 which is a web formed of paper like the WS 820 employed in the first embodiment and having a width substantially equal to that of the screen 18, is wound around the axis member 1014. The WS 1016 is drawn from the WS-supply axis member 1014 and is taken up by a WS-take-up axis member 1022 via a guide roller 1018 and a press roller 1020 formed of silicone rubber. The WS 1016 is taken up by the axis member 1022 such that one of opposite surfaces of the WS 1016 which is contacted with the lower surface 590 of the screen 18 for cleaning the same 590 is contacted with the other surface of the same 1016 which has already been wound around the axis member 1022. The guide roller 1018 and the press roller 1020 are elongate in the SW direction, and are rotatably attached to two axis members 1024, 1026, respectively, which are supported by the two support members 1010 such that the axis members 1024, 1026 are rotatable about respective axis lines parallel to the axis line of rotation of the WS-supply axis member 1014. The press roller 1020 has a large diameter, and an upper end portion thereof projects upward over the respective upper surfaces of the support members 1010.

The WS-take-up axis member 1022 is supported by the two support members 1010 such that the axis member 1022 is rotatable about an axis line parallel to the axis line of rotation of the WS-supply axis member 1014. Like the CS-take-up axis member 722 of the washing device 592 employed in the first embodiment, one of opposite end portions of the WS-take-up axis member 1022 is fixed to a cylindrical rotatable member 1030 which is rotatably fit in a hole formed in one of the two support members 1010, and the other end portion of the same 1022 is engaged with a recess (not shown) formed in the other support member 1010 and is prevented from coming out of the recess by a holddown plate (not shown). The rotatable member 1030 has a bottom wall to which an axis member 1032 is fixed such that an end portion of the axis member 1032 projects from the rotatable member 1030 and is rotatably fit in a hole formed in a middle portion of an elongate, plate-like take-up lever 1034. The take-up lever 1034 is biased by a tension coil spring 1036 so that the lever 1034 is rotated in a direction opposite to a direction indicated at Arrow, i.e., taking-up direction in which the WS 1016 is taken up by the axis member 1022. The coil spring 1036 functions as a sort of elastic biasing member and connects between one of opposite end portions of the lever 1034 and the above-indicated one support member 1010.

A first one-way clutch (not shown) is provided between the axis member 1032 and the take-up lever 1034. The first one-way clutch inhibits the rotation of the support axis 1032 relative to the lever 1034 in the taking-up direction and permits the rotation of the former 1032 relative to the latter 1034 in the reverse direction. In addition, a second one-way clutch (not shown) is provided between the axis member 1032 (or the rotatable member 1030) and the one support member 1010. The second one-way clutch permits the rotation of the support axis 1032 relative to the support member 1010 in the taking-up direction and inhibits the rotation of the former 1032 relative to the latter 1010 in the reverse direction.

The axis member 1032 extends through the take-up lever 1034, and a projecting end portion of the axis member 1032 is rotatably fit in a hole formed in a bracket 1040 fixed to one support member 1010. A stopper projection 1042 first projects upward from the upper end of the bracket 1040 and further projects horizontally over the take-up lever 1034. The rotation of the lever 1034 caused by the biasing action of the tension coil spring 1036 is stopped by the stopper projection 1042 on which the lever 1034 abuts.

An externally threaded adjust bolt 1046 is threadedly engaged with the palette 1004. A base table 1048 and a bracket 1050 are fixed to the palette 1004, and the adjust bolt 1046 is threadedly engaged with an internally threaded, vertically oriented hole formed in the bracket 1050. The adjust bolt 1046 is located below the other end portion of the take-up lever 1034 which is opposite to one end portion of the same 1034 which is connected to the one support member 1010 via the coil spring 1036.

The elevating device 1006 that moves the wiping head 1002 upward and downward has the same construction as that of the elevating device 622 employed in the first embodiment. Specifically described, a pair of rods 1054 are fit in respective holes formed in the base table 1048 such that the rods 1054 are movable relative to the table 1048 in the screen-width direction. The rods 1054 are moved in the axial direction thereof, i.e., in the screen-width direction, by a wiping-head elevating air cylinder (not shown). Consequently four groups of first and second link members 1056, 1058 are operates, so that the wiping head 1002 is moved upward to its uppermost position where the press roller 1020 contacts the lower surface 590 of the screen 18 via the WS 1016 and is moved downward to its lowermost position away from the lower surface 590. One of opposite end portions of each of the first links 1056 is rotatably connected to a corresponding one of the two rods 1054, and the other end portion of each first link 1056 is rotatably connected to the one support member 1010. In addition, one of opposite end portions of each of the second links 1058 is rotatably connected to the base table 1048, and the other end portion of each second link 1058 is rotatably connected to a middle portion of a corresponding one of the first links 1056.

When a screen cleaning operation is carried out, the wiping head 1002 and the palette 1004 are released from the connection with the screen support table 52, and connected with a slide 80 as a part of a squeegee moving device, by a connecting device (not shown) similar to the connecting device 900 employed in the first embodiment. On the other hand, when a screen printing operation is carried out, the wiping head 1002 and the palette 1004 are released from the connection with the slide 80, and is connected with the screen support table 52, by the connecting device.

In the screen cleaning device 1000 constructed as described above, when a screen printing operation is carried out, the wiping head 1002 and the palette 1004 are released from the connection with the slide 80, and are moved to their retracted position, at one of opposite ends of the screen 18 in the SP direction, where the head and palette 1002, 1004 are connected with the screen support table 52. In addition, the wiping head 1002 is positioned at its lowermost position as shown in FIG. 25.

When a screen cleaning operation is carried out, the wiping head 1002 and the palette 1004 are connected to the slide 80 of a printing device 22, and the wiping head 1002 is moved upward to its uppermost position where the press roller 1020 contacts the lower surface 590 of the screen 18 via the WS 1016. In this state, the slide 80 is moved, so that the WS 1016 is moved on the lower surface 590. Thus, the creamed solder adhered to the lower surface 590 is wiped off.

When the wiping head 1002 is positioned at the lowermost position as shown in FIG. 25, the take-up lever 1034 is held in contact with the adjust bolt 1046 and is kept away from the stopper projection 1042. However, when the wiping head 1002 is moved upward, the lever 1034 is moved away from the bolt 1046 and is rotated by the biasing force of the tension coil spring 1036 in the direction opposite to the taking-up direction, so that the lever 1034 abuts on the stopper projection 1042. As the wiping head 1002 is further moved upward, the lever 1034 is moved away from the adjust bolt 1046. Since the first and second one-way clutches are provided between the lever 1034 and the axis member 1032 and between the axis member 1032 and the one support member 1010, respectively, the axis member 1032 is rotated together with the lever 1034. Thus, even if the WS-take-up axis member 1022 is rotated in the reverse direction, the WS 1016 cannot be rewound from the axis member 1022.

After a screen cleaning operation, the wiping head 1002 is moved downward and the WS 1016 is moved away from the lower surface 590 of the screen 18 to its lowermost position. In addition, as the slide 80 is moved, the wiping head 1002 is returned to its cleaning-operation starting position. Before the wiping head 1002 is moved down to the lowermost position, the take-up lever 1034 is brought into contact with the adjust bolt 1046. Subsequently, the wiping head 1002 is further moved downward, and the lever 1034 is rotated in the taking-up direction against the biasing force of the coil spring 1036. This rotation of the lever 1034 causes, owing to the function of the first one-way clutch, the axis member 1032 to rotate with the lever 1034, thereby rotating the WS-take-up axis member 1022. Thus, a suitable length of the WS 1026 is taken up by the axis member 1022. That is, a portion of the WS 1016 which is stained with the creamed solder removed from the screen 18, is moved away from the press roller 1020, and a new and clean portion of the WS 1016 is fed onto the roller 1020. Therefore, in the next screen cleaning operation, the roller 1020 contacts the lower surface 590 of the screen 18 via the clean portion of WS 1016. In the present embodiment, the stained portion of the WS 1016 is entirely moved away from the press roll 1020, by only one-time downward movement of the wiping head 1002.

As the diameter of the WS 1016 wound around the WS-take-up axis member 1022 increases, the length of the WS 1016 taken up by the axis member 1022 by one-time downward movement of the wiping head 1002 increases, though the angular amount of rotation of the axis member 1022 is not changed. Taking up excessive lengths of the WS 1016 is useless. The operator can identify it by observing a portion of the WS 1016 stretched between the press roller 1020 and the axis member 1022. Since the stained portions of the WS 1016 each have a constant length, the distance between each pair of adjacent stained portions gradually increases as the axis member 1022 takes up excessive lengths of the WS 1016. When the operator finds it, he or she may drive the adjust bolt 1046 into the bracket 1050 so that the length of upward projection of the bolt 1046 from the bracket 1050 decreases. When the wiping head 1002 is moved downward, the take-up lever 1034 is brought into contact with the bolt 1046 at a lower position, which results in decreasing the angular amount of rotation of the lever 1034 and thereby decreasing the length of the WS 1016 taken up by the axis member 1022 by one-time downward movement of the head 1002.

Thus, in the screen cleaning device 1000, only the WS 1016 is used for cleaning the screen 18 simply and quickly.

In addition, since the WS 1016 is taken up by utilizing the upward and downward movements of the wiping head 1002, the cleaning device 1000 is produced with a simpler construction and at a lower cost as compared with the case where the device 1000 employs an exclusive drive source for rotating the WS-take-up axis member 1022.

Moreover, since the WS 1016 is taken up by the take-up axis member 1022 in such a manner that one of opposite surfaces of the WS 1016 which is used for cleaning the screen 18 is contacted with the other surface of the same 1016 which has already been wound around the axis member 1022. Accordingly, the stains or soils adhered to the WS 1016 are not transferred from the WS 1016 to the individual elements of the screen cleaning apparatus, the screen printing machine, or the operator. In addition, the WS 1016 taken up by the axis member 1022 can easily be treated.

As is apparent from the foregoing description, in the second embodiment, the press roller 1020 provides a pressing device; the press roller 1020, the two axis members 1014, 1022 and the guide roller 1018 cooperate with one another to provide a WS supporting device; and the axis member 1032, the take-up lever 1034, the tension coil spring 1036, the adjust bolt 1046, and the elevating device 1006 cooperate with one another to provide a WS feeding device. The adjust bolt 1046 also functions as a WS-feeding-pitch adjusting device.

While the present invention has been described in its preferred embodiments, it may otherwise be embodied.

For example, although in the first embodiment shown in FIGS. 1–24, the washing agent ("WA") is supplied to the cleaning sheet ("CS") at two locations on the upstream and downstream sides of the ultrasonic vibrator 632 in the CS feeding direction, it is possible that a single WA supplying member be provided at one of the two locations and a WA be supplied to the single member. In the case where a single WA supplying member is provided at the downstream-side location only, a downstream-side portion of the CS 710 is wetted with the WA and an upstream-side portion of the same 710 is not wetted with the WA, i.e. is kept dry. Therefore, after the screen 18 is cleaned with the wet portion of the CS 710 in which the WA is absorbed, the screen 18 is dried up with the dry portion of the CS 710. Thus, the exclusive drying device may be omitted.

Otherwise, in the case where two WA supplying members are respectively provided at two locations on the upstream and downstream sides of the cleaning stage in the CS feeding direction, it is possible that when the CS 710 is fed, a WA be supplied to the upstream-side WA supplying member only, and that when the CS is moved on the screen 18 for cleaning the same 18, the WA be supplied to the downstream-side WA supplying member only.

While in the first embodiment the scratching member 874 of the wiping head 890 is formed of rubber, the head 890 may employ a scratching member formed of metal. Since the scratching member 874 contacts the screen 18 via the wiping sheet ("WS") 820, the scratching member 874, either formed of either rubber or metal, can effectively scratch the creamed solder off the screen 18.

While in the first embodiment the CS 710 or the WS 820 is fed, after each screen cleaning operation, to provide a new length thereof to the cleaning or wiping stage, the CS 710 or the WS 820 may be adapted to be fed during each screen cleaning operation. That is, the CS 710 or the WS 820 may be fed while being moved on the screen 18.

Although in the first embodiment the pitch of feeding of the CS 710 or the WS 820 is kept substantially constant by decreasing the number of advancing and retracting movements of the piston rod 748 or 834 of the CS or WS feeding air cylinder 734 or 832, based on the taken-up amount or length of the CS 710 or the WS 820, the aim may be achieved by adjusting the amount of engagement of the stopper member 756 or 846 with the bracket 758 or 844, thereby adjusting the limit of advancing movement of the piston rod 748 or 834, and thereby adjusting the amount of feeding of the CS 710 or the WS 820 caused by one-time advancing and retracting movement of the rod 748 or 834. In the latter case, the screen printing machine may be provided with an alarm device, and the control device 130 may be adapted to operate the alarm device to output a message commanding the operator to change the limit of advancing movement of the piston rod 748 or 834, each time the taken-up amount of the CS 710 or the WS 820 calculated from the counted number of advancing and retracting movements of the rod 748 or 834 exceeds one of different reference values. Otherwise, the screen printing machine may additionally be provided with an adjusting device which automatically rotates the stopper member 756 or 846 and thereby adjusts the amount of engagement of the stopper member 756 or 846 with the bracket 758 or 844. The control device 130 controls the adjusting device. Alternatively, the operator may manually adjust the limit of advancing movement of the piston rod 748 or 834, based on an eye-measured, taken-up amount of the CS 710 or the WS 820.

However, it is not essential to adjust the pitch of feeding of the CS 710 or the WS 820, even if the feeding pitch may increase as the taken-up amount of the CS 710 or the WS 820 increases.

Although in the second embodiment shown in FIG. 25 the operator adjusts the pitch of feeding of the WS 1016 by manually adjusting the amount of engagement of the adjust bolt 1046 with the support member 1050, the feeding pitch may automatically be adjusted. For example, the screen cleaning device 1000 may be provided with a device which calculates or estimates the taken-up amount of the WS 1016 from the counted number of screen cleaning operations (e.g., upward and downward movements of the wiping head 1002) and which automatically rotates, based on the estimated taken-up amount, the adjust bolt 1046 and thereby adjusts the angular amount of rotation of the WS-take-up axis member 1022.

In addition, in the second embodiment, each stained portion of the WS 1016 is moved away from the press roller 1020 by one-time downward movement of the wiping head 1002. However, in the case where a longer length of the WS 1016 is contacted with the screen 18 by the press roll 1020 for wiping the creamed solder off the same 18 and the stained portion is moved away over the same length from the press roll 1020, it is possible that the wiping head 1002 be moved upward and downward two or more times and the WS 1016 be taken up by the axis member 1022. In the latter case, the stained portion of the WS 1016 will contact the screen 18. However, this problem may be solved by feeding the WS 1016 before each screen cleaning operation is started, or while no screen 18 is attached to the screen support table 52.

In each of the first and second embodiments, the washing head 620, the wiping head 890, or the wiping head 1002 are reciprocated forward and backward, just once, in each screen cleaning operation. However, it is possible to reciprocate the head 620, 890, 1002 several times in each cleaning operation. Concerning the wiping head 1002, it is possible to contact the WS 1016 with the screen 18 in the backward movement thereof as well as in the forward movement. In addition, the cleaning and wiping heads 620, 890 may be used to clean and wipe the screen 18 in each of the forward and backward movements thereof. In the latter case, it is preferred to provide the heads 620, 890 with respective drying devices for drying the lower and upper surfaces 590, 594 of the screen 18 which are wetted with the WA in the forward movement of the heads 620, 890. The drying devices may be operated only in the backward movement of the heads 620, 890. Otherwise, the head 620, 890, 1002 may not be reciprocated in each cleaning operation, i.e., may be moved one way only. In the last case, two cleaning-operation starting positions or retracted positions may be provided at two ends of the screen 18, respectively, which are opposite to each other in the screen-cleaning direction, and two connecting devices 900 may be provided at the two retracted positions, respectively, so that the head 620 or the head 1002 may be engaged with the screen support member 52 by an approropriate one of the two connecting devices 900. In the case where both the cleaning and wiping heads 620, 890 are used for cleaning the screen 18 in a one-way movement thereof, it is possible to provide a drying device on both sides of each of the cleaning and wiping stages in the direction in which the heads 620, 890 are moved relative to the screen 18 for cleaning the same 18.

Although in the first embodiment the CS 710 and the WS 820 are fed just before each cleaning operation, the WS 820 may be fed after each cleaning operation. The CS 710 must not be fed just after each cleaning operation, because the CS 710 is wetted with the WA while being fed and the wet CS 710 will dry up before the next cleaning operation. Since the WS 820 or 1016 is not wetted with a WA, it may be fed after each cleaning operation.

In the first embodiment, an additional washing head 620 may be provided on the side of the upper surface 594 of the screen 18 as well. In this case, also on the side of the upper surface 594, a CS 710 is supplied with a WA and is vibrated by an ultrasonic vibrator 632 of the additional washing head 620. In the first embodiment, the screen printing machine has the PM container 400 for accommodating the creamed solder as the PM, and substantially no creamed solder is left on the upper surface 594 of the screen 18. Accordingly, it is not necessary to move a mass of creamed solder away from the upper surface 594 of the screen 18, when a screen cleaning operation is carried out. Therefore, the WA can be supplied to the CS 710 for cleaning the upper surface 594 of the screen 18. If the washing head 620 is provided on the side of the upper surface 594 of the screen 18 in the case where the screen 18 extends horizontally, the WA is easily supplied from the head 620 to the CS 710 because the WA naturally moves downward due to its weight.

In the first embodiment, the CS 710 and the WS 820 each of which is formed of paper are used. However, it is possible to employ, in place of the paper CS, WS 710, 820, or WS 1016, one of other sorts of porous materials, such as nonwoven fabric or foamed material (e.g., sponge).

In the first embodiment, the CS 710 or the WS 820 may be taken up by the axis member 724, 824 such that the stained or soiled surface of the CS 710 or the WS 820 is contacted with the other surface of the same 710, 820, like in the second embodiment shown in FIG. 25.

In the first embodiment, the movable and fixed WA supplying members 644, 670 are supplied with the WA from the different WA supplying sources, respectively. However, it is possible to employ a single, common WA supplying source and two solenoid-operated switch valves which permit the supplying of the WA from the single source to the two supplying members 644, 670, respectively, and stop the supplying of the WA to the two supplying members 644, 670, respectively. Otherwise, it is possible to employ a common WA supplying source and a common solenoid-operated switch valve which commonly permits, and commonly stops, the supplying of the WA from the single supplying source to the two supplying members 644, 670.

In the first embodiment, the wiping head 890 and the wiping-head elevating device are provided on the slide 80 on which the printing head 150 and other elements are also provided. However, it is possible that when a screen printing operation is carried out, the wiping head 890 and the elevating device be moved, like the washing head 620, to their retracted position away from the screen 18 where those devices do not interfere with the printing operation and are connected with a fixed member, e.g., the screen support table 52, by a connecting device. In the latter case, each printing operation is effected by moving the slide 80 on which the printing head 150 is provided but the wiping head 890 is not provided. When a screen cleaning operation is carried out, the wiping head 890 is connected with the slide 80 by the connecting device and is moved by the squeegee moving device 94.

In the first embodiment, the screen cleaning device 24 is employed in the screen printing machine, and the screen 18 as is attached to the printing machine is cleaned by the cleaning device 24. However, it is possible to provide the screen printing device 24 independently of the printing machine.

In each of the first and second embodiments, the slide 80 that is moved when a screen cleaning operation is carried out, supports the washing head 620 or the wiping head 890, 1002 such that the head 620, 890, 1002 is movable toward, and away from, the screen 18. However, it is possible to provide the head 620, 890, 1002 on a first member which is provided on a second member movable toward and away from the screen 18 and which is movable along the screen 18.

In the first embodiment, the washing head 620 may employ an air jetting member which is provided on the upstream side of the ultrasonic vibrator 632 in the direction in which the CS 710 is moved on the screen 18 for cleaning the screen 18. In this case, the air jetting member jets air toward the screen 18 for drying up the same 18, while the CS 710 is moved on the screen 18.

In the first embodiment, it is not essential to provide the wiping head 890. The wiping head 890 may be omitted.

In the first embodiment, the wiping head 890 is provided on the slide 80 and, when a cleaning operation is carried out, the washing head 620 is connected with the slide 80, so that the two heads 620, 890 are moved as a unit with the slide 80 by the squeegee moving device 94. However, the two heads 620, 890 may be moved by respective exclusive moving devices or a common exclusive moving device which are or is different from the squeegee moving device 94.

In the second embodiment, the wiping head 1002 and the palette 1004 may be moved by an exclusive moving device provided independently of the squeegee moving device 94.

In the first embodiment, when screens 18 are changed with each other, the reading of reference marks is carried out, and a low-speed screen cleaning operation is effected. However, it is possible to effect a screen cleaning operation also in the case where the reading of reference marks is carried out by interrupting a printing operation. For example, the control device 130 may judge from the obtained data that the creamed solder has been printed at one or more incorrect positions on the PCB 12. This problem may result from an incorrect positioning of the screen 18 relative to the screen support table 52, which may be found by reading the reference marks on the screen 18 and corrected by moving the screen 18 relative to the support table 52. A screen cleaning operation may be carried out prior to this reading. In this case, however, the cleaning operation is effected during the interruption of the printing operation. Accordingly, it is preferred that the cleaning operation be finished in a short time. Otherwise, only the CS 710 may be contacted with the lower surface 590 of the screen 18 and moved on the screen 18 at a high speed. Alternatively, not only the WS 820 but also the CS 710, ultrasonic vibrator 632, and WA supplying device 644, 670 may be used and moved at a high speed, so as to cause the WA to reach the upper surface 594 and remove the creamed solder adhered to the reference marks.

In the first embodiment, the images of the reference marks may be taken by a CCD camera in place of the laser displacement sensor 952. In this case, it is preferred that a color CCD camera be used to distinguish the PCB 12 and the creamed solder from each other.

In the second embodiment, the two one-way clutches are employed for preventing the WS-take-up axis member 1022 from rotating with the take-up lever 1034 when the lever 1034 is rotated in the direction reverse to the WS taking-up direction. However, the two one-way clutches may be replaced by a single one-way clutch. For example, in the case where the axis member 1022 is prevented from rotating with the take-up lever 1034 because of the frictional resistance produced between the axis member 1022 (or the rotatable member 1030) and the one support member 1010, a single one-way clutch suffices which inhibits the rotation of the axis member 1022 relative to the lever 1034 in the taking-up direction and permits the rotation of the former 1022 relative to the latter 1034 in the reverse direction. The frictional resistance may be increased by employing a frictional member.

The principle of the present invention may be embodied as an apparatus and a method for cleaning a screen of a screen printing machine of a type which prints, on a substrate, one of other sorts of printing materials, such as an adhesive, than the creamed solder.

It is to be understood that the present invention may be embodied with other changes, improvements, and modifications that may occur to those skilled in the art without departing from the spirit and scope of the invention defined in the appended claims.

What is claimed is:

1. A screen printing machine for printing a printing material, such as a creamed solder or a adhesive, on a substrate, such as a printed circuit board, through a plurality of through-holes of a plane screen, the printing machine comprising:

a squeegee which extends in a first direction parallel to the plane screen and which slides on the screen to squeeze the printing material into the through-holes of the screen;

an outlet-defining member which is opposed to the squeegee and which cooperates with the squeegee to define an elongate printing-material outlet;

a printing-material container having a printing-material chamber which contains the printing material, the printing-material chamber extending parallel to the printing-material outlet, having a length substantially equal to a length of the outlet, and communicating with the outlet over a substantially entire length thereof;

a printing-material thrust member which is provided in the printing-material chamber such that the printing-material thrust member is substantially fluid-tightly movable relative to the printing-material container;

a thrust-member moving device which moves the printing-material thrust member relative to the printing-material container; and a container moving device which moves the printing-material container relative to the screen in a second direction parallel to the screen and perpendicular to the first direction.

2. A screen printing machine according to claim 1, wherein the printing-material chamber comprises a gap defined by, and between, two wall members which extend parallel to each other, and the printing-material thrust member comprises a plate member which is fitted in the gap.

3. A screen printing machine according to claim 1, wherein the thrust-member moving device comprises a drive source including an air cylinder.

4. A screen printing machine according to claim 1, wherein the printing-material container comprises a main body, and an attaching device which attaches the squeegee to the main body such that the squeegee is detachable from the main body.

5. A screen printing machine according to claim 4, wherein the main body of the printing-material container comprises a plurality of main members which are assembled into the main body such that the main body is capable of being disassembled into the plurality of main members.

6. A screen printing machine according to claim 1, wherein the printing-material container comprises:

a printing-material inlet through which the printing material is supplied to the printing-material chamber;

a closing member which closes the printing-material inlet; and an opening and closing device which moves the closing member to open and close the printing-material inlet.

7. A screen printing machine according to claim 6, wherein the printing-material inlet extends parallel to the first direction, and wherein the screen printing machine further comprises a printing-material supplying device which supplies the printing material to the printing-material container, while moving in a direction parallel to the first direction.

8. A screen printing machine according to claim 6, wherein the printing-material container comprises:

a main body which includes a first main member which is attached to a support member, and a second main member which is opposed to the first main member and cooperates therewith to define a gap providing the printing-material chamber and which is pivotable relative to the first main member;

the squeegee being provided on one of the first and second main members;

the outlet-defining member being provided on the other of the first and second main members;

the closing member comprising the second main member; and the opening and closing device comprising a pivoting device which pivots the second main member relative to the first main member about an axis line located around the printing-material outlet.

9. A screen printing machine according to claim 8, wherein the printing-material container further comprises a positioning device which positions the second main member relative to the first main member at a position where the first and second main members cooperate with each other to define the printing-material chamber.

10. A screen printing machine according to claim 8, further comprising a printing-material supplying device which supplies the printing material to the printing-material chamber, and a supplying-device moving device which moves the printing-material supplying device along the second main member.

11. A screen printing machine according to claim 1, further comprising:
   a thrusting-force-relating-amount determining device which determines a target-thrusting-force relating amount relating to a target-thrusting-force with which the thrust-member moving device moves the printing-material thrust member to thrust the printing material out of the printing-material chamber through the printing-material outlet; and
   a thrusting-force-relating-amount control device which controls, based on the determined target-thrusting-force relating amount, an actual-thrusting-force relating amount relating to an actual thrusting force of the thrust-member moving device, such that the controlled actual-thrusting-force relating amount approaches the target-thrusting-force relating amount.

12. A screen printing machine according to claim 1, wherein the printing-material container comprises, in addition to the squeegee as a first squeegee, a second squeegee, and the outlet-defining member comprises the second squeegee.

13. A screen printing machine for printing a printing material, such as a creamed solder or an adhesive, on a substrate, such as a printed circuit board, through a plurality of through-holes of a plane screen, the printing machine comprising:
   a squeegee which extends parallel to the plane screen and which slides on the screen to squeeze the printing material into the through-holes of the screen;
   an outlet-defining member which is opposed to the squeegee and which cooperates with the squeegee to define a printing-material outlet;
   a printing-material container having a printing-material chamber which contains the printing material, the printing-material chamber communicating with the printing-material outlet;
   a printing-material pressing device which applies a pressing force to the printing material contained in the printing-material chamber;
   a pressing-force-relating-amount determining device which determines a target-pressing-force relating amount relating to a target pressing force of the printing-material pressing device; and
   a printing-force-relating-amount control device which controls, based on the determined target-pressing-force relating amount, an actual-pressing-force relating amount relating to an actual pressing force of the printing-material pressing device, such that the controlled actual-pressing-force relating amount approaches the target-pressing-force relating amount.

14. A screen printing machine according to claim 13, wherein the pressing-force relating-amount control device comprises:
   a pressing-force-relating-amount measuring device which measures a value of the actual-pressing-force relating amount; and
   a measured-value-dependent control device which controls, based on the measured value of the actual-pressing-force relating amount, the actual-pressing-force relating amount such that the controlled actual-pressing-force relating amount approaches the target-pressing-force relating amount.

15. A screen printing machine according to claim 13, wherein the printing-material pressing device comprises:
   a printing-material thrust member which is fitted in the printing-material chamber such that the printing-material thrust member is movable relative to the printing-material container;
   a thrust-member moving device which moves the printing-material thrust member relative to the printing-material container;
   the target-pressing-force relating amount relating to a target thrusting force with which the thrust-member moving device moves the printing-material thrust member to thrust the printing material out of the printing-material chamber through the printing-material outlet, and
   the actual-pressing-force relating amount relating to an actual thrusting force with which the thrust-member moving device moves the printing-material thrust member to thrust the printing material out of the printing-material chamber through the printing-material outlet.

16. A screen printing machine according to claim 15, wherein the pressing-force-relating-amount control device comprises:
   a pressing-force-relating-amount measuring device which measures, as a value of the actual-pressing-force relating amount, a value of an actual driving force with which the thrust-member moving device moves the printing-material thrust member; and
   a moving-device-driving-force control device which controls, based on the measured value of the actual driving force, the actual driving force of the thrust-member moving device such that the controlled actual driving force approaches a target driving force of the thrust-member moving device as the target-pressing-force relating amount.

17. A screen printing machine according to claim 15, wherein the thrust-member moving device comprises a drive source including an air cylinder.

18. A screen printing machine according to claim 16, wherein the thrust-member moving device comprises a drive source including an air cylinder, wherein the pressing-force-relating-amount measuring device comprises an air pressure measuring device which measures a value of an actual air pressure in the air cylinder, and wherein the moving-device-driving-force control device comprises an air pressure control device which controls, based on the detected value of the actual air pressure, the actual air pressure of the air cylinder such that the controlled actual air pressure approaches a target air pressure of the air cylinder as the target driving force.

19. a screen printing machine for printing a printing material, such as a creamed solder or an adhesive, on a substrate, such as printed circuit board, through a plurality of through-holes of a plane screen, the printing machine comprising:
   a squeegee which extends in a direction parallel to the plane screen and which slides on the screen to squeeze the printing material into the through-holes of the screen;

an outlet-defining member which is opposed to the squeegee and which cooperates with the squeegee to define a printing-material outlet;

a printing-material container having a printing-material chamber which contains the printing material, the printing-material chamber communicating with the printing-material outlet;

the printing-material container having a printing-material inlet which extends in said direction parallel to the plane screen and through which the printing material is supplied to the printing-material chamber, a closing member which closes the printing-material inlet, and an opening and closing device which moves the closing member to open and close the printing-material inlet;

a printing-material pressing device which applies a pressing force to the printing material contained in the printing-material chamber; and a printing-material supplying device which supplies, while moving in said direction parallel to the plane screen, the printing material to the printing-material chamber through the printing-material inlet.

20. A screen printing machine according to claim 19, wherein the printing-material supplying device comprises:

a printing-material reservoir;

a printing-material moving device which moves the printing material from the printing-material reservoir to the printing-material chamber; and a backflow preventing device which prevents the printing material from flowing backwards from the printing-material chamber into the printing-material reservoir.

21. A screen printing machine for printing a printing material, such as a creamed solder or an adhesive, on a substrate, such as a printed circuit board, through a plurality of through-holes of a plane screen, the printing machine comprising:

a squeegee which extends parallel to the plane screen and which slides on the screen to squeeze the printing material into the through-holes of the screen;

an outlet-defining member which is opposed to the squeegee and which cooperates with the squeegee to define a printing-material outlet;

a printing-material container having a printing-material chamber which contains the printing material, the printing-material chamber communicating with the printing-material outlet;

a printing-material pressing device which applies a pressing force to the printing material contained in the printing-material chamber; and a remaining-printing-material-amount measuring device which measures an amount of the printing material remaining in the printing-material chamber.

22. A screen printing machine according to claim 21, further comprising:

a printing-material supplying device which supplies the printing material to the printing-material chamber; and a supplying device control device which controls, based on the measured amount of the remaining printing material, the printing-material supplying device to supply the printing-material to the printing-material chamber.

23. A screen printing machine for printing a printing material, such as a creamed solder or an adhesive, on a substrate, such as a printed circuit board, through a plurality of through-holes of a plane screen, the printing machine comprising:

a squeegee which extends parallel to the plane screen and which slides on the screen to squeeze the printing material into the through-holes of the screen;

an outlet-defining member which is opposed to the squeegee and which cooperates with the squeegee to define a printing-material outlet;

a printing-material container having a printing material chamber which contains the printing material, the printing material chamber communicating with the printing-material outlet;

a printing-material pressing device which applies a pressing force to the printing material contained in the printing-material chamber; and a container moving device which moves the printing-material container toward, and away from, the screen; and a contact-load control device which controls a contact load with which the squeegee is contacted with the screen by the container moving device via the printing-material container.

24. A screen printing machine according to claim 23, wherein the squeegee contact load control device comprises:

a contact load changing device which changes the contact load by controlling the container moving device;

a contact load measuring device which measures the contact load; and a changing device control device which controls the contact load changing device such that the measured contact load approaches a reference value.

\* \* \* \* \*

UNITED STATES PATENT AND TRADEMARK OFFICE
CERTIFICATE OF CORRECTION

PATENT NO. : 5,988,060

DATED : November 23, 1999

INVENTOR(S) : Koichi Asai, et al.

It is certified that error appears in the above-identified patent and that said Letters Patent is hereby corrected as shown below:

On the title page,

Delete Item [30] :    Foreign Application Priority Data

August 5, 1994       [JP]Japan................6-184544

Signed and Sealed this

Second Day of January, 2001

Attest:

Q. TODD DICKINSON

*Attesting Officer*       *Commissioner of Patents and Trademarks*